(12) United States Patent
Johnston et al.

(10) Patent No.: US 12,306,285 B2
(45) Date of Patent: May 20, 2025

(54) SYSTEMS AND METHODS FOR USING ONE OR MORE SENSORS TO DETECT AND CLASSIFY OBJECTS IN A KEEP-OUT ZONE OF A WIRELESS-POWER TRANSMISSION FIELD, AND ANTENNAS WITH INTEGRATED SENSOR ARRANGEMENTS

(71) Applicant: Energous Corporation, San Jose, CA (US)

(72) Inventors: Cesar Johnston, Sunnyvale, CA (US); Alister Hoss, Phoenix, AZ (US); Erik Heinke, San Jose, CA (US); Deepak Jain, San Ramon, CA (US); William M. Wiese, Jr., San Jose, CA (US); Fay Yew, San Jose, CA (US)

(73) Assignee: ENERGOUS CORPORATION, San Jose, CA (US)

( * ) Notice: Subject to any disclaimer, the term of this patent is extended or adjusted under 35 U.S.C. 154(b) by 9 days.

(21) Appl. No.: 17/538,962

(22) Filed: Nov. 30, 2021

(65) Prior Publication Data

US 2022/0171045 A1 Jun. 2, 2022

Related U.S. Application Data

(60) Provisional application No. 63/120,184, filed on Dec. 1, 2020.

(51) Int. Cl.
*H02J 50/40* (2016.01)
*G01S 13/04* (2006.01)
(Continued)

(52) U.S. Cl.
CPC ............... *G01S 13/04* (2013.01); *G01V 3/02* (2013.01); *H01Q 3/28* (2013.01); *H02J 50/20* (2016.02);
(Continued)

(58) Field of Classification Search
CPC .. G01S 13/04; G01V 3/02; H01Q 3/28; H02J 50/20; H02J 50/40; H02J 50/50; H02J 50/60; H02J 50/402; H03F 3/20
See application file for complete search history.

(56) References Cited

U.S. PATENT DOCUMENTS

| 787,412 A | 4/1905 | Tesla |
| 2,811,624 A | 10/1957 | Haagensen |

(Continued)

FOREIGN PATENT DOCUMENTS

| CN | 201278367 Y | 7/2009 |
| CN | 102227884 A | 10/2011 |

(Continued)

OTHER PUBLICATIONS

Energous Corp., IPRP, PCT/US2014/040697, Dec. 8, 2015, 9 pgs.
(Continued)

*Primary Examiner* — Daniel Cavallari
*Assistant Examiner* — Brian K Baxter
(74) *Attorney, Agent, or Firm* — Perkins Coie LLP

(57) ABSTRACT

A wireless-power transmission system (WPTS) includes sensors, antennas, a power amplifier (PA), and integrated circuits (ICs). The antennas, upon receiving an amplified signal for the PA, are configured to radiate energy within a transmission field (TF) of the WPTS. The ICs are configured to receive sensor data indicating presence of an object within a keep-out zone (KOZ). The ICs are configured to classify using the sensor data the object as a sensitive object. While detecting presence of the sensitive object, the ICs are configured to forgo providing an instruction to the PA to amplify the signal. In accordance with a determination that the sensitive object is no longer detected the ICs are configured to determine whether an electronic device is within the TF and in accordance with a determination that the (Continued)

electronic device is within the TF the ICs are configured to instruct the PA to amplify the signal.

20 Claims, 33 Drawing Sheets
(5 of 33 Drawing Sheet(s) Filed in Color)

(51) Int. Cl.
    *G01V 3/02*     (2006.01)
    *H01Q 3/28*     (2006.01)
    *H02J 50/20*     (2016.01)
    *H02J 50/60*     (2016.01)
    *H03F 3/20*     (2006.01)

(52) U.S. Cl.
    CPC .............. *H02J 50/40* (2016.02); *H02J 50/60* (2016.02); *H03F 3/20* (2013.01); *H03F 2200/451* (2013.01)

(56) References Cited

U.S. PATENT DOCUMENTS

| | | |
|---|---|---|
| 2,863,148 A | 12/1958 | Gammon et al. |
| 3,167,775 A | 1/1965 | Guertler |
| 3,434,678 A | 3/1969 | Brown et al. |
| 3,696,384 A | 10/1972 | Lester |
| 3,754,269 A | 8/1973 | Clavin |
| 4,101,895 A | 7/1978 | Jones, Jr. |
| 4,360,741 A | 11/1982 | Fitzsimmons et al. |
| 4,944,036 A | 7/1990 | Hyatt |
| 4,995,010 A | 2/1991 | Knight |
| 5,142,292 A | 8/1992 | Chang |
| 5,200,759 A | 4/1993 | McGinnis |
| 5,211,471 A | 5/1993 | Rohrs |
| 5,276,455 A | 1/1994 | Fitzsimmons et al. |
| 5,548,292 A | 8/1996 | Hirshfield et al. |
| 5,556,749 A | 9/1996 | Mitsuhashi et al. |
| 5,568,088 A | 10/1996 | Dent et al. |
| 5,631,572 A | 5/1997 | Sheen et al. |
| 5,646,633 A | 7/1997 | Dahlberg |
| 5,697,063 A | 12/1997 | Kishigami et al. |
| 5,712,642 A | 1/1998 | Hulderman |
| 5,936,527 A | 8/1999 | Isaacman et al. |
| 5,982,139 A | 11/1999 | Parise |
| 6,046,708 A | 4/2000 | MacDonald, Jr. et al. |
| 6,061,025 A | 5/2000 | Jackson et al. |
| 6,127,799 A | 10/2000 | Krishnan |
| 6,127,942 A | 10/2000 | Welle |
| 6,163,296 A | 12/2000 | Lier et al. |
| 6,176,433 B1 | 1/2001 | Uesaka et al. |
| 6,271,799 B1 | 8/2001 | Rief |
| 6,289,237 B1 | 9/2001 | Mickle et al. |
| 6,329,908 B1 | 12/2001 | Frecska |
| 6,400,586 B2 | 6/2002 | Raddi et al. |
| 6,421,235 B2 | 7/2002 | Ditzik |
| 6,437,685 B2 | 8/2002 | Hanaki |
| 6,456,253 B1 | 9/2002 | Rummeli et al. |
| 6,476,795 B1 | 11/2002 | Derocher et al. |
| 6,501,414 B2 | 12/2002 | Amdt et al. |
| 6,583,723 B2 | 6/2003 | Watanabe et al. |
| 6,597,897 B2 | 7/2003 | Tang |
| 6,615,074 B2 | 9/2003 | Mickle et al. |
| 6,650,376 B1 | 11/2003 | Obitsu |
| 6,664,920 B1 | 12/2003 | Mott et al. |
| 6,680,700 B2 | 1/2004 | Hilgers |
| 6,798,716 B1 | 9/2004 | Charych |
| 6,803,744 B1 | 10/2004 | Sabo |
| 6,853,197 B1 | 2/2005 | McFarland |
| 6,856,291 B2 | 2/2005 | Mickle et al. |
| 6,911,945 B2 | 6/2005 | Korva |
| 6,960,968 B2 | 11/2005 | Odendaal et al. |
| 6,967,462 B1 | 11/2005 | Landis |
| 6,988,026 B2 | 1/2006 | Breed et al. |
| 7,003,350 B2 | 2/2006 | Denker et al. |
| 7,012,572 B1 | 3/2006 | Schaffner et al. |
| 7,027,311 B2 | 4/2006 | Vanderelli et al. |
| 7,068,234 B2 | 6/2006 | Sievenpiper |
| 7,068,991 B2 | 6/2006 | Parise |
| 7,079,079 B2 | 7/2006 | Jo et al. |
| 7,183,748 B1 | 2/2007 | Unno et al. |
| 7,191,013 B1 | 3/2007 | Miranda et al. |
| 7,193,644 B2 | 3/2007 | Carter |
| 7,196,663 B2 | 3/2007 | Bolzer et al. |
| 7,205,749 B2 | 4/2007 | Hagen et al. |
| 7,215,296 B2 | 5/2007 | Abramov et al. |
| 7,222,356 B1 | 5/2007 | Yonezawa et al. |
| 7,274,334 B2 | 9/2007 | O'Riordan et al. |
| 7,274,336 B2 | 9/2007 | Carson |
| 7,351,975 B2 | 4/2008 | Brady et al. |
| 7,359,730 B2 | 4/2008 | Dennis et al. |
| 7,372,408 B2 | 5/2008 | Gaucher |
| 7,392,068 B2 | 6/2008 | Dayan |
| 7,403,803 B2 | 7/2008 | Mickle et al. |
| 7,443,057 B2 | 10/2008 | Nunally |
| 7,451,839 B2 | 11/2008 | Perlman |
| 7,463,201 B2 | 12/2008 | Chiang et al. |
| 7,471,247 B2 | 12/2008 | Saily |
| 7,535,195 B1 | 5/2009 | Horovitz et al. |
| 7,614,556 B2 | 11/2009 | Overhultz et al. |
| 7,639,994 B2 | 12/2009 | Greene et al. |
| 7,643,312 B2 | 1/2010 | Vanderelli et al. |
| 7,652,577 B1 | 1/2010 | Madhow et al. |
| 7,679,576 B2 | 3/2010 | Riedel et al. |
| 7,702,771 B2 | 4/2010 | Ewing et al. |
| 7,786,419 B2 | 8/2010 | Hyde et al. |
| 7,812,771 B2 | 10/2010 | Greene et al. |
| 7,830,312 B2 | 11/2010 | Choudhury et al. |
| 7,844,306 B2 | 11/2010 | Shearer et al. |
| 7,868,482 B2 | 1/2011 | Greene et al. |
| 7,898,105 B2 | 3/2011 | Greene et al. |
| 7,904,117 B2 | 3/2011 | Doan et al. |
| 7,911,386 B1 | 3/2011 | Ito et al. |
| 7,925,308 B2 | 4/2011 | Greene et al. |
| 7,948,208 B2 | 5/2011 | Partovi et al. |
| 8,049,676 B2 | 11/2011 | Yoon et al. |
| 8,055,003 B2 | 11/2011 | Mittleman et al. |
| 8,070,595 B2 | 12/2011 | Alderucci et al. |
| 8,072,380 B2 | 12/2011 | Crouch |
| 8,092,301 B2 | 1/2012 | Alderucci et al. |
| 8,099,140 B2 | 1/2012 | Arai |
| 8,115,448 B2 | 2/2012 | John |
| 8,159,090 B2 | 4/2012 | Greene et al. |
| 8,159,364 B2 | 4/2012 | Zeine |
| 8,180,286 B2 | 5/2012 | Yamasuge |
| 8,184,454 B2 | 5/2012 | Mao |
| 8,228,194 B2 | 7/2012 | Mickle |
| 8,234,509 B2 | 7/2012 | Gioscia et al. |
| 8,264,101 B2 | 9/2012 | Hyde et al. |
| 8,264,291 B2 | 9/2012 | Morita |
| 8,276,325 B2 | 10/2012 | Clifton et al. |
| 8,278,784 B2 | 10/2012 | Cook et al. |
| 8,284,101 B2 | 10/2012 | Fusco |
| 8,310,201 B1 | 11/2012 | Wright |
| 8,338,991 B2 | 12/2012 | Von Novak et al. |
| 8,362,745 B2 | 1/2013 | Tinaphong |
| 8,380,255 B2 | 2/2013 | Shearer et al. |
| 8,384,600 B2 | 2/2013 | Huang et al. |
| 8,410,953 B2 | 4/2013 | Zeine |
| 8,411,963 B2 | 4/2013 | Luff |
| 8,432,062 B2 | 4/2013 | Greene et al. |
| 8,432,071 B2 | 4/2013 | Huang et al. |
| 8,446,248 B2 | 5/2013 | Zeine |
| 8,447,234 B2 | 5/2013 | Cook et al. |
| 8,451,189 B1 | 5/2013 | Fluhler |
| 8,452,235 B2 | 5/2013 | Kirby et al. |
| 8,457,656 B2 | 6/2013 | Perkins et al. |
| 8,461,817 B2 | 6/2013 | Martin et al. |
| 8,467,733 B2 | 6/2013 | Leabman |
| 8,497,601 B2 | 7/2013 | Hall et al. |
| 8,497,658 B2 | 7/2013 | Von Novak et al. |
| 8,552,597 B2 | 8/2013 | Song et al. |
| 8,558,661 B2 | 10/2013 | Zeine |
| 8,560,026 B2 | 10/2013 | Chanterac |

(56) References Cited

U.S. PATENT DOCUMENTS

| | | |
|---|---|---|
| 8,564,485 B2 | 10/2013 | Milosavljevic et al. |
| 8,604,746 B2 | 12/2013 | Lee |
| 8,614,643 B2 | 12/2013 | Leabman |
| 8,621,245 B2 | 12/2013 | Shearer et al. |
| 8,626,249 B2 | 1/2014 | Kuusilinna et al. |
| 8,629,576 B2 | 1/2014 | Levine |
| 8,653,966 B2 | 2/2014 | Rao et al. |
| 8,655,272 B2 | 2/2014 | Saunamäki |
| 8,674,551 B2 | 3/2014 | Low et al. |
| 8,686,685 B2 | 4/2014 | Moshfeghi |
| 8,686,905 B2 | 4/2014 | Shtrom |
| 8,712,355 B2 | 4/2014 | Black et al. |
| 8,712,485 B2 | 4/2014 | Tam |
| 8,718,773 B2 | 5/2014 | Wills et al. |
| 8,729,737 B2 | 5/2014 | Schatz et al. |
| 8,736,228 B1 | 5/2014 | Freed et al. |
| 8,760,113 B2 | 6/2014 | Keating |
| 8,770,482 B2 | 7/2014 | Ackermann et al. |
| 8,772,960 B2 | 7/2014 | Yoshida |
| 8,823,319 B2 | 9/2014 | Von Novak, III et al. |
| 8,832,646 B1 | 9/2014 | Wendling |
| 8,854,176 B2 | 10/2014 | Zeine |
| 8,860,364 B2 | 10/2014 | Low et al. |
| 8,897,770 B1 | 11/2014 | Frolov et al. |
| 8,903,456 B2 | 12/2014 | Chu et al. |
| 8,917,057 B2 | 12/2014 | Hui |
| 8,923,189 B2 | 12/2014 | Leabman |
| 8,928,544 B2 | 1/2015 | Massie et al. |
| 8,937,408 B2 | 1/2015 | Ganem et al. |
| 8,946,940 B2 | 2/2015 | Kim et al. |
| 8,963,486 B2 | 2/2015 | Kirby et al. |
| 8,970,070 B2 | 3/2015 | Sada et al. |
| 8,989,053 B1 | 3/2015 | Skaaksrud et al. |
| 9,000,616 B2 | 4/2015 | Greene et al. |
| 9,001,622 B2 | 4/2015 | Perry |
| 9,006,934 B2 | 4/2015 | Kozakai et al. |
| 9,021,277 B2 | 4/2015 | Shearer et al. |
| 9,030,161 B2 | 5/2015 | Lu et al. |
| 9,059,598 B2 | 6/2015 | Kang et al. |
| 9,059,599 B2 | 6/2015 | Won et al. |
| 9,077,188 B2 | 7/2015 | Moshfeghi |
| 9,083,595 B2 | 7/2015 | Rakib et al. |
| 9,088,216 B2 | 7/2015 | Garrity et al. |
| 9,124,125 B2 | 9/2015 | Leabman et al. |
| 9,130,397 B2 | 9/2015 | Leabman et al. |
| 9,130,602 B2 | 9/2015 | Cook |
| 9,142,998 B2 | 9/2015 | Yu et al. |
| 9,143,000 B2 | 9/2015 | Leabman et al. |
| 9,143,010 B2 | 9/2015 | Urano |
| 9,153,074 B2 | 10/2015 | Zhou et al. |
| 9,178,389 B2 | 11/2015 | Hwang |
| 9,225,196 B2 | 12/2015 | Huang et al. |
| 9,240,469 B2 | 1/2016 | Sun et al. |
| 9,242,411 B2 | 1/2016 | Kritchman et al. |
| 9,244,500 B2 | 1/2016 | Cain et al. |
| 9,252,628 B2 | 2/2016 | Leabman et al. |
| 9,270,344 B2 | 2/2016 | Rosenberg |
| 9,276,329 B2 | 3/2016 | Jones et al. |
| 9,282,582 B1 | 3/2016 | Dunsbergen et al. |
| 9,294,840 B1 | 3/2016 | Anderson et al. |
| 9,297,896 B1 | 3/2016 | Andrews |
| 9,318,898 B2 | 4/2016 | John |
| 9,368,020 B1 | 6/2016 | Bell et al. |
| 9,401,977 B1 | 7/2016 | Gaw |
| 9,409,490 B2 | 8/2016 | Kawashima |
| 9,419,335 B2 | 8/2016 | Pintos |
| 9,419,443 B2 | 8/2016 | Leabman |
| 9,438,045 B1 | 9/2016 | Leabman |
| 9,438,046 B1 | 9/2016 | Leabman |
| 9,444,283 B2 | 9/2016 | Son et al. |
| 9,450,449 B1 | 9/2016 | Leabman et al. |
| 9,461,502 B2 | 10/2016 | Lee et al. |
| 9,520,725 B2 | 12/2016 | Masaoka et al. |
| 9,520,748 B2 | 12/2016 | Hyde et al. |
| 9,522,270 B2 | 12/2016 | Perryman et al. |
| 9,532,748 B2 | 1/2017 | Denison et al. |
| 9,537,354 B2 | 1/2017 | Bell et al. |
| 9,537,357 B2 | 1/2017 | Leabman |
| 9,537,358 B2 | 1/2017 | Leabman |
| 9,538,382 B2 | 1/2017 | Bell et al. |
| 9,544,640 B2 | 1/2017 | Lau |
| 9,559,553 B2 | 1/2017 | Bae |
| 9,564,773 B2 | 2/2017 | Pogorelik et al. |
| 9,571,974 B2 | 2/2017 | Choi et al. |
| 9,590,317 B2 | 3/2017 | Zimmerman et al. |
| 9,590,444 B2 | 3/2017 | Walley |
| 9,620,996 B2 | 4/2017 | Zeine |
| 9,647,328 B2 | 5/2017 | Dobric |
| 9,706,137 B2 | 7/2017 | Scanlon et al. |
| 9,711,999 B2 | 7/2017 | Hietala et al. |
| 9,723,635 B2 | 8/2017 | Nambord et al. |
| 9,793,758 B2 | 10/2017 | Leabman |
| 9,793,764 B2 | 10/2017 | Perry |
| 9,800,080 B2 | 10/2017 | Leabman et al. |
| 9,800,172 B1 | 10/2017 | Leabman |
| 9,806,564 B2 | 10/2017 | Leabman |
| 9,819,230 B2 | 11/2017 | Petras et al. |
| 9,824,815 B2 | 11/2017 | Leabman et al. |
| 9,825,674 B1 | 11/2017 | Leabman |
| 9,831,718 B2 | 11/2017 | Leabman et al. |
| 9,838,083 B2 | 12/2017 | Bell et al. |
| 9,843,213 B2 | 12/2017 | Leabman et al. |
| 9,843,229 B2 | 12/2017 | Leabman |
| 9,843,763 B2 | 12/2017 | Leabman et al. |
| 9,847,669 B2 | 12/2017 | Leabman |
| 9,847,677 B1 | 12/2017 | Leabman |
| 9,847,679 B2 | 12/2017 | Bell et al. |
| 9,853,361 B2 | 12/2017 | Chen et al. |
| 9,853,692 B1 | 12/2017 | Bell et al. |
| 9,859,756 B2 | 1/2018 | Leabman et al. |
| 9,859,758 B1 | 1/2018 | Leabman |
| 9,866,279 B2 | 1/2018 | Bell et al. |
| 9,867,032 B2 | 1/2018 | Verma et al. |
| 9,871,301 B2 | 1/2018 | Contopanagos |
| 9,876,380 B1 | 1/2018 | Leabman et al. |
| 9,876,394 B1 | 1/2018 | Leabman |
| 9,876,536 B1 | 1/2018 | Bell et al. |
| 9,876,648 B2 | 1/2018 | Bell |
| 9,882,394 B1 | 1/2018 | Bell et al. |
| 9,882,427 B2 | 1/2018 | Leabman et al. |
| 9,887,584 B1 | 2/2018 | Bell et al. |
| 9,887,739 B2 | 2/2018 | Leabman et al. |
| 9,891,669 B2 | 2/2018 | Bell |
| 9,893,554 B2 | 2/2018 | Bell et al. |
| 9,893,555 B1 | 2/2018 | Leabman et al. |
| 9,893,564 B2 | 2/2018 | de Rochemont |
| 9,899,744 B1 | 2/2018 | Contopanagos et al. |
| 9,899,844 B1 | 2/2018 | Bell et al. |
| 9,899,861 B1 | 2/2018 | Leabman et al. |
| 9,899,873 B2 | 2/2018 | Bell et al. |
| 9,912,199 B2 | 3/2018 | Leabman et al. |
| 9,916,485 B1 | 3/2018 | Lilly et al. |
| 9,917,477 B1 | 3/2018 | Bell et al. |
| 9,923,386 B1 | 3/2018 | Leabman et al. |
| 9,939,864 B1 | 4/2018 | Bell et al. |
| 9,941,747 B2 | 4/2018 | Bell et al. |
| 9,965,009 B1 | 5/2018 | Bell et al. |
| 9,966,765 B1 | 5/2018 | Leabman |
| 9,966,784 B2 | 5/2018 | Leabman |
| 9,967,743 B1 | 5/2018 | Bell et al. |
| 9,973,008 B1 | 5/2018 | Leabman |
| 10,003,211 B1 | 6/2018 | Leabman et al. |
| 10,008,777 B1 | 6/2018 | Broyde et al. |
| 10,008,889 B2 | 6/2018 | Bell et al. |
| 10,014,728 B1 | 7/2018 | Leabman |
| 10,027,159 B2 | 7/2018 | Hosseini |
| 10,038,337 B1 | 7/2018 | Leabman et al. |
| 10,050,462 B1 | 8/2018 | Leabman et al. |
| 10,056,782 B1 | 8/2018 | Leabman |
| 10,063,064 B1 | 8/2018 | Bell et al. |
| 10,063,105 B2 | 8/2018 | Leabman |
| 10,063,106 B2 | 8/2018 | Bell et al. |
| 10,068,703 B1 | 9/2018 | Contopanagos |
| 10,075,008 B1 | 9/2018 | Bell et al. |

(56) References Cited

U.S. PATENT DOCUMENTS

| | | |
|---|---|---|
| 10,079,515 B2 | 9/2018 | Hosseini et al. |
| 10,090,699 B1 | 10/2018 | Leabman |
| 10,090,714 B2 | 10/2018 | Bohn et al. |
| 10,090,886 B1 | 10/2018 | Bell et al. |
| 10,103,552 B1 | 10/2018 | Leabman et al. |
| 10,103,582 B2 | 10/2018 | Leabman et al. |
| 10,110,046 B1 | 10/2018 | Esquibel et al. |
| 10,122,219 B1 | 11/2018 | Hosseini et al. |
| 10,122,415 B2 | 11/2018 | Bell et al. |
| 10,124,754 B1 | 11/2018 | Leabman |
| 10,128,686 B1 | 11/2018 | Leabman et al. |
| 10,128,693 B2 | 11/2018 | Bell et al. |
| 10,128,695 B2 | 11/2018 | Leabman et al. |
| 10,128,699 B2 | 11/2018 | Leabman |
| 10,134,260 B1 | 11/2018 | Bell et al. |
| 10,135,112 B1 | 11/2018 | Hosseini |
| 10,135,286 B2 | 11/2018 | Hosseini et al. |
| 10,135,294 B1 | 11/2018 | Leabman |
| 10,135,295 B2 | 11/2018 | Leabman |
| 10,141,768 B2 | 11/2018 | Leabman et al. |
| 10,141,771 B1 | 11/2018 | Hosseini et al. |
| 10,141,791 B2 | 11/2018 | Bell et al. |
| 10,148,097 B1 | 12/2018 | Leabman et al. |
| 10,153,645 B1 | 12/2018 | Bell et al. |
| 10,153,653 B1 | 12/2018 | Bell et al. |
| 10,153,660 B1 | 12/2018 | Leabman et al. |
| 10,158,257 B2 | 12/2018 | Leabman |
| 10,158,259 B1 * | 12/2018 | Leabman ............... H02J 50/80 |
| 10,164,478 B2 | 12/2018 | Leabman |
| 10,170,917 B1 | 1/2019 | Bell et al. |
| 10,177,594 B2 | 1/2019 | Contopanagos |
| 10,181,756 B2 | 1/2019 | Bae et al. |
| 10,186,892 B2 | 1/2019 | Hosseini et al. |
| 10,186,893 B2 | 1/2019 | Bell et al. |
| 10,186,911 B2 | 1/2019 | Leabman |
| 10,186,913 B2 | 1/2019 | Leabman et al. |
| 10,193,396 B1 | 1/2019 | Bell et al. |
| 10,199,835 B2 | 2/2019 | Bell |
| 10,199,849 B1 | 2/2019 | Bell |
| 10,199,850 B2 | 2/2019 | Leabman |
| 10,205,239 B1 | 2/2019 | Contopanagos et al. |
| 10,206,185 B2 | 2/2019 | Leabman et al. |
| 10,211,674 B1 | 2/2019 | Leabman et al. |
| 10,211,680 B2 | 2/2019 | Leabman et al. |
| 10,211,682 B2 | 2/2019 | Bell et al. |
| 10,211,685 B2 | 2/2019 | Bell et al. |
| 10,218,207 B2 | 2/2019 | Hosseini et al. |
| 10,218,227 B2 | 2/2019 | Leabman et al. |
| 10,223,717 B1 | 3/2019 | Bell |
| 10,224,758 B2 | 3/2019 | Leabman et al. |
| 10,224,982 B1 | 3/2019 | Leabman |
| 10,230,266 B1 | 3/2019 | Leabman et al. |
| 10,243,414 B1 | 3/2019 | Leabman et al. |
| 10,256,657 B2 | 4/2019 | Hosseini et al. |
| 10,256,677 B2 | 4/2019 | Hosseini et al. |
| 10,263,432 B1 | 4/2019 | Leabman et al. |
| 10,263,476 B2 | 4/2019 | Leabman |
| 10,270,261 B2 | 4/2019 | Bell et al. |
| 10,277,054 B2 | 4/2019 | Hosseini |
| 10,291,055 B1 | 5/2019 | Bell et al. |
| 10,291,056 B2 | 5/2019 | Bell et al. |
| 10,291,066 B1 | 5/2019 | Leabman |
| 10,291,294 B2 | 5/2019 | Leabman |
| 10,298,024 B2 | 5/2019 | Leabman |
| 10,298,133 B2 | 5/2019 | Leabman |
| 10,305,315 B2 | 5/2019 | Leabman et al. |
| 10,312,715 B2 | 6/2019 | Leabman |
| 10,320,446 B2 | 6/2019 | Hosseini |
| 10,333,332 B1 | 6/2019 | Hosseini |
| 10,333,357 B1 * | 6/2019 | Abu Qahouq ......... H02J 50/10 |
| 10,355,534 B2 | 7/2019 | Johnston et al. |
| 10,381,880 B2 | 8/2019 | Leabman et al. |
| 10,389,161 B2 | 8/2019 | Hosseini et al. |
| 10,396,588 B2 | 8/2019 | Leabman |
| 10,396,604 B2 | 8/2019 | Bell et al. |
| 10,439,442 B2 | 10/2019 | Hosseini et al. |
| 10,439,448 B2 | 10/2019 | Bell et al. |
| 10,447,093 B2 | 10/2019 | Hosseini |
| 10,476,312 B2 | 11/2019 | Johnston et al. |
| 10,483,768 B2 | 11/2019 | Bell et al. |
| 10,490,346 B2 | 11/2019 | Contopanagos |
| 10,491,029 B2 | 11/2019 | Hosseini |
| 10,498,144 B2 | 12/2019 | Leabman et al. |
| 10,511,097 B2 | 12/2019 | Kornaros et al. |
| 10,511,196 B2 | 12/2019 | Hosseini |
| 10,516,289 B2 | 12/2019 | Leabman et al. |
| 10,516,301 B2 | 12/2019 | Leabman |
| 10,523,033 B2 | 12/2019 | Leabman |
| 10,523,058 B2 | 12/2019 | Leabman |
| 10,554,052 B2 | 2/2020 | Bell et al. |
| 10,594,165 B2 | 3/2020 | Hosseini |
| 10,615,647 B2 | 4/2020 | Johnston et al. |
| 10,680,319 B2 | 6/2020 | Hosseini et al. |
| 10,714,984 B2 | 7/2020 | Hosseini et al. |
| 10,734,717 B2 | 8/2020 | Hosseini |
| 10,778,041 B2 | 9/2020 | Leabman |
| 10,790,674 B2 | 9/2020 | Bell et al. |
| 10,840,743 B2 | 11/2020 | Johnston et al. |
| 10,879,740 B2 | 12/2020 | Hosseini |
| 10,923,954 B2 | 2/2021 | Leabman |
| 10,958,095 B2 | 3/2021 | Leabman et al. |
| 10,985,617 B1 | 4/2021 | Johnston et al. |
| 11,011,942 B2 | 5/2021 | Liu |
| 11,018,779 B2 | 5/2021 | Sarajedini |
| 2002/0065052 A1 | 5/2002 | Pande et al. |
| 2002/0103447 A1 | 8/2002 | Terry |
| 2002/0171594 A1 | 11/2002 | Fang |
| 2003/0038750 A1 | 2/2003 | Chen |
| 2003/0058187 A1 | 3/2003 | Billiet et al. |
| 2004/0020100 A1 | 2/2004 | O'Brian et al. |
| 2004/0130425 A1 | 7/2004 | Dayan et al. |
| 2004/0130442 A1 | 7/2004 | Breed |
| 2004/0145342 A1 | 7/2004 | Lyon |
| 2004/0155832 A1 | 8/2004 | Yuanzhu |
| 2004/0207559 A1 | 10/2004 | Milosavljevic |
| 2004/0259604 A1 | 12/2004 | Mickle et al. |
| 2005/0007276 A1 | 1/2005 | Barrick et al. |
| 2005/0116683 A1 | 6/2005 | Cheng |
| 2005/0117660 A1 | 6/2005 | Vialle et al. |
| 2005/0134517 A1 | 6/2005 | Gottl |
| 2005/0227619 A1 | 10/2005 | Lee et al. |
| 2005/0237258 A1 | 10/2005 | Abramov et al. |
| 2006/0013335 A1 | 1/2006 | Leabman |
| 2006/0019712 A1 | 1/2006 | Choi |
| 2006/0030279 A1 | 2/2006 | Leabman et al. |
| 2006/0092079 A1 | 5/2006 | de Rochemont |
| 2006/0094425 A1 | 5/2006 | Mickle et al. |
| 2006/0113955 A1 | 6/2006 | Nunally |
| 2006/0119532 A1 | 6/2006 | Yun et al. |
| 2006/0160517 A1 | 7/2006 | Yoon |
| 2006/0199620 A1 | 9/2006 | Greene et al. |
| 2006/0238365 A1 | 10/2006 | Vecchione et al. |
| 2006/0266564 A1 | 11/2006 | Perlman et al. |
| 2006/0266917 A1 | 11/2006 | Baldis et al. |
| 2006/0284593 A1 | 12/2006 | Nagy et al. |
| 2007/0007821 A1 | 1/2007 | Rossetti |
| 2007/0019693 A1 | 1/2007 | Graham |
| 2007/0021140 A1 | 1/2007 | Keyes |
| 2007/0060185 A1 | 3/2007 | Simon et al. |
| 2007/0090997 A1 | 4/2007 | Brown et al. |
| 2007/0093269 A1 | 4/2007 | Leabman et al. |
| 2007/0097653 A1 | 5/2007 | Gilliland et al. |
| 2007/0103110 A1 | 5/2007 | Sagoo |
| 2007/0106894 A1 | 5/2007 | Zhang |
| 2007/0109121 A1 | 5/2007 | Cohen |
| 2007/0139000 A1 | 6/2007 | Kozuma |
| 2007/0149162 A1 | 6/2007 | Greene et al. |
| 2007/0164868 A1 | 7/2007 | Deavours et al. |
| 2007/0173214 A1 | 7/2007 | Mickle et al. |
| 2007/0178857 A1 | 8/2007 | Greene et al. |
| 2007/0178945 A1 | 8/2007 | Cook et al. |
| 2007/0182367 A1 | 8/2007 | Partovi |
| 2007/0191074 A1 | 8/2007 | Harrist et al. |
| 2007/0191075 A1 | 8/2007 | Greene et al. |

(56) References Cited

U.S. PATENT DOCUMENTS

| | | |
|---|---|---|
| 2007/0210960 A1 | 9/2007 | Rofougaran et al. |
| 2007/0222681 A1 | 9/2007 | Greene et al. |
| 2007/0228833 A1 | 10/2007 | Stevens et al. |
| 2007/0229261 A1 | 10/2007 | Zimmerman et al. |
| 2007/0240297 A1 | 10/2007 | Yang et al. |
| 2007/0273486 A1 | 11/2007 | Shiotsu |
| 2007/0296639 A1 | 12/2007 | Hook et al. |
| 2007/0298846 A1 | 12/2007 | Greene et al. |
| 2008/0014897 A1 | 1/2008 | Cook et al. |
| 2008/0024376 A1 | 1/2008 | Norris et al. |
| 2008/0048917 A1 | 2/2008 | Achour et al. |
| 2008/0067874 A1 | 3/2008 | Tseng |
| 2008/0074324 A1 | 3/2008 | Puzella et al. |
| 2008/0089277 A1 | 4/2008 | Alexander et al. |
| 2008/0110263 A1 | 5/2008 | Klessel et al. |
| 2008/0122297 A1 | 5/2008 | Arai |
| 2008/0123383 A1 | 5/2008 | Shionoiri |
| 2008/0169910 A1 | 7/2008 | Greene et al. |
| 2008/0197802 A1 | 8/2008 | Onishi |
| 2008/0204350 A1 | 8/2008 | Tam et al. |
| 2008/0210762 A1 | 9/2008 | Osada et al. |
| 2008/0211458 A1 | 9/2008 | Lawther et al. |
| 2008/0233890 A1 | 9/2008 | Baker |
| 2008/0258993 A1 | 10/2008 | Gummalla et al. |
| 2008/0266191 A1 | 10/2008 | Hilgers |
| 2008/0278378 A1 | 11/2008 | Chang et al. |
| 2008/0309452 A1 | 12/2008 | Zeine |
| 2009/0002493 A1 | 1/2009 | Kates |
| 2009/0010316 A1 | 1/2009 | Rofougaran et al. |
| 2009/0019183 A1 | 1/2009 | Wu et al. |
| 2009/0036065 A1 | 2/2009 | Siu |
| 2009/0039828 A1 | 2/2009 | Jakubowski |
| 2009/0047998 A1 | 2/2009 | Alberth, Jr. |
| 2009/0058361 A1 | 3/2009 | John |
| 2009/0058731 A1 | 3/2009 | Geary et al. |
| 2009/0060012 A1 | 3/2009 | Gresset et al. |
| 2009/0067198 A1 | 3/2009 | Graham et al. |
| 2009/0067208 A1 | 3/2009 | Martin et al. |
| 2009/0073066 A1 | 3/2009 | Jordon et al. |
| 2009/0096412 A1 | 4/2009 | Huang |
| 2009/0096413 A1 | 4/2009 | Partovi |
| 2009/0102292 A1 | 4/2009 | Cook et al. |
| 2009/0102296 A1 | 4/2009 | Greene et al. |
| 2009/0108679 A1 | 4/2009 | Porwal |
| 2009/0122847 A1 | 5/2009 | Nysen et al. |
| 2009/0128262 A1 | 5/2009 | Lee et al. |
| 2009/0174604 A1 | 7/2009 | Keskitalo |
| 2009/0200985 A1 | 8/2009 | Zane et al. |
| 2009/0206791 A1 | 8/2009 | Jung |
| 2009/0207092 A1 | 8/2009 | Nysen et al. |
| 2009/0218884 A1 | 9/2009 | Soar |
| 2009/0218891 A1 | 9/2009 | McCollough |
| 2009/0243397 A1 | 10/2009 | Cook et al. |
| 2009/0256752 A1 | 10/2009 | Akkermans et al. |
| 2009/0264069 A1 | 10/2009 | Yamasuge |
| 2009/0271048 A1 | 10/2009 | Wakamatsu |
| 2009/0281678 A1 | 11/2009 | Wakamatsu |
| 2009/0284082 A1 | 11/2009 | Mohammadian |
| 2009/0284220 A1 | 11/2009 | Toncich et al. |
| 2009/0284227 A1 | 11/2009 | Mohammadian et al. |
| 2009/0286475 A1 | 11/2009 | Toncich et al. |
| 2009/0286476 A1 | 11/2009 | Toncich et al. |
| 2009/0291634 A1 | 11/2009 | Saarisalo |
| 2009/0312046 A1 | 12/2009 | Clevenger et al. |
| 2009/0322281 A1 | 12/2009 | Kamijo et al. |
| 2010/0001683 A1 | 1/2010 | Huang et al. |
| 2010/0007307 A1 | 1/2010 | Baarman et al. |
| 2010/0007569 A1 | 1/2010 | Sim et al. |
| 2010/0019908 A1 | 1/2010 | Cho et al. |
| 2010/0033021 A1 | 2/2010 | Bennett |
| 2010/0034238 A1 | 2/2010 | Bennett |
| 2010/0044123 A1 | 2/2010 | Perlman et al. |
| 2010/0060534 A1 | 3/2010 | Oodachi |
| 2010/0066631 A1 | 3/2010 | Puzella et al. |
| 2010/0075607 A1 | 3/2010 | Hosoya |
| 2010/0079005 A1 | 4/2010 | Hyde et al. |
| 2010/0079011 A1 | 4/2010 | Hyde et al. |
| 2010/0087227 A1 | 4/2010 | Francos et al. |
| 2010/0090656 A1 | 4/2010 | Shearer et al. |
| 2010/0109443 A1 | 5/2010 | Cook et al. |
| 2010/0117926 A1 | 5/2010 | DeJean, II |
| 2010/0123618 A1 | 5/2010 | Martin et al. |
| 2010/0123624 A1 | 5/2010 | Minear et al. |
| 2010/0127660 A1 | 5/2010 | Cook et al. |
| 2010/0142418 A1 | 6/2010 | Nishioka et al. |
| 2010/0142509 A1 | 6/2010 | Zhu et al. |
| 2010/0148723 A1 | 6/2010 | Cook et al. |
| 2010/0151808 A1 | 6/2010 | Toncich et al. |
| 2010/0156741 A1 | 6/2010 | Vazquez et al. |
| 2010/0164296 A1 | 7/2010 | Kurs et al. |
| 2010/0164433 A1 | 7/2010 | Janefalker et al. |
| 2010/0167664 A1 | 7/2010 | Szini |
| 2010/0171461 A1 | 7/2010 | Baarman et al. |
| 2010/0171676 A1 | 7/2010 | Tani et al. |
| 2010/0174629 A1 | 7/2010 | Taylor et al. |
| 2010/0176934 A1 | 7/2010 | Chou et al. |
| 2010/0181961 A1 | 7/2010 | Novak et al. |
| 2010/0181964 A1 | 7/2010 | Huggins et al. |
| 2010/0194206 A1 | 8/2010 | Burdo et al. |
| 2010/0201189 A1 | 8/2010 | Kirby et al. |
| 2010/0201201 A1 | 8/2010 | Mobarhan et al. |
| 2010/0201314 A1 | 8/2010 | Toncich et al. |
| 2010/0207572 A1 | 8/2010 | Kirby et al. |
| 2010/0210233 A1 | 8/2010 | Cook et al. |
| 2010/0213895 A1 | 8/2010 | Keating et al. |
| 2010/0214177 A1 | 8/2010 | Parsche |
| 2010/0222010 A1 | 9/2010 | Ozaki et al. |
| 2010/0225270 A1 | 9/2010 | Jacobs et al. |
| 2010/0227570 A1 | 9/2010 | Hendin |
| 2010/0244576 A1 | 9/2010 | Hillan et al. |
| 2010/0253281 A1 | 10/2010 | Li |
| 2010/0256831 A1 | 10/2010 | Abramo et al. |
| 2010/0259447 A1 | 10/2010 | Crouch |
| 2010/0264747 A1 | 10/2010 | Hall et al. |
| 2010/0277003 A1 | 11/2010 | Von Novak et al. |
| 2010/0279606 A1 | 11/2010 | Hillan et al. |
| 2010/0289341 A1 | 11/2010 | Ozaki et al. |
| 2010/0295372 A1 | 11/2010 | Hyde et al. |
| 2010/0309088 A1 | 12/2010 | Hyvonen et al. |
| 2010/0315045 A1 | 12/2010 | Zeine |
| 2010/0328044 A1 | 12/2010 | Waffenschmidt et al. |
| 2011/0009057 A1 | 1/2011 | Saunamäki |
| 2011/0013198 A1 | 1/2011 | Shirley |
| 2011/0018360 A1 | 1/2011 | Baarman et al. |
| 2011/0021160 A1* | 1/2011 | Vullers ............... H01Q 1/2225 455/68 |
| 2011/0028114 A1 | 2/2011 | Kerselaers |
| 2011/0032149 A1 | 2/2011 | Leabman |
| 2011/0032866 A1 | 2/2011 | Leabman |
| 2011/0034190 A1 | 2/2011 | Leabman |
| 2011/0034191 A1 | 2/2011 | Leabman |
| 2011/0043047 A1 | 2/2011 | Karalis et al. |
| 2011/0043163 A1 | 2/2011 | Baarman et al. |
| 2011/0043327 A1 | 2/2011 | Baarman et al. |
| 2011/0050166 A1 | 3/2011 | Cook et al. |
| 2011/0057607 A1 | 3/2011 | Carobolante |
| 2011/0057853 A1 | 3/2011 | Kim et al. |
| 2011/0062788 A1 | 3/2011 | Chen et al. |
| 2011/0074342 A1 | 3/2011 | MacLaughlin |
| 2011/0074349 A1 | 3/2011 | Ghovanloo |
| 2011/0109167 A1 | 5/2011 | Park et al. |
| 2011/0115303 A1 | 5/2011 | Baarman et al. |
| 2011/0115432 A1 | 5/2011 | El-Maleh |
| 2011/0115605 A1 | 5/2011 | Dimig et al. |
| 2011/0121660 A1 | 5/2011 | Azancot et al. |
| 2011/0122018 A1 | 5/2011 | Tarng et al. |
| 2011/0122026 A1 | 5/2011 | DeLaquil et al. |
| 2011/0127845 A1 | 6/2011 | Walley et al. |
| 2011/0127952 A1 | 6/2011 | Walley et al. |
| 2011/0133691 A1 | 6/2011 | Hautanen |
| 2011/0151789 A1 | 6/2011 | Viglione et al. |
| 2011/0154429 A1 | 6/2011 | Stantchev |
| 2011/0156493 A1 | 6/2011 | Bennett |
| 2011/0156494 A1 | 6/2011 | Mashinsky |

(56) References Cited

U.S. PATENT DOCUMENTS

| | | |
|---|---|---|
| 2011/0156640 A1 | 6/2011 | Moshfeghi |
| 2011/0175455 A1 | 7/2011 | Hashiguchi |
| 2011/0175461 A1 | 7/2011 | Tinaphong |
| 2011/0181120 A1 | 7/2011 | Liu et al. |
| 2011/0182245 A1 | 7/2011 | Malkamaki et al. |
| 2011/0184842 A1 | 7/2011 | Melen |
| 2011/0194543 A1 | 8/2011 | Zhao et al. |
| 2011/0195722 A1 | 8/2011 | Walter et al. |
| 2011/0199046 A1 | 8/2011 | Tsai et al. |
| 2011/0202289 A1 | 8/2011 | Kalantari Khandani |
| 2011/0215086 A1 | 9/2011 | Yeh |
| 2011/0217923 A1 | 9/2011 | Ma |
| 2011/0220634 A1 | 9/2011 | Yeh |
| 2011/0221389 A1 | 9/2011 | Won et al. |
| 2011/0222272 A1 | 9/2011 | Yeh |
| 2011/0227725 A1 | 9/2011 | Muirhead |
| 2011/0243040 A1 | 10/2011 | Khan et al. |
| 2011/0243050 A1 | 10/2011 | Yanover |
| 2011/0244913 A1 | 10/2011 | Kim et al. |
| 2011/0248573 A1 | 10/2011 | Kanno et al. |
| 2011/0248575 A1 | 10/2011 | Kim et al. |
| 2011/0249678 A1 | 10/2011 | Bonicatto |
| 2011/0254377 A1 | 10/2011 | Widmer et al. |
| 2011/0254503 A1 | 10/2011 | Widmer et al. |
| 2011/0259953 A1 | 10/2011 | Baarman et al. |
| 2011/0273977 A1 | 11/2011 | Shapira et al. |
| 2011/0278941 A1 | 11/2011 | Krishna et al. |
| 2011/0279226 A1 | 11/2011 | Chen et al. |
| 2011/0281535 A1 | 11/2011 | Low et al. |
| 2011/0282415 A1 | 11/2011 | Eckhoff et al. |
| 2011/0285213 A1 | 11/2011 | Kowalewski |
| 2011/0286374 A1 | 11/2011 | Shin et al. |
| 2011/0291489 A1 | 12/2011 | Tsai et al. |
| 2011/0302078 A1 | 12/2011 | Failing |
| 2011/0304216 A1 | 12/2011 | Baarman |
| 2011/0304437 A1 | 12/2011 | Beeler |
| 2011/0304521 A1 | 12/2011 | Ando et al. |
| 2012/0007441 A1 | 1/2012 | John |
| 2012/0013196 A1 | 1/2012 | Kim et al. |
| 2012/0013198 A1 | 1/2012 | Uramoto et al. |
| 2012/0013296 A1 | 1/2012 | Heydari et al. |
| 2012/0019419 A1 | 1/2012 | Prat et al. |
| 2012/0025622 A1 | 2/2012 | Kim et al. |
| 2012/0043887 A1 | 2/2012 | Mesibov |
| 2012/0051109 A1 | 3/2012 | Kim et al. |
| 2012/0051294 A1 | 3/2012 | Guillouard |
| 2012/0056486 A1 | 3/2012 | Endo et al. |
| 2012/0056741 A1 | 3/2012 | Zhu et al. |
| 2012/0068906 A1 | 3/2012 | Asher et al. |
| 2012/0074891 A1 | 3/2012 | Anderson et al. |
| 2012/0075072 A1 | 3/2012 | Pappu |
| 2012/0080944 A1 | 4/2012 | Recker et al. |
| 2012/0080957 A1 | 4/2012 | Cooper et al. |
| 2012/0086284 A1 | 4/2012 | Capanella et al. |
| 2012/0086615 A1 | 4/2012 | Norair |
| 2012/0095617 A1 | 4/2012 | Martin et al. |
| 2012/0098350 A1 | 4/2012 | Campanella et al. |
| 2012/0098485 A1 | 4/2012 | Kang et al. |
| 2012/0099675 A1 | 4/2012 | Kitamura et al. |
| 2012/0103562 A1 | 5/2012 | Clayton |
| 2012/0104849 A1 | 5/2012 | Jackson |
| 2012/0105252 A1 | 5/2012 | Wang |
| 2012/0112532 A1 | 5/2012 | Kesler et al. |
| 2012/0119914 A1 | 5/2012 | Uchida |
| 2012/0126743 A1 | 5/2012 | Rivers, Jr. |
| 2012/0132647 A1 | 5/2012 | Beverly et al. |
| 2012/0133214 A1 | 5/2012 | Yun et al. |
| 2012/0142291 A1 | 6/2012 | Rath et al. |
| 2012/0146426 A1 | 6/2012 | Sabo |
| 2012/0146576 A1 | 6/2012 | Partovi |
| 2012/0146577 A1 | 6/2012 | Tanabe |
| 2012/0147802 A1 | 6/2012 | Ukita et al. |
| 2012/0149307 A1 | 6/2012 | Terada et al. |
| 2012/0150670 A1 | 6/2012 | Taylor et al. |
| 2012/0153894 A1 | 6/2012 | Widmer et al. |
| 2012/0157019 A1 | 6/2012 | Li |
| 2012/0161531 A1 | 6/2012 | Kim et al. |
| 2012/0161544 A1 | 6/2012 | Kashiwagi et al. |
| 2012/0169276 A1 | 7/2012 | Wang |
| 2012/0169278 A1 | 7/2012 | Choi |
| 2012/0173418 A1 | 7/2012 | Beardsmore et al. |
| 2012/0179004 A1 | 7/2012 | Roesicke et al. |
| 2012/0181973 A1 | 7/2012 | Lyden |
| 2012/0182427 A1 | 7/2012 | Marshall |
| 2012/0188142 A1 | 7/2012 | Shashi et al. |
| 2012/0187851 A1 | 8/2012 | Huggins et al. |
| 2012/0193999 A1 | 8/2012 | Zeine |
| 2012/0200399 A1 | 8/2012 | Chae |
| 2012/0201153 A1 | 8/2012 | Bharadia et al. |
| 2012/0201173 A1 | 8/2012 | Jian et al. |
| 2012/0206299 A1 | 8/2012 | Valdes-Garcia |
| 2012/0211214 A1 | 8/2012 | Phan |
| 2012/0212071 A1 | 8/2012 | Miyabayashi et al. |
| 2012/0212072 A1 | 8/2012 | Miyabayashi et al. |
| 2012/0214462 A1 | 8/2012 | Chu et al. |
| 2012/0214536 A1 | 8/2012 | Kim et al. |
| 2012/0228392 A1 | 9/2012 | Cameron et al. |
| 2012/0228956 A1 | 9/2012 | Kamata |
| 2012/0231856 A1 | 9/2012 | Lee et al. |
| 2012/0235636 A1 | 9/2012 | Partovi |
| 2012/0242283 A1 | 9/2012 | Kim et al. |
| 2012/0248886 A1 | 10/2012 | Kesler et al. |
| 2012/0248888 A1 | 10/2012 | Kesler et al. |
| 2012/0248891 A1 | 10/2012 | Drennen |
| 2012/0249051 A1 | 10/2012 | Son et al. |
| 2012/0262002 A1 | 10/2012 | Widmer et al. |
| 2012/0265272 A1 | 10/2012 | Judkins |
| 2012/0267900 A1 | 10/2012 | Huffman et al. |
| 2012/0268238 A1 | 10/2012 | Park et al. |
| 2012/0270592 A1 | 10/2012 | Ngi |
| 2012/0274154 A1 | 11/2012 | DeLuca |
| 2012/0280650 A1 | 11/2012 | Kim et al. |
| 2012/0286582 A1 | 11/2012 | Kim et al. |
| 2012/0292993 A1 | 11/2012 | Mettler et al. |
| 2012/0293021 A1 | 11/2012 | Teggatz et al. |
| 2012/0293119 A1 | 11/2012 | Park et al. |
| 2012/0299389 A1 | 11/2012 | Lee et al. |
| 2012/0299540 A1 | 11/2012 | Perry |
| 2012/0299541 A1 | 11/2012 | Perry |
| 2012/0299542 A1 | 11/2012 | Perry |
| 2012/0300588 A1 | 11/2012 | Perry |
| 2012/0300592 A1 | 11/2012 | Perry |
| 2012/0300593 A1 | 11/2012 | Perry |
| 2012/0306284 A1 | 12/2012 | Lee et al. |
| 2012/0306433 A1 | 12/2012 | Kim et al. |
| 2012/0306572 A1 | 12/2012 | Hietala et al. |
| 2012/0306705 A1 | 12/2012 | Sakurai et al. |
| 2012/0306707 A1 | 12/2012 | Yang et al. |
| 2012/0306720 A1 | 12/2012 | Tanmi et al. |
| 2012/0307873 A1 | 12/2012 | Kim et al. |
| 2012/0309295 A1 | 12/2012 | Maguire |
| 2012/0309308 A1 | 12/2012 | Kim et al. |
| 2012/0309332 A1 | 12/2012 | Liao |
| 2012/0313446 A1 | 12/2012 | Park et al. |
| 2012/0313449 A1 | 12/2012 | Kurs |
| 2012/0313835 A1 | 12/2012 | Gebretnsae |
| 2012/0326660 A1 | 12/2012 | Lu et al. |
| 2013/0002550 A1 | 1/2013 | Zalewski |
| 2013/0005252 A1 | 1/2013 | Lee et al. |
| 2013/0018439 A1 | 1/2013 | Chow et al. |
| 2013/0024059 A1 | 1/2013 | Miller et al. |
| 2013/0026981 A1 | 1/2013 | Van Der Lee |
| 2013/0026982 A1 | 1/2013 | Rothenbaum |
| 2013/0032589 A1 | 2/2013 | Chung |
| 2013/0033571 A1 | 2/2013 | Steen |
| 2013/0038124 A1 | 2/2013 | Newdoll et al. |
| 2013/0038402 A1 | 2/2013 | Karalis et al. |
| 2013/0043738 A1 | 2/2013 | Park et al. |
| 2013/0044035 A1 | 2/2013 | Zhuang |
| 2013/0049471 A1 | 2/2013 | Oleynik |
| 2013/0049475 A1 | 2/2013 | Kim et al. |
| 2013/0049484 A1 | 2/2013 | Weissentern et al. |
| 2013/0057078 A1 | 3/2013 | Lee |
| 2013/0057205 A1 | 3/2013 | Lee et al. |

(56) References Cited

U.S. PATENT DOCUMENTS

| | | |
|---|---|---|
| 2013/0057210 A1 | 3/2013 | Negaard et al. |
| 2013/0057364 A1 | 3/2013 | Kesler et al. |
| 2013/0058379 A1 | 3/2013 | Kim et al. |
| 2013/0062959 A1 | 3/2013 | Lee et al. |
| 2013/0063082 A1 | 3/2013 | Lee et al. |
| 2013/0063143 A1 | 3/2013 | Adalsteinsson et al. |
| 2013/0063266 A1 | 3/2013 | Yunker et al. |
| 2013/0069444 A1 | 3/2013 | Waffenschmidt et al. |
| 2013/0076308 A1 | 3/2013 | Niskala et al. |
| 2013/0077650 A1 | 3/2013 | Traxler et al. |
| 2013/0078918 A1 | 3/2013 | Crowley et al. |
| 2013/0082651 A1 | 4/2013 | Park et al. |
| 2013/0082653 A1 | 4/2013 | Lee et al. |
| 2013/0083774 A1 | 4/2013 | Son et al. |
| 2013/0088082 A1 | 4/2013 | Kang et al. |
| 2013/0088090 A1 | 4/2013 | Wu |
| 2013/0088192 A1 | 4/2013 | Eaton |
| 2013/0088331 A1 | 4/2013 | Cho |
| 2013/0093388 A1 | 4/2013 | Partovi |
| 2013/0099389 A1 | 4/2013 | Hong et al. |
| 2013/0099586 A1 | 4/2013 | Kato |
| 2013/0106197 A1 | 5/2013 | Bae et al. |
| 2013/0107023 A1 | 5/2013 | Tanaka et al. |
| 2013/0119777 A1 | 5/2013 | Rees |
| 2013/0119778 A1 | 5/2013 | Jung |
| 2013/0119929 A1 | 5/2013 | Partovi |
| 2013/0120052 A1 | 5/2013 | Siska |
| 2013/0120205 A1 | 5/2013 | Thomson et al. |
| 2013/0120206 A1 | 5/2013 | Biancotto et al. |
| 2013/0120217 A1 | 5/2013 | Ueda et al. |
| 2013/0130621 A1 | 5/2013 | Kim et al. |
| 2013/0132010 A1 | 5/2013 | Winger et al. |
| 2013/0134923 A1 | 5/2013 | Smith |
| 2013/0137455 A1 | 5/2013 | Xia |
| 2013/0141037 A1 | 6/2013 | Jenwatanavet et al. |
| 2013/0148341 A1 | 6/2013 | Williams |
| 2013/0149975 A1 | 6/2013 | Yu et al. |
| 2013/0154387 A1 | 6/2013 | Lee et al. |
| 2013/0155748 A1 | 6/2013 | Sundstrom |
| 2013/0157729 A1 | 6/2013 | Tabe |
| 2013/0162335 A1 | 6/2013 | Kim et al. |
| 2013/0169061 A1 | 7/2013 | Microshnichenko et al. |
| 2013/0169219 A1 | 7/2013 | Gray |
| 2013/0169348 A1 | 7/2013 | Shi |
| 2013/0171939 A1 | 7/2013 | Tian et al. |
| 2013/0175877 A1 | 7/2013 | Abe et al. |
| 2013/0178253 A1 | 7/2013 | Karaoguz |
| 2013/0181881 A1 | 7/2013 | Christie et al. |
| 2013/0187475 A1 | 7/2013 | Vendik |
| 2013/0190031 A1 | 7/2013 | Persson et al. |
| 2013/0193769 A1 | 8/2013 | Mehta et al. |
| 2013/0197320 A1 | 8/2013 | Albert et al. |
| 2013/0200064 A1 | 8/2013 | Alexander |
| 2013/0207477 A1 | 8/2013 | Nam et al. |
| 2013/0207604 A1 | 8/2013 | Zeine |
| 2013/0207879 A1 | 8/2013 | Rada et al. |
| 2013/0207893 A1 | 8/2013 | Liu et al. |
| 2013/0210357 A1 | 8/2013 | Qin et al. |
| 2013/0221757 A1 | 8/2013 | Cho et al. |
| 2013/0222201 A1 | 8/2013 | Ma et al. |
| 2013/0234530 A1 | 9/2013 | Miyauchi |
| 2013/0234536 A1 | 9/2013 | Chemishkian et al. |
| 2013/0234658 A1 | 9/2013 | Endo et al. |
| 2013/0241306 A1 | 9/2013 | Aber et al. |
| 2013/0241468 A1 | 9/2013 | Moshfeghi |
| 2013/0241474 A1 | 9/2013 | Moshfeghi |
| 2013/0249478 A1 | 9/2013 | Hirano |
| 2013/0249479 A1 | 9/2013 | Partovi |
| 2013/0249682 A1 | 9/2013 | Van Wiemeersch et al. |
| 2013/0250102 A1 | 9/2013 | Scanlon et al. |
| 2013/0254578 A1 | 9/2013 | Huang et al. |
| 2013/0264997 A1 | 10/2013 | Lee et al. |
| 2013/0268782 A1 | 10/2013 | Tam et al. |
| 2013/0270923 A1 | 10/2013 | Cook et al. |
| 2013/0278076 A1 | 10/2013 | Proud |
| 2013/0278209 A1 | 10/2013 | Von Novak |
| 2013/0285464 A1 | 10/2013 | Miwa |
| 2013/0285477 A1 | 10/2013 | Lo et al. |
| 2013/0285606 A1 | 10/2013 | Ben-Shalom et al. |
| 2013/0288600 A1 | 10/2013 | Kuusilinna et al. |
| 2013/0288617 A1 | 10/2013 | Kim et al. |
| 2013/0293423 A1 | 11/2013 | Moshfeghi |
| 2013/0300356 A1 | 11/2013 | Yang |
| 2013/0307751 A1 | 11/2013 | Yu-Juin et al. |
| 2013/0310020 A1 | 11/2013 | Kazuhiro |
| 2013/0311798 A1 | 11/2013 | Sultenfuss |
| 2013/0328417 A1 | 12/2013 | Takeuchi |
| 2013/0334883 A1 | 12/2013 | Kim et al. |
| 2013/0339108 A1 | 12/2013 | Ryder et al. |
| 2013/0343208 A1 | 12/2013 | Sexton et al. |
| 2013/0343251 A1 | 12/2013 | Zhang |
| 2013/0343585 A1 | 12/2013 | Bennett et al. |
| 2014/0001846 A1 | 1/2014 | Mosebrook |
| 2014/0001875 A1 | 1/2014 | Nahidipour |
| 2014/0001876 A1 | 1/2014 | Fujiwara et al. |
| 2014/0006017 A1 | 1/2014 | Sen |
| 2014/0008993 A1 | 1/2014 | Leabman |
| 2014/0009110 A1 | 1/2014 | Lee |
| 2014/0011531 A1 | 1/2014 | Burstrom et al. |
| 2014/0015336 A1 | 1/2014 | Weber et al. |
| 2014/0015344 A1 | 1/2014 | Mohamadi |
| 2014/0021907 A1 | 1/2014 | Yu et al. |
| 2014/0021908 A1 | 1/2014 | McCool |
| 2014/0024325 A1 | 1/2014 | Iun et al. |
| 2014/0035524 A1 | 2/2014 | Zeine |
| 2014/0035526 A1 | 2/2014 | Tripathi et al. |
| 2014/0035786 A1 | 2/2014 | Ley |
| 2014/0043248 A1 | 2/2014 | Yeh |
| 2014/0049422 A1 | 2/2014 | Von Novak et al. |
| 2014/0054971 A1 | 2/2014 | Kissin |
| 2014/0055098 A1 | 2/2014 | Lee et al. |
| 2014/0057618 A1 | 2/2014 | Zirwas et al. |
| 2014/0062395 A1 | 3/2014 | Kwon et al. |
| 2014/0082435 A1 | 3/2014 | Kitgawa |
| 2014/0086125 A1 | 3/2014 | Polo et al. |
| 2014/0086592 A1 | 3/2014 | Nakahara et al. |
| 2014/0091756 A1 | 4/2014 | Ofstein et al. |
| 2014/0091968 A1 | 4/2014 | Harel et al. |
| 2014/0091974 A1 | 4/2014 | Desclos et al. |
| 2014/0103869 A1 | 4/2014 | Radovic |
| 2014/0104157 A1 | 4/2014 | Burns |
| 2014/0111147 A1 | 4/2014 | Soar |
| 2014/0111153 A1 | 4/2014 | Kwon et al. |
| 2014/0113689 A1 | 4/2014 | Lee |
| 2014/0117946 A1 | 5/2014 | Muller et al. |
| 2014/0118140 A1 | 5/2014 | Amis |
| 2014/0128107 A1 | 5/2014 | An |
| 2014/0132210 A1 | 5/2014 | Partovi |
| 2014/0133279 A1 | 5/2014 | Khuri-Yakub |
| 2014/0139034 A1 | 5/2014 | Sankar et al. |
| 2014/0139039 A1 | 5/2014 | Cook et al. |
| 2014/0139180 A1 | 5/2014 | Kim et al. |
| 2014/0141838 A1 | 5/2014 | Cai et al. |
| 2014/0142876 A1 | 5/2014 | John et al. |
| 2014/0143933 A1 | 5/2014 | Low et al. |
| 2014/0145879 A1 | 5/2014 | Pan |
| 2014/0145884 A1 | 5/2014 | Dang et al. |
| 2014/0152117 A1 | 6/2014 | Sanker |
| 2014/0159651 A1 | 6/2014 | Von Novak et al. |
| 2014/0159652 A1 | 6/2014 | Hall et al. |
| 2014/0159662 A1 | 6/2014 | Furui |
| 2014/0159667 A1 | 6/2014 | Kim et al. |
| 2014/0169385 A1 | 6/2014 | Hadani et al. |
| 2014/0175893 A1 | 6/2014 | Sengupta et al. |
| 2014/0176054 A1 | 6/2014 | Porat et al. |
| 2014/0176061 A1 | 6/2014 | Cheatham, III et al. |
| 2014/0176082 A1 | 6/2014 | Visser |
| 2014/0177399 A1 | 6/2014 | Teng et al. |
| 2014/0183964 A1 | 7/2014 | Walley |
| 2014/0184148 A1 | 7/2014 | Van Der Lee et al. |
| 2014/0184155 A1 | 7/2014 | Cha |
| 2014/0184163 A1 | 7/2014 | Das et al. |
| 2014/0184170 A1 | 7/2014 | Jeong |
| 2014/0191568 A1 | 7/2014 | Partovi |

(56) References Cited

U.S. PATENT DOCUMENTS

| | | |
|---|---|---|
| 2014/0191818 A1 | 7/2014 | Waffenschmidt et al. |
| 2014/0194092 A1 | 7/2014 | Wanstedt et al. |
| 2014/0194095 A1 | 7/2014 | Wanstedt et al. |
| 2014/0197691 A1 | 7/2014 | Wang |
| 2014/0203629 A1 | 7/2014 | Hoffman et al. |
| 2014/0206384 A1 | 7/2014 | Kim et al. |
| 2014/0210281 A1 | 7/2014 | Ito et al. |
| 2014/0217955 A1 | 8/2014 | Lin |
| 2014/0217967 A1 | 8/2014 | Zeine et al. |
| 2014/0225805 A1 | 8/2014 | Pan et al. |
| 2014/0232320 A1 | 8/2014 | Ento July et al. |
| 2014/0232610 A1 | 8/2014 | Shigemoto et al. |
| 2014/0239733 A1 | 8/2014 | Mach et al. |
| 2014/0241231 A1 | 8/2014 | Zeine |
| 2014/0245036 A1 | 8/2014 | Oishi |
| 2014/0246416 A1 | 9/2014 | White |
| 2014/0247152 A1 | 9/2014 | Proud |
| 2014/0252813 A1 | 9/2014 | Lee et al. |
| 2014/0252866 A1 | 9/2014 | Walsh et al. |
| 2014/0265725 A1 | 9/2014 | Angle et al. |
| 2014/0265727 A1 | 9/2014 | Berte |
| 2014/0265943 A1 | 9/2014 | Angle et al. |
| 2014/0266025 A1 | 9/2014 | Jakubowski |
| 2014/0266946 A1 | 9/2014 | Bily et al. |
| 2014/0273819 A1 | 9/2014 | Nadakuduti et al. |
| 2014/0273892 A1 | 9/2014 | Nourbakhsh |
| 2014/0281655 A1 | 9/2014 | Angle et al. |
| 2014/0292090 A1 | 10/2014 | Cordeiro et al. |
| 2014/0292451 A1 | 10/2014 | Zimmerman |
| 2014/0300452 A1 | 10/2014 | Rofe et al. |
| 2014/0312706 A1 | 10/2014 | Fiorello et al. |
| 2014/0325218 A1 | 10/2014 | Shimizu et al. |
| 2014/0327320 A1 | 11/2014 | Muhs et al. |
| 2014/0327390 A1 | 11/2014 | Park et al. |
| 2014/0333142 A1 | 11/2014 | Desrosiers |
| 2014/0346860 A1 | 11/2014 | Aubry et al. |
| 2014/0354063 A1 | 12/2014 | Leabman et al. |
| 2014/0354221 A1 | 12/2014 | Leabman et al. |
| 2014/0355718 A1 | 12/2014 | Guan et al. |
| 2014/0368048 A1 | 12/2014 | Leabman et al. |
| 2014/0368161 A1 | 12/2014 | Leabman et al. |
| 2014/0368405 A1 | 12/2014 | Ek et al. |
| 2014/0375139 A1 | 12/2014 | Tsukamoto |
| 2014/0375253 A1 | 12/2014 | Leabman et al. |
| 2014/0375258 A1 | 12/2014 | Arkhipenkov |
| 2014/0375261 A1 | 12/2014 | Manova-Elssibony et al. |
| 2015/0001949 A1 | 1/2015 | Leabman et al. |
| 2015/0002080 A1* | 1/2015 | Lang ............... H02J 50/90 307/149 |
| 2015/0002086 A1 | 1/2015 | Matos et al. |
| 2015/0003207 A1 | 1/2015 | Lee et al. |
| 2015/0008980 A1 | 1/2015 | Kim et al. |
| 2015/0011160 A1 | 1/2015 | Uurgovan et al. |
| 2015/0015180 A1 | 1/2015 | Miller et al. |
| 2015/0015182 A1 | 1/2015 | Brandtman et al. |
| 2015/0015192 A1 | 1/2015 | Leabman et al. |
| 2015/0021990 A1 | 1/2015 | Myer et al. |
| 2015/0022008 A1 | 1/2015 | Leabman et al. |
| 2015/0022010 A1 | 1/2015 | Leabman et al. |
| 2015/0022194 A1 | 1/2015 | Almalki et al. |
| 2015/0023204 A1 | 1/2015 | Wil et al. |
| 2015/0028688 A1 | 1/2015 | Masaoka |
| 2015/0028694 A1 | 1/2015 | Leabman et al. |
| 2015/0028697 A1 | 1/2015 | Leabman et al. |
| 2015/0028875 A1 | 1/2015 | Irie et al. |
| 2015/0035378 A1 | 2/2015 | Calhoun et al. |
| 2015/0035709 A1 | 2/2015 | Lim |
| 2015/0035715 A1 | 2/2015 | Kim et al. |
| 2015/0039482 A1 | 2/2015 | Fuinaga |
| 2015/0041459 A1 | 2/2015 | Leabman et al. |
| 2015/0042265 A1 | 2/2015 | Leabman et al. |
| 2015/0044977 A1 | 2/2015 | Ramasamy et al. |
| 2015/0046526 A1 | 2/2015 | Bush et al. |
| 2015/0061404 A1 | 3/2015 | Lamenza et al. |
| 2015/0076917 A1 | 3/2015 | Leabman et al. |
| 2015/0076927 A1 | 3/2015 | Leabman et al. |
| 2015/0077036 A1 | 3/2015 | Leabman et al. |
| 2015/0077037 A1 | 3/2015 | Leabman et al. |
| 2015/0091520 A1 | 4/2015 | Blum et al. |
| 2015/0091706 A1 | 4/2015 | Chemishkian et al. |
| 2015/0097442 A1 | 4/2015 | Muurinen |
| 2015/0097663 A1 | 4/2015 | Sloo et al. |
| 2015/0102764 A1 | 4/2015 | Leabman et al. |
| 2015/0102769 A1 | 4/2015 | Leabman et al. |
| 2015/0102942 A1 | 4/2015 | Houser et al. |
| 2015/0102973 A1 | 4/2015 | Hand et al. |
| 2015/0108848 A1 | 4/2015 | Joehren |
| 2015/0109181 A1 | 4/2015 | Hyde et al. |
| 2015/0115877 A1 | 4/2015 | Aria et al. |
| 2015/0115878 A1 | 4/2015 | Park |
| 2015/0116153 A1 | 4/2015 | Chen et al. |
| 2015/0128733 A1 | 5/2015 | Taylor et al. |
| 2015/0130285 A1 | 5/2015 | Leabman et al. |
| 2015/0130293 A1 | 5/2015 | Hajimiri et al. |
| 2015/0137612 A1 | 5/2015 | Yamakawa et al. |
| 2015/0148664 A1 | 5/2015 | Stolka et al. |
| 2015/0155737 A1 | 6/2015 | Mayo |
| 2015/0155738 A1 | 6/2015 | Leabman et al. |
| 2015/0162662 A1 | 6/2015 | Chen et al. |
| 2015/0162751 A1 | 6/2015 | Leabman et al. |
| 2015/0162779 A1 | 6/2015 | Lee et al. |
| 2015/0171512 A1 | 6/2015 | Chen et al. |
| 2015/0171513 A1 | 6/2015 | Chen et al. |
| 2015/0171656 A1 | 6/2015 | Leabman et al. |
| 2015/0171658 A1 | 6/2015 | Manova-Elssibony et al. |
| 2015/0171931 A1 | 6/2015 | Won et al. |
| 2015/0177326 A1 | 6/2015 | Chakraborty et al. |
| 2015/0180133 A1 | 6/2015 | Hunt |
| 2015/0180249 A1 | 6/2015 | Jeon et al. |
| 2015/0180284 A1 | 6/2015 | Kang et al. |
| 2015/0181117 A1 | 6/2015 | Park et al. |
| 2015/0187491 A1 | 7/2015 | Yanagawa |
| 2015/0188352 A1 | 7/2015 | Peek et al. |
| 2015/0199665 A1 | 7/2015 | Chu |
| 2015/0201385 A1 | 7/2015 | Mercer et al. |
| 2015/0207333 A1 | 7/2015 | Baarman et al. |
| 2015/0207542 A1 | 7/2015 | Zeine |
| 2015/0222126 A1 | 8/2015 | Leabman et al. |
| 2015/0233987 A1 | 8/2015 | Von Novak, III et al. |
| 2015/0234144 A1 | 8/2015 | Cameron et al. |
| 2015/0236515 A1* | 8/2015 | Yoshida ............... H02J 50/402 307/104 |
| 2015/0236520 A1 | 8/2015 | Baarman |
| 2015/0236877 A1 | 8/2015 | Peng et al. |
| 2015/0244070 A1 | 8/2015 | Cheng et al. |
| 2015/0244080 A1 | 8/2015 | Gregoire |
| 2015/0244187 A1 | 8/2015 | Horie |
| 2015/0244201 A1 | 8/2015 | Chu |
| 2015/0244341 A1 | 8/2015 | Ritter et al. |
| 2015/0249484 A1 | 9/2015 | Mach et al. |
| 2015/0255989 A1 | 9/2015 | Walley et al. |
| 2015/0256097 A1 | 9/2015 | Gudan et al. |
| 2015/0260835 A1 | 9/2015 | Widmer et al. |
| 2015/0262465 A1 | 9/2015 | Pritchett |
| 2015/0263534 A1 | 9/2015 | Lee et al. |
| 2015/0263548 A1 | 9/2015 | Cooper |
| 2015/0270618 A1 | 9/2015 | Zhu et al. |
| 2015/0270622 A1 | 9/2015 | Takasaki et al. |
| 2015/0270741 A1 | 9/2015 | Leabman et al. |
| 2015/0278558 A1 | 10/2015 | Priev et al. |
| 2015/0280429 A1 | 10/2015 | Makita et al. |
| 2015/0280484 A1 | 10/2015 | Radziemski et al. |
| 2015/0288074 A1 | 10/2015 | Harper et al. |
| 2015/0288438 A1 | 10/2015 | Maltsev et al. |
| 2015/0311585 A1 | 10/2015 | Church et al. |
| 2015/0312721 A1 | 10/2015 | Singh |
| 2015/0318729 A1 | 11/2015 | Leabman |
| 2015/0326024 A1 | 11/2015 | Bell et al. |
| 2015/0326070 A1 | 11/2015 | Petras et al. |
| 2015/0326072 A1 | 11/2015 | Petras et al. |
| 2015/0326143 A1 | 11/2015 | Petras et al. |
| 2015/0327085 A1 | 11/2015 | Hadani |
| 2015/0333528 A1 | 11/2015 | Leabman |
| 2015/0333573 A1 | 11/2015 | Leabman |

(56) References Cited

U.S. PATENT DOCUMENTS

| | | |
|---|---|---|
| 2015/0333800 A1 | 11/2015 | Perry et al. |
| 2015/0339497 A1 | 11/2015 | Kurian |
| 2015/0340759 A1 | 11/2015 | Bridgelall et al. |
| 2015/0340903 A1 | 11/2015 | Bell et al. |
| 2015/0341087 A1 | 11/2015 | Moore et al. |
| 2015/0358222 A1 | 12/2015 | Berger et al. |
| 2015/0365137 A1 | 12/2015 | Miller et al. |
| 2015/0365138 A1 | 12/2015 | Miller et al. |
| 2016/0005068 A1 | 1/2016 | Im et al. |
| 2016/0012695 A1 | 1/2016 | Bell et al. |
| 2016/0013560 A1 | 1/2016 | Daniels |
| 2016/0013661 A1 | 1/2016 | Kurs et al. |
| 2016/0013677 A1 | 1/2016 | Bell et al. |
| 2016/0013855 A1 | 1/2016 | Campos |
| 2016/0020636 A1 | 1/2016 | Khlat |
| 2016/0025846 A1* | 1/2016 | Mostov ............... G01S 13/886 342/28 |
| 2016/0028403 A1 | 1/2016 | McCaughan et al. |
| 2016/0033254 A1 | 2/2016 | Zeine et al. |
| 2016/0042206 A1 | 2/2016 | Pesavento et al. |
| 2016/0043571 A1 | 2/2016 | Kesler et al. |
| 2016/0043572 A1 | 2/2016 | Cooper et al. |
| 2016/0054440 A1 | 2/2016 | Younis |
| 2016/0056635 A1 | 2/2016 | Bell |
| 2016/0056640 A1 | 2/2016 | Mao |
| 2016/0065005 A1 | 3/2016 | Won et al. |
| 2016/0079799 A1 | 3/2016 | Khlat |
| 2016/0087483 A1 | 3/2016 | Hietala et al. |
| 2016/0087486 A1 | 3/2016 | Pogorelik et al. |
| 2016/0094091 A1 | 3/2016 | Shin et al. |
| 2016/0094092 A1 | 3/2016 | Davlantes et al. |
| 2016/0099601 A1 | 4/2016 | Leabman et al. |
| 2016/0099611 A1 | 4/2016 | Leabman et al. |
| 2016/0099612 A1 | 4/2016 | Leabman et al. |
| 2016/0099614 A1 | 4/2016 | Leabman et al. |
| 2016/0099755 A1 | 4/2016 | Leabman et al. |
| 2016/0099757 A1 | 4/2016 | Leabman et al. |
| 2016/0112787 A1 | 4/2016 | Rich |
| 2016/0126749 A1 | 5/2016 | Shichino et al. |
| 2016/0126752 A1 | 5/2016 | Vuori et al. |
| 2016/0126776 A1 | 5/2016 | Kim et al. |
| 2016/0141908 A1 | 5/2016 | Jakl et al. |
| 2016/0164563 A1 | 6/2016 | Khawand et al. |
| 2016/0174162 A1 | 6/2016 | Nadakuduti et al. |
| 2016/0181849 A1 | 6/2016 | Govindaraj |
| 2016/0181867 A1 | 6/2016 | Daniel et al. |
| 2016/0181873 A1 | 6/2016 | Mitcheson et al. |
| 2016/0197522 A1 | 7/2016 | Zeine et al. |
| 2016/0202343 A1 | 7/2016 | Okutsu |
| 2016/0204642 A1 | 7/2016 | Oh |
| 2016/0218545 A1 | 7/2016 | Schroeder et al. |
| 2016/0233582 A1 | 8/2016 | Piskun |
| 2016/0238365 A1 | 8/2016 | Wixey et al. |
| 2016/0240908 A1 | 8/2016 | Strong |
| 2016/0248276 A1 | 8/2016 | Hong et al. |
| 2016/0294225 A1 | 10/2016 | Blum et al. |
| 2016/0299210 A1 | 10/2016 | Zeine |
| 2016/0301240 A1 | 10/2016 | Zeine |
| 2016/0322868 A1 | 11/2016 | Akuzawa et al. |
| 2016/0323000 A1 | 11/2016 | Liu et al. |
| 2016/0336804 A1 | 11/2016 | Son et al. |
| 2016/0339258 A1 | 11/2016 | Perryman et al. |
| 2016/0344098 A1 | 11/2016 | Ming |
| 2016/0359367 A1 | 12/2016 | Rothschild |
| 2016/0377710 A1* | 12/2016 | Tanaka ............... G01J 5/0025 342/27 |
| 2016/0380464 A1 | 12/2016 | Chin et al. |
| 2016/0380466 A1 | 12/2016 | Yang et al. |
| 2017/0005481 A1 | 1/2017 | Von Novak, III |
| 2017/0005516 A9 | 1/2017 | Leabman et al. |
| 2017/0005524 A1 | 1/2017 | Akuzawa et al. |
| 2017/0005530 A1 | 1/2017 | Zeine et al. |
| 2017/0012448 A1 | 1/2017 | Miller et al. |
| 2017/0025887 A1 | 1/2017 | Hyun et al. |
| 2017/0025903 A1 | 1/2017 | Song et al. |
| 2017/0026087 A1 | 1/2017 | Tanabe |
| 2017/0040700 A1 | 2/2017 | Leung |
| 2017/0043675 A1 | 2/2017 | Jones et al. |
| 2017/0047784 A1 | 2/2017 | Jung et al. |
| 2017/0063168 A1 | 3/2017 | Uchida |
| 2017/0077733 A1 | 3/2017 | Jeong et al. |
| 2017/0077764 A1 | 3/2017 | Bell et al. |
| 2017/0077765 A1 | 3/2017 | Bell et al. |
| 2017/0077979 A1 | 3/2017 | Papa et al. |
| 2017/0077995 A1 | 3/2017 | Leabman |
| 2017/0085120 A1 | 3/2017 | Leabman et al. |
| 2017/0085437 A1 | 3/2017 | Condeixa et al. |
| 2017/0092115 A1 | 3/2017 | Sloo et al. |
| 2017/0110886 A1 | 4/2017 | Reynolds et al. |
| 2017/0110910 A1 | 4/2017 | Zeine et al. |
| 2017/0127196 A1 | 5/2017 | Blum et al. |
| 2017/0134686 A9 | 5/2017 | Leabman |
| 2017/0141582 A1 | 5/2017 | Adolf et al. |
| 2017/0141583 A1 | 5/2017 | Adolf et al. |
| 2017/0163076 A1 | 6/2017 | Park et al. |
| 2017/0168595 A1 | 6/2017 | Sakaguchi et al. |
| 2017/0179763 A9 | 6/2017 | Leabman |
| 2017/0214422 A1 | 7/2017 | Na et al. |
| 2017/0274787 A1 | 9/2017 | Salter et al. |
| 2017/0338695 A1 | 11/2017 | Port |
| 2018/0006611 A1 | 1/2018 | De Jong et al. |
| 2018/0040929 A1 | 2/2018 | Chappelle |
| 2018/0048178 A1 | 2/2018 | Leabman |
| 2018/0072313 A1* | 3/2018 | Stenneth ............... G01S 17/89 |
| 2018/0090992 A1 | 3/2018 | Shrivastava et al. |
| 2018/0107440 A1* | 4/2018 | Knoppert ............... G06F 3/147 |
| 2018/0115197 A1* | 4/2018 | Li ............... H02J 50/60 |
| 2018/0226840 A1 | 8/2018 | Leabman |
| 2018/0227018 A1 | 8/2018 | Moshfeghi |
| 2018/0241255 A1 | 8/2018 | Leabman |
| 2018/0262050 A1 | 9/2018 | Yankowitz |
| 2018/0262060 A1 | 9/2018 | Johnston |
| 2018/0269715 A1 | 9/2018 | Hannigan et al. |
| 2018/0301934 A1 | 10/2018 | Prabhala et al. |
| 2018/0309314 A1 | 10/2018 | White et al. |
| 2018/0343040 A1 | 11/2018 | Luzinski et al. |
| 2018/0375368 A1 | 12/2018 | Leabman et al. |
| 2018/0376235 A1 | 12/2018 | Leabman |
| 2019/0052979 A1 | 2/2019 | Chen et al. |
| 2019/0074728 A1 | 3/2019 | Leabman |
| 2019/0074862 A1 | 3/2019 | Wang et al. |
| 2019/0131827 A1 | 5/2019 | Johnston |
| 2019/0288567 A1 | 9/2019 | Leabman et al. |
| 2019/0296586 A1 | 9/2019 | Moshfeghi |
| 2019/0326782 A1 | 10/2019 | Graham et al. |
| 2019/0372384 A1 | 12/2019 | Hosseini et al. |
| 2019/0377814 A1* | 12/2019 | Shtrom ............... G06N 5/046 |
| 2019/0386523 A1 | 12/2019 | Park et al. |
| 2019/0393729 A1 | 12/2019 | Contopanagos et al. |
| 2019/0393928 A1 | 12/2019 | Leabman |
| 2020/0006988 A1 | 1/2020 | Leabman |
| 2020/0021128 A1 | 1/2020 | Bell et al. |
| 2020/0091608 A1 | 3/2020 | Alpman et al. |
| 2020/0112204 A1 | 4/2020 | Hosseini et al. |
| 2020/0153117 A1 | 5/2020 | Papio-Toda et al. |
| 2020/0203837 A1 | 6/2020 | Kornaros et al. |
| 2020/0235614 A1 | 7/2020 | Swan et al. |
| 2020/0244104 A1 | 7/2020 | Katajamaki et al. |
| 2020/0244111 A1 | 7/2020 | Johnston et al. |
| 2020/0274397 A1 | 8/2020 | Hwang et al. |
| 2020/0293116 A1* | 9/2020 | Udall ............... G06V 10/147 |
| 2020/0403453 A1* | 12/2020 | Sherman ............... H04B 7/0617 |
| 2021/0124078 A1* | 4/2021 | Widmer ............... G06F 18/217 |
| 2021/0135505 A1* | 5/2021 | Pan ............... H02J 50/60 |
| 2021/0406358 A1* | 12/2021 | Atkinson ............... G06F 21/44 |
| 2022/0052560 A1* | 2/2022 | Zeine ............... H02J 50/90 |
| 2022/0171045 A1* | 6/2022 | Johnston ............... H02J 50/60 |
| 2022/0357801 A1* | 11/2022 | Udall ............... G06V 40/20 |
| 2022/0376556 A1* | 11/2022 | Zeine ............... H02J 50/20 |

FOREIGN PATENT DOCUMENTS

| | | |
|---|---|---|
| CN | 102292896 A | 12/2011 |
| CN | 102860037 A | 1/2013 |

(56) References Cited

FOREIGN PATENT DOCUMENTS

| | | | |
|---|---|---|---|
| CN | 103151848 A | 6/2013 |
| CN | 103348563 A | 10/2013 |
| CN | 203826555 U | 9/2014 |
| CN | 104090265 A | 10/2014 |
| CN | 104167773 A | 11/2014 |
| CN | 104347915 A | 2/2015 |
| CN | 105765821 A | 7/2016 |
| CN | 106329116 A | 1/2017 |
| CN | 103380561 B | 9/2017 |
| DE | 20016655 U1 | 2/2002 |
| DE | 102013216953 A1 | 2/2015 |
| EP | 1028482 A2 | 8/2000 |
| EP | 1081506 A1 | 3/2001 |
| EP | 2346136 A1 | 7/2011 |
| EP | 2397973 A1 | 2/2012 |
| EP | 2545635 A2 | 1/2013 |
| EP | 2747195 A1 | 6/2014 |
| EP | 3067983 A1 | 9/2016 |
| EP | 3118970 A1 | 1/2017 |
| EP | 3145052 A1 | 3/2017 |
| GB | 2404497 A | 2/2005 |
| GB | 2556620 A | 6/2018 |
| JP | 2000323916 A | 11/2000 |
| JP | 2002319816 A | 10/2002 |
| JP | 2006157586 A | 6/2006 |
| JP | 2007043432 A | 2/2007 |
| JP | 2008167017 A | 7/2008 |
| JP | 2009525715 A | 7/2009 |
| JP | 2009201328 A | 9/2009 |
| JP | 2012016171 A | 1/2012 |
| JP | 2012095226 A | 5/2012 |
| JP | 2012157167 A | 8/2012 |
| JP | 2013099249 A | 5/2013 |
| JP | 2013162624 A | 8/2013 |
| JP | 2014075927 A | 4/2014 |
| JP | 2014112063 A | 6/2014 |
| JP | 2014176131 A | 9/2014 |
| JP | 2015027345 A | 2/2015 |
| JP | 2015128349 A | 7/2015 |
| JP | 2015128370 A | 7/2015 |
| JP | WO2015177859 A1 | 4/2017 |
| KR | 20060061776 A | 6/2006 |
| KR | 20070044302 A | 4/2007 |
| KR | 100755144 B1 | 9/2007 |
| KR | 20110132059 A | 12/2011 |
| KR | 20110135540 A1 | 12/2011 |
| KR | 20120009843 A | 2/2012 |
| KR | 20120108759 A | 10/2012 |
| KR | 20130026977 A | 3/2013 |
| KR | 20140023409 A | 2/2014 |
| KR | 20140023410 A | 3/2014 |
| KR | 20140085200 A | 7/2014 |
| KR | 20140148270 A | 12/2014 |
| KR | 20150077678 A | 7/2015 |
| RU | 2658332 C1 | 6/2018 |
| WO | WO 199508125 A1 | 3/1995 |
| WO | WO 199831070 A1 | 7/1998 |
| WO | WO 199952173 A1 | 10/1999 |
| WO | WO 2000111716 A1 | 2/2001 |
| WO | WO 2003091943 A1 | 11/2003 |
| WO | WO 2004077550 A1 | 9/2004 |
| WO | WO 2006122783 A2 | 11/2006 |
| WO | WO 2007070571 A2 | 6/2007 |
| WO | WO 2008024993 A2 | 2/2008 |
| WO | WO 2008156571 A2 | 12/2008 |
| WO | WO 2010022181 A1 | 2/2010 |
| WO | WO 2010039246 A1 | 4/2010 |
| WO | WO 2010138994 A1 | 12/2010 |
| WO | WO 2011112022 A2 | 9/2011 |
| WO | WO 2012177283 A1 | 12/2012 |
| WO | WO 2013031988 A1 | 3/2013 |
| WO | WO 2013035190 A1 | 3/2013 |
| WO | WO 2013038074 A2 | 3/2013 |
| WO | WO 2013042399 A1 | 3/2013 |
| WO | WO 2013052950 A1 | 4/2013 |
| WO | WO 2013105920 A2 | 7/2013 |
| WO | WO 2013175596 A1 | 11/2013 |
| WO | WO 2014068992 A1 | 5/2014 |
| WO | WO 2014075103 A1 | 5/2014 |
| WO | WO 2014113093 A1 | 7/2014 |
| WO | WO 2014132258 A1 | 9/2014 |
| WO | WO 2014134996 A1 | 9/2014 |
| WO | WO 2014182788 A2 | 11/2014 |
| WO | WO 2014182788 A3 | 11/2014 |
| WO | WO 2014197472 A1 | 12/2014 |
| WO | WO 2014209587 A1 | 12/2014 |
| WO | WO 2015038773 A1 | 3/2015 |
| WO | WO 2015097809 A1 | 7/2015 |
| WO | WO 2015130902 A1 | 9/2015 |
| WO | WO 2015161323 A1 | 10/2015 |
| WO | WO 2016024869 A1 | 2/2016 |
| WO | WO 2016048512 A1 | 3/2016 |
| WO | WO 2016088261 A1 | 6/2016 |
| WO | WO 2016187357 A1 | 11/2016 |
| WO | WO 2017112942 A1 | 6/2017 |

OTHER PUBLICATIONS

Energous Corp., IPRP, PCT/US2014/040705, Dec. 8, 2015, 6 pgs.
Energous Corp., IPRP, PCT/US2014/045119, Jan. 12, 2016, 9 pgs.
Energous Corp., IPRP, PCT/US2014/048002, Feb. 12, 2015 8 pgs.
Energous Corp., IPRP, PCT/US2014/049669, Feb. 9, 2016, 8 pgs.
Energous Corp., IPRP, PCT/US2014/059317, Apr. 12, 2016, 10 pgs.
Energous Corp., IPRP, PCT/US2014/059340, Apr. 12, 2016, 11 pgs.
Energous Corp., IPRP, PCT/US2014/059871, Apr. 12, 2016, 9 pgs.
Energous Corp., IPRP, PCT/US2014/062661, May 3, 2016, 10 pgs.
Energous Corp., IPRP, PCT/US2014/068282, Jun. 7, 2016, 10 pgs.
Energous Corp., IPRP, PCT/US2014/068586, Jun. 14, 2016, 8 pgs.
Energous Corp., IPRP, PCT/US2015/067242, Jun. 27, 2017, 7 pgs.
Energous Corp., IPRP, PCT/US2015/067243, Jun. 27, 2017, 7 pgs.
Energous Corp., IPRP, PCT/US2015/067245, Jun. 27, 2017, 7 pgs.
Energous Corp., IPRP, PCT/US2015/067246, Jun. 27, 2017, 9 pgs.
Energous Corp., IPRP, PCT/US2015/067249, Jun. 27, 2017, 7 pgs.
Energous Corp., IPRP, PCT/US2015/067250, Mar. 30, 2016, 10 pgs.
Energous Corp., IPRP, PCT/US2015/067271, Jul. 4, 2017, 5 pgs.
Energous Corp., IPRP, PCT/US2015/067275, Jul. 4, 2017, 7 pgs.
Energous Corp., IPRP, PCT/US2015/067279, Jul. 4, 2017, 7 pgs.
Energous Corp., IPRP, PCT/US2015/067282, Jul. 4, 2017, 6 pgs.
Energous Corp., IPRP, PCT/US2015/067287, Jul. 4, 2017, 6 pgs.
Energous Corp., IPRP, PCT/US2015/067291, Jul. 4, 2017, 4 pgs.
Energous Corp., IPRP, PCT/US2015/067294, Jul. 4, 2017, 6 pgs.
Energous Corp., IPRP, PCT/US2015/067325, Jul. 4, 2017, 8 pgs.
Energous Corp., IPRP, PCT/US2015/067334, Jul. 4, 2017, 5 pgs.
Energous Corp., IPRP, PCT/US2016/068495, Jun. 26, 2018, 7 pgs.
Energous Corp., IPRP, PCT/US2016/068551, Jun. 26, 2018, 6 pgs.
Energous Corp., IPRP, PCT/US2016/068987, Jul. 3, 2018, 7 pgs.
Energous Corp., IPRP, PCT/US2016/068993, Jul. 3, 2018, 10 pgs.
Energous Corp., IPRP, PCT/US2017/046800, Feb. 12, 2019, 10 pgs.
Energous Corp., IPRP, PCT/US2017/065886, Jun. 18, 2019, 10 pgs.
Energous Corp., IPRP, PCT/US2018/012806, Jul. 9, 2019, 6 pgs.
Energous Corp., IPRP, PCT/US2018/025465, Oct. 1, 2019, 8 pgs.
Energous Corp., IPRP, PCT/US2018/031768, Nov. 12, 2019, 8 pgs.
Energous Corp., IPRP, PCT/US2018/031786, Apr. 14, 2020, 7 pgs.
Energous Corp., IPRP, PCT/US2018/039334, Dec. 24, 2019, 8 pgs.
Energous Corp., IPRP, PCT/US2018/051082, Mar. 17, 2020, 9 pgs.
Energous Corp., IPRP, PCT/US2018/058178, May 5, 2020, 7 pgs.
Energous Corp., IPRP, PCT/US2019/015820, Aug. 4, 2020, 7 pgs.
Energous Corp., IPRP, PCT/US2019/021817, Sep. 15, 2020, 7 pgs.
Energous Corp., IPRP, PCT/US2020/027409, Sep. 28, 2021, 7 pgs.
Energous Corp., ISRWO, PCT/US2014/037072, Sep. 12, 2014, 8 pgs.
Energous Corp., ISRWO, PCT/US2014/037109, Apr. 8, 2016, 12 pgs.
Energous Corp., ISRWO, PCT/US2014/037170, Sep. 15, 2014, 11 pgs.
Energous Corp., ISRWO, PCT/US2014/040648, Oct. 10, 2014, 11 pgs.

(56) References Cited

OTHER PUBLICATIONS

Energous Corp., ISRWO, PCT/US2014/040697, Oct. 1, 2014, 12 pgs.
Energous Corp., ISRWO, PCT/US2014/040705, Sep. 23, 2014, 8 pgs.
Energous Corp., ISRWO, PCT/US2014/041323, Oct. 1, 2014, 10 pgs.
Energous Corp., ISRWO, PCT/US2014/041342, Jan. 27, 2015, 10 pgs.
Energous Corp., ISRWO, PCT/US2014/041534, Oct. 13, 2014, 10 pgs.
Energous Corp., ISRWO, PCT/US2014/041546, Oct. 16, 2014, 12 pgs.
Energous Corp., ISRWO, PCT/US2014/041558, Oct. 10, 2014, 8 pgs.
Energous Corp., ISRWO, PCT/US2014/044810 Oct. 21, 2014, 12 pgs.
Energous Corp., ISRWO, PCT/US2014/045102, Oct. 28, 2014, 14 pgs.
Energous Corp., ISRWO, PCT/US2014/045119, Oct. 13, 2014, 11 pgs.
Energous Corp., ISRWO, PCT/US2014/045237, Oct. 13, 2014, 16 pgs.
Energous Corp., ISRWO, PCT/US2014/046941, Nov. 6, 2014, 11 pgs.
Energous Corp., ISRWO, PCT/US2014/046956, Nov. 12, 2014, 10 pgs.
Energous Corp., ISRWO, PCT/US2014/046961, Nov. 24, 2014, 16 pgs.
Energous Corp., ISRWO, PCT/US2014/047963, Nov. 7, 2014, 13 pgs.
Energous Corp., ISRWO, PCT/US2014/048002, Nov. 13, 2014, 11 pgs.
Energous Corp., ISRWO, PCT/US2014/049666, Nov. 10, 2014, 7 pgs.
Energous Corp., ISRWO, PCT/US2014/049669, Nov. 13, 2014, 10 pgs.
Energous Corp., ISRWO, PCT/US2014/049673, Nov. 18, 2014, 10 pgs.
Energous Corp., ISRWO, PCT/US2014/054891, Dec. 18, 2014, 12 pgs.
Energous Corp., ISRWO, PCT/US2014/054897, Feb. 17, 2015, 10 pgs.
Energous Corp., ISRWO, PCT/US2014/054953, Dec. 4, 2014, 7 pgs.
Energous Corp., ISRWO, PCT/US2014/055195, Dec. 22, 2014, 11 pgs.
Energous Corp., ISRWO, PCT/US2014/059317, Feb. 24, 2015, 13 pgs.
Energous Corp., ISRWO, PCT/US2014/059340, Jan. 15, 2015, 13 pgs.
Energous Corp., ISRWO, PCT/US2014/059871, Jan. 23, 2015, 12 pgs.
Energous Corp., ISRWO, PCT/US2014/062661, Jan. 27, 2015, 12 pgs.
Energous Corp., ISRWO, PCT/US2014/062672, Jan. 26, 2015, 11 pgs.
Energous Corp., ISRWO, PCT/US2014/062682, Feb. 12, 2015, 10 pgs.
Energous Corp., ISRWO, PCT/US2014/068282, Mar. 19, 2015, 13 pgs.
Energous Corp., ISRWO, PCT/US2014/068568, Mar. 20, 2015, 10 pgs.
Energous Corp., ISRWO, PCT/US2014/068586, Mar. 20, 2015, 11 pgs.
Energous Corp., ISRWO, PCT/US2015/067242, Mar. 16, 2016, 9 pgs.
Energous Corp., ISRWO, PCT/US2015/067243, Mar. 10, 2016, 11 pgs.
Energous Corp., ISRWO, PCT/US2015/067245, Mar. 17, 2016, 8 pgs.
Energous Corp., ISRWO, PCT/US2015/067246, May 11, 2016, 18 pgs.
Energous Corp., ISRWO, PCT/US2015/067249, Mar. 29, 2016, 8 pgs.
Energous Corp., ISRWO, PCT/US2015/067250, Mar. 30, 2016, 11 pgs.
Energous Corp., ISRWO, PCT/US2015/067271, Mar. 11, 2016, 6 pgs.
Energous Corp., ISRWO, PCT/US2015/067275, Mar. 3, 2016, 8 pgs.
Energous Corp., ISRWO, PCT/US2015/067279, Mar. 11, 2015, 13 pgs.
Energous Corp., ISRWO, PCT/US2015/067282, Jul. 5, 2016, 7 pgs.
Energous Corp., ISRWO, PCT/US2015/067287, Feb. 2, 2016, 8 pgs.
Energous Corp., ISRWO, PCT/US2015/067291, Mar. 4, 2016, 10 pgs.
Energous Corp., ISRWO, PCT/US2015/067294, Mar. 29, 2016, 7 pgs.
Energous Corp., ISRWO, PCT/US2015/067325, Mar. 10, 2016, 9 pgs.
Energous Corp., ISRWO, PCT/US2015/067334, Mar. 3, 2016, 6 pgs.
Energous Corp., ISRWO, PCT/US2016/068495, Mar. 30, 2017, 9 pgs.
Energous Corp., ISRWO, PCT/US2016/068498, May 17, 2017, 8 pgs.
Energous Corp., ISRWO, PCT/US2016/068504, Mar. 30, 2017, 8 pgs.
Energous Corp., ISRWO, PCT/US2016/068551, Mar. 17, 2017, 8 pgs.
Energous Corp., ISRWO, PCT/US2016/068565, Mar. 8, 2017, 11 pgs.
Energous Corp., ISRWO, PCT/US2016/068987, May 8, 2017, 10 pgs.
Energous Corp., ISRWO, PCT/US2016/068993, Mar. 13, 2017, 12 pgs.
Energous Corp., ISRWO, PCT/US2016/069313, Nov. 13, 2017, 10 pgs.
Energous Corp., ISRWO, PCT/US2016/069316, Mar. 16, 2017, 15 pgs.
Energous Corp., ISRWO, PCT/US2017/046800, Sep. 11, 2017, 13 pgs.
Energous Corp., ISRWO, PCT/US2017/065886, Apr. 6, 2018, 13 pgs.
Energous Corp., ISRWO, PCT/US2018/012806, Mar. 23, 2018, 9 pgs.
Energous Corp., ISRWO, PCT/US2018/025465, Jun. 22, 2018, 9 pgs.
Energous Corp., ISRWO, PCT/US2018/031768, Jul. 3, 2018, 9 pgs.
Energous Corp., ISRWO, PCT/US2018/031786, Aug. 8, 2018, 9 pgs.
Energous Corp., ISRWO, PCT/US2018/039334, Sep. 11, 2018, 9 pgs.
Energous Corp., ISRWO, PCT/US2018/051082, Dec. 12, 2018, 9 pgs.
Energous Corp., ISRWO, PCT/US2018/058178, Mar. 13, 2019, 10 pgs.
Energous Corp., ISRWO, PCT/US2018/064289, Apr. 25, 2019, 12 pgs.
Energous Corp., ISRWO, PCT/US2019/015820, May 14, 2019, 9 pgs.
Energous Corp., ISRWO, PCT/US2019/021817, Apr. 6, 2019, 11 pgs.
Energous Corp., ISRWO, PCT/US2019/039014, Oct. 4, 2019, 15 pgs.
Energous Corp., ISRWO, PCT/US2019/061445, Jan. 7, 2020, 19 pgs.
Energous Corp., ISRWO, PCT/US2020/027409, Jul. 24, 2020, 11 pgs.

(56) References Cited

OTHER PUBLICATIONS

Energous Corp., ISRWO, PCT/US2020/067566, Apr. 27, 2021, 12 pgs.
Order Granting Reexamination Request, U.S. Appl. No. 90/013,793 Aug. 31, 2016, 23 pgs.
*Ossia Inc.* vs *Energous Corp.*, PGR2016-00023-Institution Decision, Nov. 29, 2016, 29 pgs.
*Ossia Inc.* vs *Energous Corp.*, PGR2016-00024-Institution Decision, Nov. 29, 2016, 50 pgs.
*Ossia Inc.* vs *Energous Corp.*, PGR2016-00024-Judgement-Adverse, Jan. 20, 2017, 3 pgs.
Notice of Intent to Issue Reexam Certificate: U.S. Appl. No. 90/013,793 Feb. 2, 2017, 8 pgs.
*Ossia Inc.* vs *Energous Corp.*, Declaration of Stephen B. Heppe in Support of Petition for Post-Grant Review of U.S. Pat. No. 9,124,125, PGR2016-00024, May 31, 2016, 122 pgs.
*Ossia Inc.* vs *Energous Corp.*, Petition for Post-Grant Review of U.S. Pat. No. 9,124,125, May 31, 2016, 92 pgs.
*Ossia Inc.* vs *Energous Corp.*, Patent Owner Preliminary Response, Sep. 8, 2016, 95 pgs.
*Ossia Inc.* vs *Energous Corp.*, Petition for Post Grant Review of U.S. Pat. No. 9,124,125, May 31, 2016, 86 pgs.
*Ossia Inc.* vs *Energous Corp.*, Declaration of Stephen B. Heppe in Support of Petition for Post-Grant Review of U.S. Pat. No. 9,124,125, PGR2016-00023, May 31, 2016, 144 pgs.
Adamiuk et al., "Compact, Dual-Polarized UWB-Antanna, Embedded in a Dielectric," IEEE Transactions on Antenna and Propagation, IEEE Service Center, Piscataway, NJ, US vol. 56, No. 2, Feb. 1, 2010, 8 pgs.
Gill et al., "A System for Change Detection and Human Recognition in Voxel Space using the Microsoft Kinect Sensor," 2011 IEEE Applied Imagery Pattern Recognition Workshop. 8 pgs.
Han et al., Enhanced Computer Vision with Microsoft Kinect Sensor: a Review, IEEE Transactions on Cybernetics vol. 43, No. 5., pp. 1318-1334, Oct. 3, 2013.
Hsieh et al., "Development of a Retrodirective Wireless Microwave Power Transmission System", IEEE, 2003, pp. 393-396.
Leabman, "Adaptive Band-partitioning for Interference Cancellation in Communication System," Thesis Massachusetts Institute of Technology, Feb. 1997, pp. 1-70.
Li et al., "High-Efficiency Switching-Mode Charger System Design Considerations with Dynamic Power Path Management," Mar./Apr. 2012 Issue, 8 pgs.
Mao et al., "BeamStar: An Edge-Based Approach to Routing in Wireless Sensors Networks", IEEE Transactions on Mobile Computing, IEEE Service Center, Los Alamitos, CA, vol. 6, No. 11, Nov. 1, 2007, 13 pgs.
Mascarenas et al., "Experimental Studies of Using Wireless Energy Transmission for Powering Embedded Sensor Nodes," Nov. 28, 2009, Journal of Sound and Vibration, 13 pgs.
Mishra et al., "SIW-based Slot Array Antenna and Power Management Circuit for Wireless Energy Harvesting Applications", IEEE Apsursi, Jul. 2012, 2 pgs.
Nenzi et al., "U-Helix: On-Chip Short Conical Antenna", 7th European Conference on Antennas and Propagation (EUCAP), ISBN: 978-1-4673-2187-7, IEEE, Apr. 8, 2013, 5 pgs.
Qing et al., "UHF Near-Field Segmented Loop Antennas with Enlarged Interrogation Zone," 2012 IEEE International Workshop on Antenna Technology (iWAT), Mar. 1, 2012, pp. 132-135, XP055572059, ISBN: 978-1-4673-0035-3.
Singh, "Wireless Power Transfer Using Metamaterial Bonded Microstrip Antenna for Smart Grid WSN", 4th International Conference on Advances in Computing and Communications (ICACC), Aug. 27-29, 2014, 1 pg.
Smolders, "Broadband Microstrip Array Antennas", Institute of Electrical and Electronics Engineers, Digest of the Antennas and Propagation Society International Symposium, Seattle, WA, Jun. 19-24, 1994, 3 pgs.
Van Veen et al., "Beamforming: a Versatile Approach to Spatial Filtering", IEEE, ASSP Magazine, Apr. 1988, pp. 4-24.
Wei et al., "Design of a Wideband Horizontally Polarized Omnidirectional Printed Loop Antenna," IEEE Antennas and Wireless Propagation Letters, vol. 11, Jan. 3, 2012, 4 pgs.
Zeng et al., "A Compact Fractal Loop Rectenna for RF Energy Harvesting," IEEE Antennas and Wireless Propagation Letters, vol. 16, Jun. 26, 2017, 4 pgs.
Zhai et al., "A Practical Wireless Charging System Based On Ultra-Wideband Retro-Reflective Beamforming" 2010 IEEE Antennas and Propagation Society International Symposium, Toronto, ON, 2010, 4 pgs.
Energous Corp., IPRP, PCT/US2020/067566, Jul. 5, 2022, 8 pgs.
Energous Corp., ISRWO, PCT/US2021/061430, Apr. 6, 2022, 10 pgs.
Extended European Search Report, EP20909157.8, Sep. 15, 2023, 9 pgs.
Energous Corporation, Extended European Search Report, EP Patent Application No. 21901394.3, Oct. 14, 2024, 8 pgs.

\* cited by examiner

1100

1102
Receive, from a first sensor of the at least two sensors, first sensor data indicating presence of an object within a keep-out zone of the transmission field of the wireless-power transmission system

1104
In response to the receiving, classify using second sensor data from a second sensor distinct from the first sensor the object as a sensitive object

1106
The sensitive object is a human hand and the other sensitive object is also a human hand

1108
While continuing to detect presence of the sensitive object within the keep-out zone, forgo providing an instruction to the power amplifier to amplify the RF signal

1110
While continuing to detect presence of the sensitive object within the keep-out zone, the electronic device that requires charging is also present within the transmission field

1112
In accordance with a first determination that the sensitive object is no longer within the keep-out zone, determine whether an electronic device that requires charging is within the transmission field

1114
The first determination includes determining that the sensitive object is no longer within the keep-out zone but is still within the transmission field

1116
In accordance with a second determination that the electronic device that requires charging is within the transmission field, instruct the power amplifier to amplify the RF signal to cause the one or more antennas to radiate RF energy focused near the electronic device that requires charging

1118
The instruction to the power amplifier to cease amplifying the RF signal is provided within a predetermined amount of time of detecting the second classified object (A)

1120-a
While radiating the RF energy focused near the electronic device, receive, from the first sensor of the at least two sensors, additional sensor data from the first sensor indicating presence of another object within the keep-out zone of the transmission field of the wireless-power transmission system

1120-b
In response to the receiving, classify using additional sensor data from the second sensor the other object as a second classified object

1120-c
In accordance with a third determination that the second classified object is another sensitive object, instruct the power amplifier to cease amplifying the RF signal while the presence of the other sensitive object is detected within the keep-out zone

1122-a
The first sensor data indicates presence of at least two objects within the keep-out zone of the transmission field of the wireless-power transmission system

1122-b
Determine a number of objects within the keep-out zone based on the first sensor data

1124-a
Classify using the second sensor data from the second sensor distinct from the first sensor, each object within the keep-out zone

1124-a
In accordance with a fifth determination that at least one classified object is a sensitive object, instruct the power amplifier to cease amplifying the RF signal while the presence of the other sensitive object is detected within the keep-out zone

1126
The one or more integrated circuits are further configured to discard data from the first sensor indicating presence of a non-moving target that has remained in the keep-out zone for a predetermined period of time

1128
Discard data from the first sensor indicating presence of objects that are outside of the keep-out zone

Figure 11B

1200 (cont.) 

1214 (cont.)

1216
The one or more safety thresholds include a maximum specific absorption rate (SAR) value of not greater than 2 W/kg, and the determination that transmitting the RF signal would satisfy the one or more safety thresholds is made when it is determined that transmitting the RF signal would create a maximum SAR value of not greater than 2 W/kg at the wireless-power receiver

1218
The one or more safety thresholds include a maximum specific absorption rate (SAR) value of not greater than .8 W/kg, and the determination that transmitting the RF signal would satisfy the one or more safety thresholds is made when it is determined that transmitting the RF signal would create a maximum SAR value of not greater than .8 W/kg at the wireless-power receiver

1220
The one or more safety thresholds include a predetermined roll-off of 3 dB at a predetermined distance increment relative to a peak amount of RF energy produced by radiated RF energy, and the determination that transmitting the RF signal would satisfy the one or more safety thresholds is made when it is determined that transmitting the RF signal would create a peak amount of RF energy at the wireless-power receiver that has the predetermined roll-off of 3 dB for each predetermined distance increment relative to the peak amount of RF energy

1222
The predetermined distance increment is about 8 cm

1224
The wireless-power transmitter device includes only a single power amplifier and the one or more antennas include only a single antenna

1226-a
Determine an operational impedance at the power amplifier based on an impedance measurement from among multiple measurement points of the power amplifier

1226-b
The one or more safety thresholds include impedance thresholds indicating that the operational impedance is at a safe level, and the determination that transmitting the RF signal will satisfy the one or more safety thresholds is made when it is predicted that using the power level to amplify the RF signal would keep the operational impedance at the power amplifier within the impedance thresholds

1228-a
Receive an impedance measurement from among the multiple measurement points of the power amplifier

1228-b
Utilize the impedance measurement to retrieve information for stored measurement values for two or more parametric parameters, the stored measurement values for the two or more parametric parameters indicating that the operational impedance is a safe operational impedance for the power amplifier

1228-c
Select the power level upon determining that the operational impedance is a safe operational impedance for the power amplifier

1230-a
Receive an impedance measurement from among multiple measurement points of the power amplifier

1230-b
Utilize the impedance measurement to retrieve information for stored measurement values for two or more parametric parameters, the stored measurement values for the two or more parametric parameters indicating that the operational impedance is a safe operational impedance for the power amplifier

1230-c
Determine a dissipation level corresponding to the retrieved information

1230-d
Decrease the power level upon determining that the dissipation level is above a dissipation threshold

1232
The power level is dynamically determined based on stored data retrieved from one or more data structures while the RF energy is focused within an operating area that includes the wireless-power receiver, and the system does not use any active beamforming control

Figure 12C

1200 (cont.) 

1234-a
Receive, from a first set of sensors of the at least two sensors, sensor data indicating presence of an object is within a predetermined boundary of the transmission field of the wireless-power transmitter device

1234-b
In response to the indication of a presence of an object within the predetermined boundary, receive, from a second set of sensors of the at least two sensors, sensor data indicating the type of object within the predetermined boundary of the transmission field of the wireless-power transmitter device

1234-c
In response to the sensor data indicating the type of object within the predetermined boundary of the transmission field is a first type of object, enable the one or more antennas to radiate the RF energy

1234-d
In response to the sensor data indicating the type of object within the predetermined boundary of the transmission field is a second type of object, cause the one or more antennas to cease radiating the RF energy

1236
The first type of objected is a wireless-power receiver

1238
The second type of objected is a sensitive object

1240-a
Receive the indication that the wireless-power receiver is located within one meter of the wireless-power transmitter device and is authorized to receive wireless charging from the wireless-power transmitter device, and selecting the power level at which to generate the RF signal are performed at a first integrated circuit

1240-b
Control and managing one or more operations of the power amplifier including instructing the power amplifier to amplify the RF signal are performed at a second integrated circuit

1242
Determine an operational impedance at the power amplifier is performed at the second integrated circuit

1244-a
Receive charging information from the wireless-power receiver

1244-b
Select the power level from among the plurality of available power levels based, at least in part, on the charging information from the wireless-power receiver.

1302
Receive impedance measurements at a plurality of measurement points of the power amplifier and data from one or more sensors, the plurality of measurement points allowing measurements of at least an impedance measurement at each respective measurement point

1304
The impedance measurements at the plurality of measurement points include one or more of Voltage at an output of the power amplifier, voltages at points inside a matching network, voltage at a drain of a transistors of the power amplifier, a DC current and voltage consumed by each stage of the power amplifier, and thermistors at different stages of the power amplifier

1306
The plurality of measurement points are measured at multiple output power levels of the power amplifier

1308
The power amplifier includes a thermistor that measures temperature

1310
The thermistor is on a same chip as other components of the power amplifier

1312
Detect presence of a foreign object within 6 inches of the wireless-power transmitter device based on the received impedance measurements and the data from the one or more sensors, and adjusting radiated radio frequency (RF) energy that is focused within an transmission field that includes a wireless-power receiver while the presence of the foreign object is detected

1314
Detect absence of the foreign object within the 6 inches of the wireless-power transmitter device based on the received impedance measurements and the data from one or more sensors (or lack thereof), and causing the radiation of the RF energy focused within an transmission field that includes the wireless-power receiver upon determining that the foreign object is absent (A)

1328
Synchronize shut-down of various components of the power amplifier

1330
The power amplifier includes a single digital input pin and the one or more integrated circuits are configured to synchronize shut-down of various components of the power amplifier via the single digital input pin

1332
Adjust output power and bias conditions of the power amplifier to maintain optimum efficiency and output power

1334
The power amplifier is a GaN (Gallium Nitride) power amplifier

1336
The power amplifier is a Class E amplifier

Figure 13C

SYSTEMS AND METHODS FOR USING ONE OR MORE SENSORS TO DETECT AND CLASSIFY OBJECTS IN A KEEP-OUT ZONE OF A WIRELESS-POWER TRANSMISSION FIELD, AND ANTENNAS WITH INTEGRATED SENSOR ARRANGEMENTS

RELATED APPLICATION

This application claims priority to U.S. Provisional Patent Application No. 63/120,184, filed Dec. 1, 2020, entitled "Systems and Methods for Using One or More Sensors to Detect and Classify Objects in A Keep-Out Zone of a Wireless-Power Transmission Field, and Antennas with Integrated Sensor Arrangements," which is hereby incorporated by reference in its entirety.

TECHNICAL FIELD

The present disclosure relates generally to systems for wireless-power transmission, and more particularly to using one or more sensors (e.g., two sensors including a ranging sensor and an object-classification sensor or one sensor configured to assist with ranging and object-classification functions) to detect and classify objects in a keep-out zone of a wireless-power transmission field in a wireless charging system, and antennas with integrated sensor arrangements used for wirelessly transmitting energy at a near-field (NF) or NF+ distance without using beam-forming control.

BACKGROUND

Wireless charging systems for consumer devices typically require complicated, and often, expensive components to transmit and receive wirelessly delivered power. Conventionally, it is difficult for a wireless power transmitter to accurately distinguish a valid wireless power receiver that needs to be charged from a foreign objects, or living or biological organism (e.g., human) that can be harmed by wirelessly delivered power. It is also challenging to develop sensor arrangements to both detect and classify objects within a wireless-power transmission field. Users have encountered numerous frustrating issues with some conventional charging devices, including having damage caused to objects that include magnetic strips and/or RFID chips (e.g., credits cards, security badges, passports, key fobs, and the like). Moreover, conventional systems interrupt or terminate charging whenever foreign objects, or living or biological organism are present. This results in a frustrating experience for many users as they experience interruptions to the charging of their devices, and may further end up with damage to important objects that they use on a daily basis. Furthermore, conventional wireless charging systems do not utilize a dedicated power amplifier controller integrated circuit, let alone one capable of assisting with the classification and detection of foreign objects (which can include living or biological organisms).

To create focused energy in wirelessly transmitting power over a distance, many existing solutions use beam-forming, e.g., controlling phase and other waveform characteristics to produce constructive and/or destructive interference patterns to focus power beams onto a device at a certain location. Beam-forming typically requires multiple antennas, beam-forming algorithm control circuitry and/or algorithms, and multiple power amplifiers, all of which add complexity to the system, and add to overall system costs.

As such, it would be desirable to provide systems and methods for wirelessly transmitting and receiving power that address the above-mentioned drawbacks.

SUMMARY

The wireless-power transmission system described herein makes it possible to use one or more sensors to detect and classify objects in a keep-out zone of a wireless-power transmission field (e.g., two sensors including a ranging sensor and an object-classification sensor or one sensor, such as the capacitive sensor integrated with an antenna that is described herein, configured to assist with ranging and object-classification functions), and also makes it possible to produce antennas with integrated sensor arrangements. In some embodiments, the system utilizes a first type of sensor to detect objects within the keep-out zone and utilizes a second type (different from the first type) of sensor to classify those objects in accordance with the techniques described herein. In other embodiments, a single sensor can be configured to assist with both ranging (e.g., detecting objects within the keep-out zone) and object-classification functions (e.g., using data from the single sensor to classify objects as particular types of objects. In this way, for example, the system is able to detect a user's hand entering the keep-out zone with a device to-be-charged and avoid initiating wireless charging of that device until it is determined that the user's hand has exited the keep-out zone. Thus, the techniques described herein help to ensure safe transmissions of wireless power.

The wireless-power transmission system described herein additionally makes it possible to control a radiation profile using only a single power amplifier continuously during the charging operation to maintain a power level within the transmission field that is controlled to remain within a safe threshold for human beings (and other potentially sensitive objects), thereby addressing some of the problems identified above. The presence of a foreign object can also be detected (e.g., when near and/or on a charging surface, and/or at greater distances with data from one or more sensors) and the power amplifier controller can be used to help disable, enable, or adjust a radiation profile to ensure the system is operating safely (both to protect human users and other sensitive objects).

The compact, and cost-efficient, design of the wireless-power transmission system disclosed herein includes a power amplifier (e.g., in some embodiments only a single power amplifier that feeds a single antenna) that is enabled and disabled based on information from one or more sensors (e.g., capacitive sensors time-of-flight sensors (e.g., ultrasonic time-of-flight sensors etc.), impedance measurements, and/or from information received from wireless-power receivers via an out-of-band BLE link (or other communication protocol). In some embodiments, the wireless-power transmission system disclosed herein eliminates the need to use a complicated beam-forming system (e.g., even if beam-forming control is available, the system does not need to use it to produce controlled delivery of wirelessly-transmitted energy) that requires additional bulky electronic components, and multiple expensive power amplifiers to control/feed multiple antennas.

In some embodiments, the wireless-power transmission system disclosed herein includes multiple pairs of antennas and power amplifiers (only one power amplifier and one antenna in each pair). Each pair of antenna and power amplifier is responsible for a certain charging area, such that the pair of antenna and power amplifier controls charging to any receiver that is detected to be within the certain charging area, and this controlled charging is performed without using any beam-forming control. In some embodiments, the wireless-power transmission system includes only one power amplifier that feeds multiple antennas, in addition to, or as an alternative for, the system including multiple pairs of power amplifiers and antennas (e.g., by feeding different antennas using a single power amplifier, cost of the overall system is reduced, but the system is still able to assign antennas to various charging areas). In some other embodiments, the wireless-power transmission system disclosed herein includes multiple groups of antennas and power amplifiers (only one power amplifier and multiple antennas in each group). Each group of multiple antennas and power amplifier is responsible for a certain charging area, such that the group of multiple antennas and power amplifier controls charging to any receiver that is detected to be within the certain charging area, and this controlled charging is performed without using any beam-forming control. The antenna or antennas can support a fixed or programmable RF energy pattern (or profile) controlled via an RF algorithm at the transmitter that limits the power amplifier energy level, controls the RF energy pattern, and results in a charging area which is within the limits of regulatory requirements to meet E-field and SAR levels (for instance, in compliance with Part 15 or Part 18 of Federal Communications Commission (FCC) requirements).

Different embodiments of wireless-power transmitter device can include i) a single power amplifier and a single antenna, ii) a single power amplifier and two or more antennas, the power amplifier coupled to each antenna via one or more feeds, iii) a single power amplifier with two or more antennas, the power amplifier selectively coupled to an antenna via one or more switches, iv) a single power amplifier with two or more antennas, the power amplifier coupled to the antennas via one or more splitters, v) two or more power amplifiers and a single antenna, vi) two or more power amplifiers and two or more antenna, a single power amplifier coupled to a single antenna, vii) two or more power amplifiers and two or more antenna, the power amplifiers dynamically configured to couple with the antennas. Different combinations of the embodiments described above can be used. Each of the above-described embodiments include a power amplifier controller integrated circuit, as described herein, one or more sensors to perform the ranging and object-classification functions described herein, and/or other components to perform the methods described below.

In some embodiments, the wireless-power transmission system described herein includes a power amplifier controller integrated circuit for managing and controlling operation of the power amplifier. The power amplifier controller integrated circuit controls the power amplifier to provide an RF signal that, when provided to the one or more antennas, causes transmission of RF energy that does not harm humans, foreign objects, and/or the power amplifier. The power amplifier controller integrated circuit can be used to select enable or disable the transmission of RF energy. The power amplifier controller integrated circuit can receive data from one or more sensors to allow it to detect changes in impedance, classify a receiver, locate a receiver, classify a human and/or other living organism, and a number of other functions described below with reference to FIGS. 5A-7B.

The wireless-power transmission system disclosed herein includes the functionality of a Near Field Plus (NF+) system capable of delivering wireless-power over the air from a transmitter device to multiple receivers within a charging area (but not in direct contact with the transmitter device). The NF+ system is optimized/characterized for cost, performance, and regulatory compliance. An NF+ range, for purposes of the present disclosure, refers to the region around the transmitter device that is within approximately one and a half wavelengths or less (of a power wave to be transmitted by the transmitter device at a certain frequency). In some embodiments, the wireless-power transmission system described herein can be used in one or more of: near-field, NF+, mid-field, and far-field transmission applications. Near-field (NF) refers to the region around the transmission antenna that is within approximately one wavelength or less (of a power wave to be transmitted by the transmitter device at a certain frequency). Far-field refers to the region around the transmission antenna that is approximately two wavelengths or more (of a power wave to be transmitted by the transmitter device at a certain frequency). Mid-field refers to the region between near field and far field. For example, when the frequency of a transmission wave is 2.4 GHz, the NF+ range is equal or within around 0.188 m, the near-field range is equal or within around 0.125 m, the mid-field range is from around 0.125 m to around 0.25 m, and the far-field range is equal or greater than around 0.25 m. In another example, when the frequency of the transmission wave is 5 GHz, the NF+ range is equal or within around 0.09 m, the near-field range is equal or within around 0.06 m, the mid-field range is from around 0.06 m to around 0.12 m, and the far-field range is equal or greater than around 0.12 m.

In one example, references to near-field transmission refer to radiation of electromagnetic waves by an antenna (e.g., the loop antenna described herein) for distances up to approximately a wavelength of an operating frequency of the antenna (e.g., a wavelength of an operating frequency of 5.8 GHz is approximately 5.17 centimeters, so the near-field transmission distance of the antenna in this example would be approximately 5.17 centimeters). In some embodiments, the operating frequency ranges from 400 MHz to 60 GHz. For the purposes of the following description, a near-field power transmitter (or near-field radio-frequency power transmitter) is a wireless-power-transmitting device that includes one or more wireless-power transmitters, each of which is configured to radiate electromagnetic waves to receiver devices that are located within a near-field distance of the power transmitter (e.g., within 0-5.17 centimeters of the power transmitter, if the one or more wireless-power transmitters of the power transmitter are using an operating frequency of 5.8 GHz).

(A1) In accordance with some embodiments, a wireless-power transmission system includes at least two sensors of at least two different types, one or more antennas, a power amplifier configured to amplify a radio frequency (RF) signal that is provided to the one or more antennas, and one or more integrated circuits. The one or more antennas, upon receiving the amplified RF signal, are configured to radiate RF energy within a transmission field (e.g., 1 m) of the wireless-power transmission system. The one or more integrated circuits are configured to receive, from a first sensor of the at least two sensors, first sensor data indicating presence of an object within a keep-out zone (e.g., 20 cm) of the transmission field of the wireless-power transmission system. In response to the receiving, the one or more integrated circuits are configured to classify using second sensor data from a second sensor distinct from the first sensor the object as a sensitive object. While continuing to detect presence of the sensitive object within the keep-out zone, the one or more integrated circuits are configured to forgo providing an instruction to the power amplifier to amplify the RF signal. In accordance with a first determination that the sensitive object is no longer within the keep-out zone, the one or more integrated circuits are configured to determine whether an electronic device that requires charging is within the transmission field. In accordance with a second determination that the electronic device that requires charging is within the transmission field, the one or more integrated circuits are configured to instruct the power amplifier to amplify the RF signal to cause the one or more antennas to radiate RF energy focused near the electronic device that requires charging.

(A2) In some embodiments of A1, the one or more integrated circuits are further configured to, while radiating the RF energy focused near the electronic device, receive, from the first sensor of the at least two sensors, third sensor data indicating presence of another object within the keep-out zone of the transmission field of the wireless-power transmission system. In response to the receiving, the one or more integrated circuits are configured to classify using fourth sensor data from the second sensor the other object as another sensitive object. The one or more integrated circuits are then configured to instruct the power amplifier to cease amplifying the RF signal while the presence of the other sensitive object is detected within the keep-out zone.

(A3) In some embodiments of any of A1-A2, the sensitive object is a human hand and the other sensitive object is also a human hand.

(A4) In some embodiments of A2, the instruction to the power amplifier to cease amplifying the RF signal is provided within a predetermined amount of time of detecting the other sensitive object.

(A5) In some embodiments of any of A2 and A4, the predetermined amount of time is less than 150 milliseconds.

(A6) In some embodiments of any of A2 and A4-A5, the predetermined amount of time is less than 100 milliseconds.

(A7) In some embodiments of any of A2 and A4-A6, the predetermined amount of time is less than 50 milliseconds.

(A8) In some embodiments of any of A1-A7, while continuing to detect presence of the sensitive object within the keep-out zone, the electronic device that requires charging is also present within the transmission field.

(A9) In some embodiments of any of A1-A8, the transmission field includes an area of three-dimensional space that is greater than an area of three-dimensional space that is included in the keep-out zone.

(A10) In some embodiments of any of A1-A9, the first sensor is a ranging sensor configured to detect objects within the keep-out zone.

(A11) In some embodiments of A10, the first sensor is an ultrasonic sensor, an optical sensor, or an infrared sensor.

(A12) In some embodiments of any of A10-A11, the second sensor is a classification sensor configured to detect data used to classify objects as sensitive objects, and the second sensor is not able to perform accurate ranging within the keep-out zone.

(A13) In some embodiments of any of A1-A12, the second sensor is a capacitive sensor or a sensor configured to detect impedance changes at the wireless-power transmission system.

(A14) In some embodiments of any of A1-A13, the first sensor data indicates presence of at least two objects within the keep-out zone of the transmission field of the wireless-power transmission system, and the one or more integrated circuits are further configured to determine a number of objects within the keep-out zone based on the first sensor data. In some embodiments, the first and second sensor data is used together to help determine the number of objects within the keep-out zone.

(A15) In some embodiments of A14, the one or more integrated circuits are further configured to classify using the second sensor data from the second sensor, each object within the keep-out zone. In accordance with a fifth determination that at least one object detected based on the second sensor data is a sensitive object, the one or more integrated circuits are configured to instruct the power amplifier to cease amplifying the RF signal while the presence of the other sensitive object is detected within the keep-out zone.

(A16) In some embodiments of any of A1-A15, the first sensor is configured to detect one or more objects at least 20 cm away from an exterior housing of the wireless-power transmission system.

(A17) In some embodiments of any of A16, the transmission field of the wireless-power transmission system extends from the exterior housing of the wireless-power transmission system to a distance that is at least 1 m away from the exterior housing of the wireless-power transmission system.

(A18) In some embodiments of any of A1-17, the first determination is made while the sensitive object is no longer within the keep-out zone but is still within the transmission field.

(A19) In some embodiments of any of A1-A18, the one or more integrated circuits are further configured to discard data from the first sensor indicating presence of a non-moving target (e.g., a non-chargeable device, such as a cup, or a full charged device) that has remained in the keep-out zone for a predetermined period of time.

(A20) In some embodiments of any of A1-A19, the one or more integrated circuits are further configured to discard data from the first sensor indicating presence of objects that are outside of the keep-out zone. In other words, the first sensor in some circumstance is used only to detect presence of objects within the keep-out zone but is not used to detect objects that are outside of the keep-out zone.

(A21) In some embodiments of any of A1-A20, the one or more integrated circuits are configured to receive, from a single sensor of the at least two sensors, the first sensor data and the second sensor data. In response to the receiving, the one or more integrated circuits are configured to detect using the first sensor data from the single sensor, and classify, using the second sensor data from the single sensor, the object as a sensitive object. In other words, in some embodiments, the first sensor and the second sensor are the same sensor (such as the capacitive sensor that is integrated with an antenna, which is described in more detail below).

(A22) In accordance with some embodiments, a method includes receiving, from a first sensor of the at least two sensors, first sensor data indicating presence of an object within a keep-out zone of the transmission field of the wireless-power transmission system. The method includes, in response to the receiving, classifying using second sensor data from a second sensor distinct from the first sensor the object as a sensitive object. The method further includes, while continuing to detect presence of the sensitive object within the keep-out zone, forgoing providing an instruction to the power amplifier to amplify the RF signal. In accordance with a first determination that the sensitive object is no longer within the keep-out zone, the method includes determining whether an electronic device that requires charging is within the transmission field. In accordance with a second determination that the electronic device that requires charging is within the transmission field, the method includes instructing the power amplifier to amplify the RF signal to cause the one or more antennas to radiate RF energy focused near the electronic device that requires charging.

(A22.5) In some embodiments of A21, the method also includes operations in accordance with any of A2-A21 above.

(A23) In accordance with some embodiments, a non-transitory, computer-readable medium stores instructions that, when executed by a processor in a computer, cause the computer to perform operations including receiving, from a first sensor of the at least two sensors, first sensor data indicating presence of an object within a keep-out zone of the transmission field of the wireless-power transmission system. The method further including, in response to the receiving, classifying using second sensor data from a second sensor distinct from the first sensor the object as a sensitive object. While continuing to detect presence of the sensitive object within the keep-out zone, the method includes forgoing providing an instruction to the power amplifier to amplify the RF signal. In accordance with a first determination that the sensitive object is no longer within the keep-out zone, the method includes determining whether an electronic device that requires charging is within the transmission field. In accordance with a second determination that the electronic device that requires charging is within the transmission field, the method includes instructing the power amplifier to amplify the RF signal to cause the one or more antennas to radiate RF energy focused near the electronic device that requires charging.

(A23.5) In some embodiments of A23, the operations further include operations in accordance with any of A2-A21 above.

(B1) In accordance with some embodiments, a wireless-power-transmitting antenna includes a power amplifier configured to amplify a radio frequency (RF) signal that is provided to a signal feed, the signal feed configured to conduct a radio frequency (RF) signal. The wireless-power-transmitting antenna further includes a unitary resonator formed from a single piece of metal. The unitary resonator directly contacts the signal feed and is caused to radiate RF energy in a transmission field (e.g., a predetermined transmission field having a predetermined size and shape) based on the RF signal. The wireless-power-transmitting antenna also includes a spacer coupled between the unitary resonator and a ground plane; and the ground plane. The ground plane forms (or a portion of the ground plane includes or is coupled with) a capacitive sensor configured to detect one or more objects within the transmission field without interfering with the radiated RF energy.

(B2) In some embodiments of B1, the ground plane is a solid copper plane.

(B3) In some embodiments of any of B1-B2, a surface area of the ground plane operates as the capacitive sensor. In some embodiments, the wireless-power-transmitting antenna is configured to simultaneously radiate RF energy, while also operating the capacitive sensor, such that the antenna is able to perform two separate functions at a same time (wireless-power transmission and sensing of objects).

(B4) In some embodiments of any of B1-B3, the ground plane is a PCB that includes a top layer comprising at least two sections, and a bottom layer comprising a single section.

(B5) In some embodiments of B4, a first section of the at least two sections of the top layer is centrally located on the ground plane, and a second section of the at least two sections of the top layer is coplanar with and surrounding the first section such that a rectangle is formed between the first and second sections of the at least two sections of the top layer. The first section and the second section operate as conductive objects and the rectangle is a space between them that responds to a voltage difference applied to them (i.e., forming a sensor). In some embodiments, performance of the capacitive sensor formed on the ground plane is based on one or more of a size of the first section of the top layer, the rectangle of the top layer (i.e., the gap between the first section and the second section), a material of which the ground plane is made (e.g., copper), and a thickness of the material of which the ground plane is made (i.e., the PCB material and thickness).

(B6) In some embodiments of any of B1-B5, the top layer and the bottom layer are made of a copper material.

(B7) In some embodiments of any of B1-B6, one or more electrical components are coupled to a first surface of the ground plane, the first surface of the ground plane is positioned opposite to a second surface of the ground plane that is coupled to the spacer.

(B8) In some embodiments of any of B1-B7, the radiated RF energy has a peak gain of at least 6 dB while the capacitive sensor is in operation.

(B9) In some embodiments of any of B1-B8, the capacitive sensor is configured to detect one or more objects up to 15 in. away from the ground plane while the antenna is radiating the RF energy.

Note that the various embodiments described above can be combined with any other embodiments described herein. The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIGS. 11A-11B are flow diagrams illustrating a method of controlling and/or managing operation of a transmitter device, in accordance with some embodiments.

FIGS. 12A-12D are flow diagrams illustrating a method of wirelessly-transmitting energy to a receiver device without using active beam-forming control, in accordance with some embodiments.

FIGS. 13A-13C are flow diagrams illustrating a method of controlling and/or managing operation of one or more power amplifiers, in accordance with some embodiments.

Figure 1A:
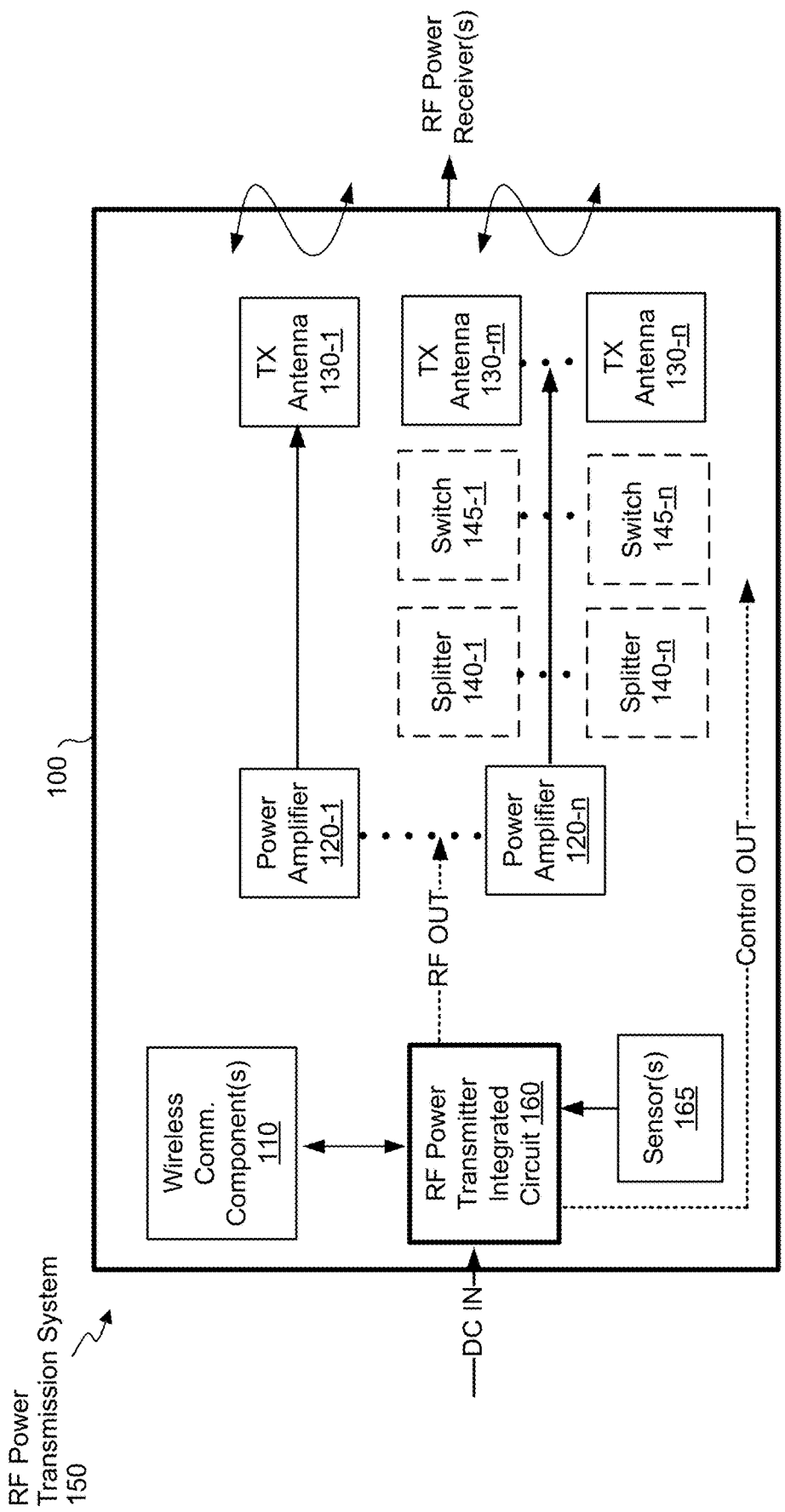
FIG. 1A is a block diagram of an RF wireless-power transmission system, in accordance with some embodiments.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

In some existing wireless-power charging systems using beam-forming, a pocket of energy can be formed at locations where power waves transmitted by a transmitter constructively interfere. The pockets of energy may manifest as a three-dimensional field where energy may be harvested by receivers located within or proximate to the pocket of energy. In operation, the pocket of energy produced by the transmitters during pocket-forming processes may be harvested by a receiver, converted to an electrical charge, and then provided to an electronic device (e.g., laptop computer, smartphone, rechargeable battery) associated with the receiver to operate the device or to charge the device's battery.

"Pocket-forming" may refer to generating one or more RF waves that converge in a transmission field, forming controlled pockets of energy and null spaces. A "pocket of energy" may refer to an area or region of space where energy or power may accumulate based on a convergence of waves causing constructive interference at that area or region. The "null-space" may refer to areas or regions of space where pockets of energy do not form, which may be caused by destructive interference of waves at that area or region.

The conventional use of beam-forming may require multiple antennas and multiple power amplifiers, and complex algorithms to effectively charge an electronic device coupled with a wireless-power receiver. That approach can require complicated and expensive equipment and processes. In contrast, the wireless-power transmission systems and methods disclosed herein may use a single power amplifier to control a power transmission level and profile of an antenna's radiated energy, while still keeping radiated power levels in the transmission range of the antenna within a safe level that also complies with various regulatory requirements. In this way, the inventive systems and methods described herein are able to use a minimal number of system components (e.g., a single power amplifier, and no beam-forming components, or is able to disable use of beam-forming components) to achieve safe transmission of wirelessly-delivered energy in both consumer and commercial environments.

A transmitter device can be an electronic device that includes, or is otherwise associated with, at least two sensors, or one sensor configured to provide data used to perform at least two different functions. In some embodiments, the at least two sensors are different types of sensors. A first type of sensor being configured for ranging detection (i.e., detecting objects at further distances), and a second type of sensor being configured to detect sensor data for object-classification (e.g. determining that an object is a sensitive object (e.g., living or biological organisms)). In some embodiments, the second type of sensor is activated after the first type of sensor detects an object in order to reduce the total amount of processing required. Alternatively, in some embodiments, the at least two sensors are the same type of sensors, but configured to operate differently. For example, the at least two sensors can be capacitive sensors with a first capacitive sensor being configured for ranging detection and a second capacitive sensor being configured for object classification. In some embodiments, the at least two sensors are the same type of sensors configured to switch between different operations. For example, the at least two sensors can be capacitive sensors with a first and second capacitive sensor being in a ranging detection mode (or being configured for ranging detection) and, upon detection of an object, switching (or reconfiguring) at least one capacitive sensor (e.g., the first or second capacitive sensor) to an object-classification mode. In some embodiments, at least the one or more sensors are used for improved safety, as well as for improved receiver detection and charging operations. In some embodiments, the at least one or more sensors work to reduce or eliminate false detections with improved overall sensor accuracy while also improving the overall safety of the transmitter (i.e., avoiding transmitting harmful power waves to sensitive objects). The different operations and arrangements of the at least two sensors are described in more detail below in reference to FIGS. 5A-7B.

The transmitter device can be an electronic device that includes, or is otherwise associated with, various components and circuits responsible for, e.g., generating and transmitting power waves, forming transmission energy within a radiation profile at locations in a transmission field, monitoring the conditions of the transmission field, and adjusting the radiation profile where needed. The radiation profile described herein refers to a distribution of energy field within the transmission range of a transmitter device or an individual antenna (also referred to as a "transmitter"). As was discussed above, various radiation profiles can be available to the transmitter device, where the various radiation profiles are predetermined based on simulation, characterization, and/or manufacture tests of the transmitter device to ensure that each radiation profile complies with e-field roll-off and SAR requirements.

The transmitter device may improve safety by detecting objects in its field of transmission, generate, and transmit, or otherwise adjust, transmitted RF power. More specifically, the transmitter device can detect wireless-power receivers and/or foreign objects within its transmission field and enable, disable, and/or adjust the transmission of usable energy. Safety techniques that can be utilized by the transmitter for detecting wireless-power receivers and/or foreign objects are described in more detail below. For example, the transmitter device may detect human intrusion while tolerating long-term wireless-power receiver-only intrusion within a keep-out zone. Multiple wireless-power receivers and/or multiple sensitive objects (e.g., living organisms such as a human hand) may be detected at a time.

In some embodiments, the wireless-power transmitter device is configured to produce its radiation profile within a transmission field (also referred to as an operating area). In some embodiments, the transmission field is directly in front of the transmitter and/or an area around the transmitter device in which power can be received by a wireless-power receiver above some minimum threshold (e.g., minimum power (e.g., approximately 2 W) to charge the wireless-power receiver, as described herein). In some embodiments, the transmission field is a function of i) the transmit power, ii) the transmit antenna radiation profile (as described above), the receiver antenna reception pattern (e.g., receiver of the wireless-power receiver), and the wireless-power receiver power conversion efficiency. In some embodiments, the transmission field is further a function of tabletop material and/or RF channel properties. The transmission field is described in detail below in reference to, e.g., FIGS. 5A-5C and 6A-6C.

In some embodiments, the wireless-power transmitter device includes a keep-out zone, which is an area of space that is smaller in size than the transmission field described above. In some embodiments, the keep-out zone is an area around the transmitter device in which one or more safety thresholds will not be satisfied (as described below). In some embodiments, the keep out zone is an area around the transmitter device in which, at a minimum, SAR values (e.g., calculated and/or predetermined by simulation, characterization, and/or manufacture tests) are above a predetermined SAR threshold. In some embodiments, the keep-out zone is a function of the transmit power, and/or the transmit antenna radiation profile (as described above). In some embodiments, the keep-out zone is further a function of tabletop material and/or RF channel properties, and can also be a function of the size of the transmission field (e.g., a certain percentage of the transmission field that is closest to an exterior housing of the transmitting device). The keep out zone is described in detail below in reference to FIGS. 5A-5C and 6A-6C.

In some embodiments, the wireless-power transmitter device is a Near Field charging pad. In some embodiments, the Near Field charging pad, is configured to initiate wireless charging once a receiver and/or foreign object is in physical contact with the wireless-power transmitter device. In some embodiments, measurements of the antenna (e.g., when the antenna is unloaded/open, or with ideal coupling alignment) are obtained from factory manufacture tests, simulations, and/or characterization. In some embodiments, the Near Field charging pad is calibrated at a factory with the wireless-power transmission system and/or methods disclosed herein. In some embodiments, the wireless-power transmission system and/or methods are further calibrated to operate with one or more antennas installed in the Near Field charging pad. In other words, in some embodiments, the radiation profile, SAR values, data (e.g., impedance values) from one or more measurement points, operational scenarios for the Near Field charging pad, and/or other Near Field charging pad configurations are determined at a factory and stored in memory for use during operation. For example, nominal impedance within tolerances for the Near Field charging pad can be measured during factory calibration and stored. In some embodiments, during operation, a receiver in different positions and state of charge creates a measurable impedance displacement from the stored values. In some embodiments, the Near Field charging pad can perform bias correction and/or tuning to protect and optimize the system performance.

In some embodiments, the wireless-power transmitter device is an NF+ system. The NF+ system is configured to operate when a receiver is placed within the operational area (or transmission field) of the NF+ system. In some embodiments, the NF+ system includes one or more sensors that provide additional data that can be used to perform the operations described herein (e.g., receiver detection and/or classification). In some embodiments, measurements of the antenna (e.g., gain and coupling) are obtained from factory manufacture tests, simulations, and/or characterization. In some embodiments, the NF+ system is calibrated at a factory with the wireless-power transmission system and/or methods disclosed herein. In some embodiments, the wireless-power transmission system and/or methods are further calibrated to operate with one or more antennas installed in the NF+ system (e.g., similar to the calibrations discussed above for the NF charging pad). For example, nominal impedance within tolerances for the NF+ system can be measured during factory calibration and stored. In some embodiments, the NF+ system can perform initial bias correction and/or tuning to optimize the transmitter device (e.g., NF+ system) in an environment (e.g., location in which the transmitter device operates). In some embodiments, during operation, a receiver in the transmission field may cause detectable displacements (e.g., detectable with the assistance of the one or more sensors).

In some embodiments, a receiver near to and/or touching the transmitter device (e.g., no more than 3 inches between the receiver and a housing of the transmitter device system) will result in a measurable displacement that is measured without needing additional data from one or more sensors to recognize the receiver's presence. In some embodiments, when the receiver is not moving and is near to and/or touching the transmitter device, the transmitter device (e.g., the NF+ system) uses bias correction and/or tuning to protect and optimize system performance (as discussed in more detail below concerning selection of an operational impedance). In some embodiments, if the receiver moves quickly near the transmitter device, the transmitter device (e.g., the NF+ system) is caused to trigger receiver acquisition as disclosed herein.

A receiver (also referred to as a wireless-power receiver) can be an electronic device that comprises at least one antenna, at least one rectifying circuit, and at least one power converter, which may utilize energy transmitted in the transmission field from a transmitter for powering or charging the electronic device. In certain circumstances, the receiver (or a device in which the receiver is embedded or integrated) can be brought into the transmission field of a transmitter by a human hand. By taking advantage of the at least two sensors (a ranging sensor and a sensor used for object-classification purposes), the techniques described herein help to achieve improve safety in transmitting wireless power (e.g., by ensuring that power transmission begins once the human hand exits a keep-out zone that is within the transmission field). This is described in more detail below in reference to FIGS. 6A-6C.

FIG. 1A is a block diagram of an RF wireless-power transmission system 150 in accordance with some embodiments. In some embodiments, the RF wireless-power transmission system 150 includes a first RF power transmitter device 100 (also referred to herein as a near-field (NF) power transmitter device, transmitter, power transmitter, or wireless-power transmitter device 100). In some embodiments, the RF wireless-power transmission system 150 includes a far-field transmitter device (not shown). The RF power transmitter device 100 includes one or more of one or more communications components 110, one or more power amplifier units 120-1, . . . 120-n, one or more power-transfer elements (e.g., such as antennas 130-1 to 130-n), an RF Power Transmitter Integrated Circuit (RFIC) 160, and one or more sensors 165. In some embodiments, the RF power transmitter device 100 includes one or more splitters (140-1 to 140-n) and one or more switches (145-1 to 145-n).

In some embodiments, the communication component(s) 110 (e.g., wireless communication components, such as WI-FI or BLUETOOTH radios) enable communication between the RF power transmitter device 100 and one or more communication networks. In some embodiments, the communication component(s) 110 are capable of data communications using any of a variety of custom or standard wireless protocols (e.g., IEEE 802.15.4, Wi-Fi, ZigBee, 6LoWPAN, Thread, Z-Wave, Bluetooth Smart, ISA100.11a, WirelessHART, MiWi, etc.) custom or standard wired protocols (e.g., Ethernet, HomePlug, etc.), and/or any other suitable communication protocol, including communication protocols not yet developed as of the filing date of this document.

In some embodiments, the communication component(s) 110 receives charging information from the wireless-power receiver (or from an electronic device configured to be charged by the wireless-power receiver; e.g., a hearing aid). In some embodiments, the charging information is received in a packet of information that is received in conjunction with an indication that the wireless-power receiver is located within one meter of the RF power transmitter device 100. In some embodiments, the charging information includes the location of the wireless-power receiver within the transmission field of the RF power transmitter device 100 (or the surrounding area within the communications component(s) range). For example, communication components 110, such as BLE communications paths operating at 2.4 GHz, to enable the RF power transmitter device 100 to monitor and track the location of the wireless-power receiver. The location of the wireless-power receiver can be monitored and tracked based on the charging information received from the wireless-power receiver.

In some embodiments, the charging information indicates that a receiver is authorized to receive wirelessly-delivered power from the RF power transmitter device 100. More specifically, the wireless-power receiver can use a wireless communication protocol (such as BLE) to transmit the charging information as well as authentication information to the one or more integrated circuits (e.g., RFIC 160) of the RF power transmitter device 100. In some embodiments, the charging information also includes general information such as charge requests from the receiver, the current battery level, charging rate (e.g., effectively transmitted power or RF energy successfully converted to usable energy), device specific information (e.g., temperature, sensor data, receiver requirements or specifications, and/or other receiver specific information), etc.

In some instances, the communication component(s) 110 are not able to communicate with wireless-power receivers for various reasons, e.g., because there is no power available for the communication component(s) to use for the transmission of data signals or because the wireless-power receiver itself does not actually include any communication component of its own. As such, in some optional embodiments, near-field power transmitters described herein are still able to uniquely identify different types of devices and, when a wireless-power receiver is detected, figure out if that wireless-power receiver is authorized to receive wireless-power (e.g., by measuring impedances, reflected power, and/or other techniques).

The one or more power amplifiers 120 are configured to amplify a radio frequency (RF) signal that is provided to the one or more antennas 130. In some embodiments, the power amplifier 120 used in the power transmission system controls both the efficiency and gains of the output of the power amplifier. In some embodiments, the power amplifier used in the power transmission system is a class E power amplifier 120. In some embodiments, the power amplifier 120 used in the power transmission system is a Gallium Nitride (GaN) power amplifier. In some embodiments, the RF power transmitter device 100 is configured to control operation of the one or more power amplifiers 120 when they drive one or more antennas 130. In some embodiments, one or more of the power amplifiers 120 are a variable power amplifier including at least two power levels. In some embodiments, a variable power amplifier includes one or more of a low power level, median power level, and high power level. As discussed below in further detail, in some implementation, RF power transmitter device 100 is configured to select power levels of the one or more power amplifiers. In some embodiments, RF power is controlled and modulated at the RF power transmitter device 100 via switch circuitry as to enable the RF wireless-power transmission system 100 to send RF power to one or more wireless receiving devices via the one or more antennas 130. In some embodiments, a single power amplifier, e.g., 120-*n* is controlling multiple antennas 130-*m* to 130-*n* through multiple splitters (140-1 to 140-*n*) and multiple switches (145-1 to 145-*n*).

In some embodiments, the output power of the single power amplifier 120 is equal or greater than 2 W. In some embodiments, the output power of the single power amplifier 120 is equal or less than 15 W. In some embodiments, the output power of the single power amplifier 120 is greater than 2 W and less than 15 W. In some embodiments, the output power of the single power amplifier 120 is equal or greater than 4 W. In some embodiments, the output power of the single power amplifier 120 is equal or less than 8 W. In some embodiments, the output power of the single power amplifier 120 is greater than 4 W and less than 8 W. In some embodiments, the output power of the single power amplifier 120 is greater than 8 W and up to 50 W.

In some embodiments, by using the single power amplifier 120 with an output power range from 2 W to 15 W, the electric field within the power transmission range of the antenna 130 controlled by the single power amplifier 120 is at or below a SAR value of 1.6 W/kg, which is in compliance with the FCC (Federal Communications Commission) SAR requirement in the United States. In some embodiments, by using a single power amplifier 120 with a power range from 2 W to 15 W, the electric field within the power transmission range of the antenna 130 controlled by the single power amplifier 120 is at or below a SAR value of 2 W/kg, which is in compliance with the IEC (International Electrotechnical Commission) SAR requirement in the European Union. In some embodiments, by using a single power amplifier 120 with a power range from 2 W to 15 W, the electric field within the power transmission range of the antenna 130 controlled by the single power amplifier 120 is at or below a SAR value of 0.8 W/kg. In some embodiments, by using a single power amplifier 120 with a power range from 2 W to 15 W, the electric field within the power transmission range of the antenna 130 controlled by the single power amplifier 120 is at or below any level that is regulated by relevant rules or regulations. In some embodiments, the SAR value in a location of the radiation profile of the antenna decreases as the range of the radiation profile increases.

The one or more antennas 130, upon receiving the amplified RF signal from the one or more power amplifiers 120, are configured to radiate RF energy within a transmission field of the RF power transmitter device 100. The one or more antennas 130 are discussed below in reference to FIG. 1D. In some embodiments, the maximum power radiation distance or power transmission range for the antenna(s) controlled by the power amplifier 120 is equal or less than 6 inches (approximately 15.2 cm). In some embodiments, the maximum power radiation distance or power transmission range for the antenna(s) controlled by the power amplifier 120 is about 6 inches to one foot (approximately 15.2 cm to 30.5 cm). In some embodiments, the maximum power radiation distance or power transmission range for the antenna(s) controlled by the power amplifier 120 is equal or less than 1 meter. In some embodiments, the maximum power radiation distance or power transmission range for the antenna(s) controlled by the power amplifier 120 is about one meter. In some embodiments, the maximum power radiation distance or power transmission range for the antenna(s) controlled by the power amplifier 120 is more than one meter. In some embodiments, the one or more antennas can include integrated sensors as described below in reference to FIGS. 9A-10D.

In some embodiments, the radiation profile generated by the antenna controlled by a single power amplifier is defined based on how much usable power is available to a wireless-power receiver when it receives electromagnetic energy from the radiation profile (e.g., rectifies and converts the electromagnetic energy into a usable DC current), and the amount of usable power available to such a wireless-power receiver can be referred to as the effective radiated power of an RF signal. In some embodiments, the effective radiated power of the RF signal in a predefined radiation profile is at least 0.5 W. In some embodiments, the effective radiated power of the RF signal in a predefined radiation profile is greater than 1 W. In some embodiments, the effective radiated power of the RF signal in a predefined radiation profile is greater than 2 W. In some embodiments, the effective radiated power of the RF signal in a predefined radiation profile is greater than 5 W. In some embodiments, the effective radiated power of the RF signal in a predefined radiation profile is less or equal to 4 W.

The RFIC 160 is configured to perform one or more operations of the RF power transmitter device 100. For example, the RFIC 160 can utilize data provided by the one or more sensors 165 (in certain embodiments, data from at least two sensors 165 is utilized, each of the at least two sensors being of a different type of sensor, or being configured to perform different operations (under certain conditions or due to their arrangement)) to one or more of: (i) select a power level of the one or more power amplifiers 120, (ii) utilize data provided by the one or more sensors 165 to detect and/or classify one or more objects, (iii) enable or disable the transmission of wireless power, (iv) adjust the radiated RF energy or radiation profile, and (v) other operations described herein and below in reference to FIG. 5A-7B.

Figure 1B:
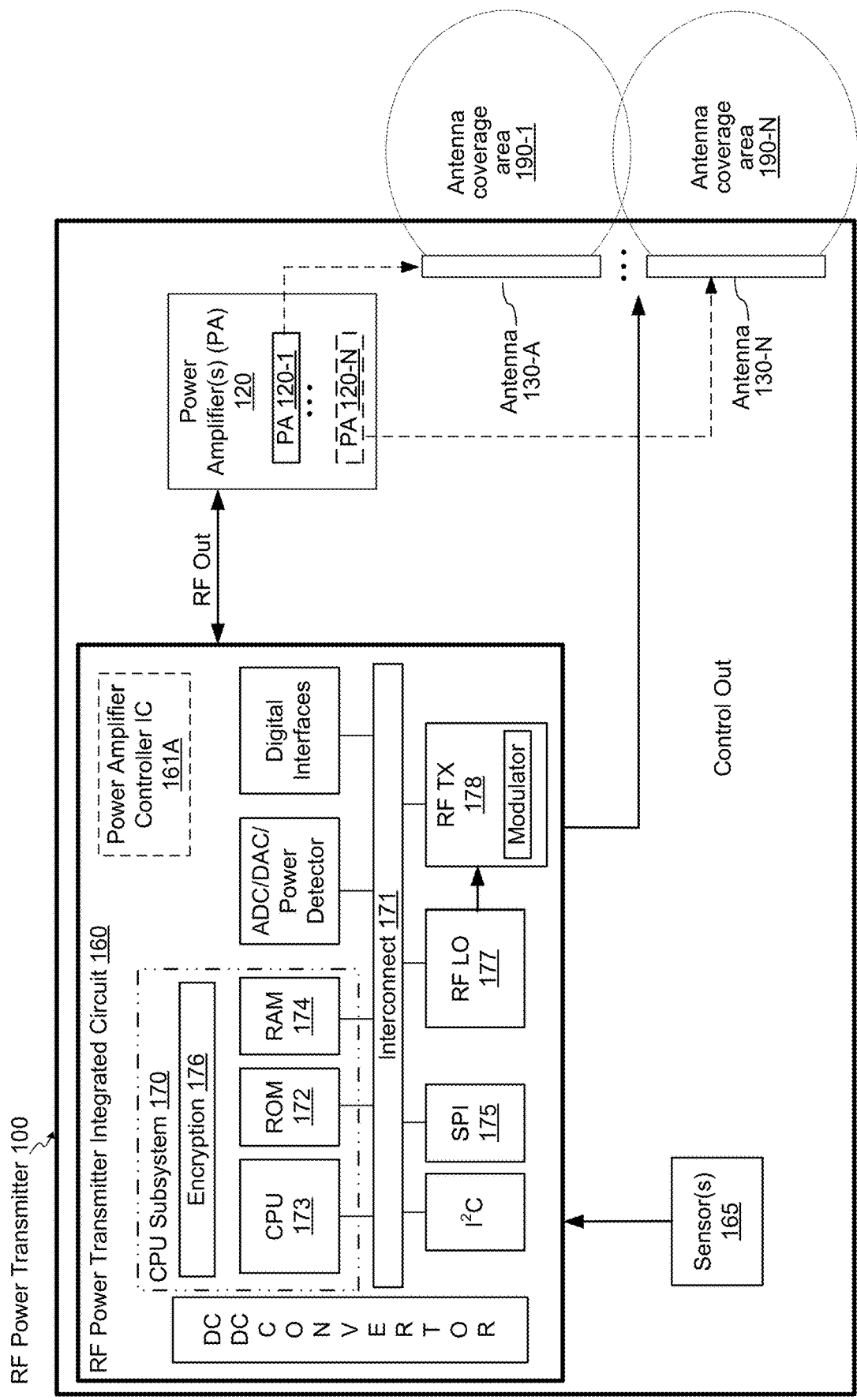
FIG. 1B is a block diagram showing components of an example RF power transmission system that includes an RF power transmitter integrated circuit and antenna coverage areas, in accordance with some embodiments.

FIG. 1B is a block diagram of a second RF power transmitter device 100 including an RF power transmitter integrated circuit 160, at least two sensors 165, one or more antennas 130, and/or a power amplifier 120 in accordance with some embodiments. For ease of discussion and illustration, the second RF power transmitter device 100 is analogous to the wireless-power transmitter device described above in reference to FIG. 1A, and includes one or more additional and/or distinct components, or omits one or more components. In some embodiments, the RFIC 160 includes a CPU subsystem 170, an external device control interface, an RF subsection for DC to RF power conversion, and analog and digital control interfaces interconnected via an interconnection component, such as a bus or interconnection fabric block 171. In some embodiments, the CPU subsystem 170 includes a microprocessor unit (CPU) 173 with related Read-Only-Memory (ROM) 172 for device program booting via a digital control interface, e.g., an I2C port, to an external FLASH containing the CPU executable code to be loaded into the CPU Subsystem Random Access Memory (RAM) 174 (e.g., memory 206, FIG. 2) or executed directly from FLASH. In some embodiments, the CPU subsystem 170 also includes an encryption module or block 176 to authenticate and secure communication exchanges with external devices, such as wireless-power receivers that attempt to receive wirelessly delivered power from the RF power transmitter device 100. In some embodiments, the RF power transmitter device 100 may also include a temperature monitoring circuit (not shown) that is in communication with the CPU subsystem 170 to ensure that the RF power transmitter device 100 remains within an acceptable temperature range. For example, if a determination is made that the RF power transmitter device 100 has reached a threshold temperature, then operation of the RF power transmitter device 100 may be temporarily suspended until the RF power transmitter device 100 falls below the threshold temperature.

In some embodiments, the RFIC 160 also includes (or is in communication with) a power amplifier controller IC (PAIC) 161A that is responsible for controlling and managing operations of a power amplifier, including, but not limited to, reading measurements of impedance at various measurement points within the power amplifier, instructing the power amplifier to amplify the RF signal, synchronizing the turn on and/or shutdown of the power amplifier, optimizing performance of the power amplifier, protecting the power amplifier, and other functions discussed herein. In some embodiments, the impedance measurement are used to allow the RF power transmitter device 100 (via the RFIC 160 and/or PAIC 161A) to detect of one or more foreign objects, optimize operation of the one or more power amplifiers, assess one or more safety thresholds, detect changes in the impedance at the one or more power amplifiers, detect movement of the receiver within the wireless transmission field, protect the power amplifier from damage (e.g., by shutting down the PA, changing a selected power level of the PA, and/or changing other configurations of the RF power transmitter device 100), classify a receiver (e.g., authorized receivers, unauthorized receivers, and/or receiver with an object), compensate for the power amplifier (e.g., by making hardware, software, and/or firmware adjustments), tune the RF power transmitter device 100 system, and/or other functions. Additional detail on the one or more functions (e.g., enabling, disabling, and/or adjusting an RF signal or radiation profile) of the PAIC 161A with respect sensor data from the one or more sensors 165 is provided below in FIGS. 6A-7B.

In some embodiments, the PAIC 161A may be on the same integrated circuit as the RFIC 160. Alternatively, in some embodiments, the PAIC 161A may be on its own integrated circuit that is separate from (but still in communication with) the RFIC 160. In some embodiments, the PAIC 161A is on the same chip with one or more of the power amplifiers 120. In some other embodiments, the PAIC 161A is on its own chip that is a separate chip from the power amplifiers 120. In some embodiments, the PAIC 161A may be on its own integrated circuit that is separate from (but still in communication with) the RFIC 160 enables older systems to be retrofitted. In some embodiments, the PAIC 161A as a standalone chip communicatively coupled to the RFIC 160 can reduce the processing load and potential damage from over-heating. Alternatively or additionally, in some embodiments, it is more efficient to design and use two different ICs (e.g., the RF IC 160 and the PAIC 161A).

In some embodiments, executable instructions running on the CPU (such as those shown in the memory 206 in FIG. 2, and described below) are used to manage operation of the RF power transmitter device 100 and to control external devices through a control interface, e.g., SPI control interface 175, and the other analog and digital interfaces included in the RFIC 160. In some embodiments, the CPU subsystem 170 also manages operation of the RF subsection of the RFIC 160, which includes an RF local oscillator (LO) 177 and an RF transmitter (TX) 178. In some embodiments, the RF LO 177 is adjusted based on instructions from the CPU subsystem 170 and is thereby set to different desired frequencies of operation, while the RF TX converts, amplifies, modulates the RF output as desired to generate a viable RF power level.

In the descriptions that follow, various references are made to antenna coverage areas and power-transfer coverage areas, and those terms are used synonymously in this disclosure. In some embodiments, the coverage area includes an area into which energy is radiated by a particular antenna, which is typically a NF+ distance away from an exterior surface of the transmitter's housing that is adjacent to the antenna. In some embodiments, the antenna/power-transfer coverage areas may include antenna elements that transmit propagating radio frequency waves but, in other embodiments, the antenna/power transfer coverage areas may instead include capacitive charging couplers that convey electrical signals but do not send propagating radio frequency waves. A combination of respective antenna coverage areas from each antenna included in a wireless-power transmission system becomes the transmission field as discussed above (and referenced below in FIGS. 5A-6C).

In some conventional systems, a viable RF power level can be provided to an optional beam-forming integrated circuit (IC) (not shown), which then provides phase-shifted signals to one or more power amplifiers. In such conventional systems, the optional beam-forming IC is used to ensure that power transmission signals sent using two or more antennas 130 (e.g., each antenna 130 may be associated with a different antenna zone 190 or may each belong to a single antenna zone 190) to particular wireless-power receivers are transmitted with appropriate characteristics (e.g., phases) to ensure that power transmitted to the particular wireless-power receiver is maximized (e.g., the power transmission signals arrive in phase at the particular wireless-power receiver). As described herein, the embodiments herein do not require the use of a beam-forming integrated circuit. In certain embodiments, such a beam-forming integrated circuit (and/or associated algorithm) can be included in the systems described herein, but that circuit is disabled and is not used in conjunction with wirelessly-transmitted energy to receiver devices.

In some embodiments, the RFIC 160 and/or PAIC 161A provide the viable RF power level (e.g., via the RF TX 178) directly to the one or more power amplifiers 120 and does not use any beam-forming capabilities (e.g., bypasses/disables a beam-forming IC and/or any associated algorithms if phase-shifting is not required, such as when only a single antenna 130 is used to transmit power transmission signals to a wireless-power receiver). In some embodiments, by not using beam-forming control, there is no active beam-forming control in the power transmission system. For example, in some embodiments, by eliminating the active beam-forming control, the relative phases of the power signals from different antennas are unaltered after transmission. In some embodiments, by eliminating the active beam-forming control, the phases of the power signals are not controlled and remain in a fixed or initial phase. In some embodiments, the RFIC 160 and/or PAIC 161A regulate the functionality of the power amplifiers 120 including adjusting the viable RF power level to the power amplifiers 120, enabling the power amplifiers 120, disabling the power amplifiers 120, and/or other functions. In some embodiments, the PAIC 161A has similar structure as that of the power amplifier controller described in FIG. 4 below. One or more functions of the PAIC 161A are discussed below in FIGS. 6A-7B.

The one or more power amplifiers 120 provide the RF signals to the one or more antennas 130. In some embodiments, a number of antennas used to radiate each of the antenna coverage areas 190 is dynamically based on various parameters, such as a location of a wireless-power receiver on the RF power transmitter device 100. The one or more antennas 130, upon receiving the amplified RF signal from the one or more power amplifiers 120, are configured to radiate RF energy to wireless-power receivers that are authorized to receive wirelessly delivered power from the RF power transmitter device 100. The radiated RF energy is represented by antenna coverage areas 190. In some embodiments, one or more antenna coverage areas 190 are based on a RF signal from a respective power amplifier 120. For example, a first antenna coverage area 190-1 is radiated by a first antenna 130-1 coupled to a first power amplifier 120-1 and an Nth antenna coverage area 190-N is radiated by an Nth antenna 130-N coupled to an Nth power amplifier 120-N. Alternatively or additionally, in some embodiments, the one or more antenna coverage areas 190 are based on RF signals from at least two or more power amplifiers 120. In some embodiments, at least two or more antenna coverage areas 190 are based on an RF signal from a (single) power amplifier 120. In some embodiments, multiple antenna coverage areas are based on RF signals provide by a same set of power amplifiers 120 (e.g., a low number (for example, no more than three) power amplifiers 120 are coupled the one or more antennas 130, which radiate each antenna coverage area 190).

In some embodiments, as described below in reference to FIGS. 9A-10D, the one or more antennas 130 can include an integrated sensor. The integrated sensor can perform one or more functions of the sensors 165 without interfering with the radiated RF energy that is provided by the one or more antenna s 130.

Various arrangements and couplings of power amplifiers 120 to antenna coverage areas 190 allow the RF power transmitter device 100 to sequentially or selectively activate different antenna coverage areas 190 in order to determine the most efficient and safest (if any) antenna coverage area 190 to use for transmitting wireless-power to a wireless-power receiver.

In some embodiments, the one or more power amplifiers 120 are also controlled by the CPU subsystem 170 to allow the CPU 173 to measure output power provided by the power amplifiers 120 to the antenna coverage areas of the RF power transmitter device 100. In some embodiments, the one or more power amplifiers 120 are controlled by the CPU subsystem 170 via the PAIC 161A. In some embodiments, the power amplifiers 120 may include various measurement points that allow for at least measuring impedance values that are used to enable the foreign object detection techniques, receiver and/or foreign object movement detection techniques, power amplifier optimization techniques, power amplifier protection techniques, receiver classification techniques, power amplifier impedance detection techniques, and/or other safety techniques described in commonly-owned U.S. patent application Ser. No. 16/932,631, which is incorporated by reference in its entirety for all purposes.

In some embodiments, each antenna coverage area 190 may include antennas of different types (e.g., a meandering line antenna, a loop antenna, and/or other type of antenna), while in other embodiments each antenna coverage area 190 may include a single antenna of a same type (e.g., all antenna coverage areas 190 include one loop antenna, meandering antenna, and/or other type of antenna), while in still other embodiments, the antennas coverage areas may include some antenna coverage areas that include a single antenna of a same type and some antenna coverage areas that include antennas of different types. In some embodiments the antenna/power-transfer coverage areas may also or alternatively include capacitive charging couplers that convey electrical signals but do not send propagating radio frequency waves. Antenna coverage areas are also described in further detail below.

As is also shown in FIG. 1A, in some embodiments, the sensors 165 also provide data to the RFIC 160, which then allows the RFIC 160 to use that data to, e.g., assist with ranging and object-classification operations. Some of the data from sensors 165 can also be provided to the PA IC 161A, which can also assist with processing the sensor data.

Figure 1C:
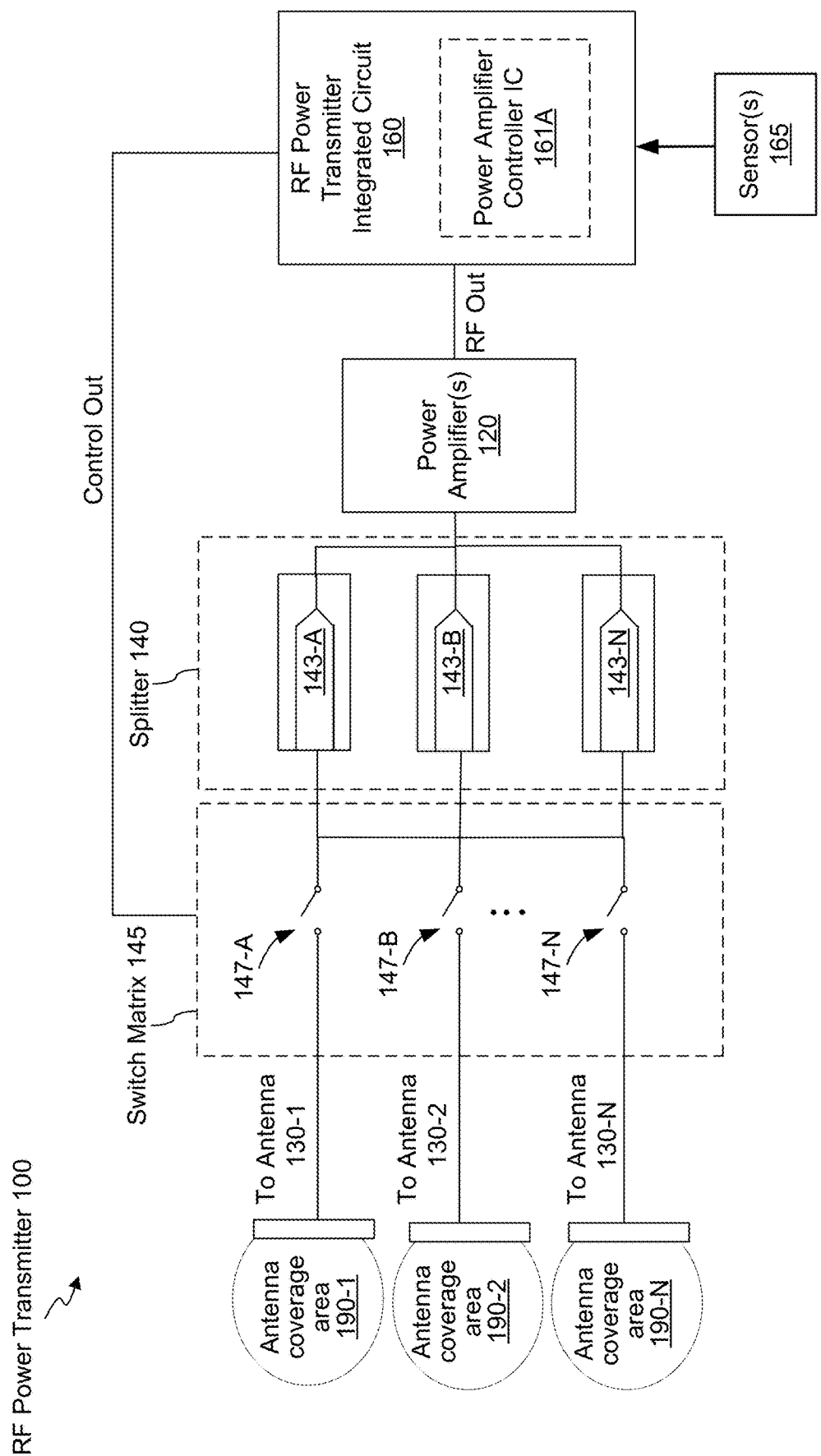
FIG. 1C is a block diagram showing components of an example RF power transmitter that includes an RF power transmitter integrated circuit coupled to an optional switch or/and some optional splitters, in accordance with some embodiments.

FIG. 1C is a block diagram of a third RF power transmitter device 100 in accordance with some embodiments. For ease of discussion and illustration, the third RF power transmitter device 100 is analogous to the wireless-power transmitter device described above in reference to FIGS. 1A and 1B, and includes one or more additional and/or distinct components, or omits one or more components.

The third RF power transmitter device 100 includes an RFIC 160, at least one power amplifier 120, a PAIC 161A (which may be on the same or a separate IC from the RFIC 160), and one or more antennas 130 having multiple antenna coverage areas such as 190-1, 190-2, . . . 190-N. Each of these components is described in detail above with reference to FIGS. 1A and 1B. In some embodiments, the third RF power transmitter device 100 includes an optional splitter 140 array (i.e., transmitter-side splitter), positioned between the power amplifier 120 and the one or more antennas 130, having a plurality of splitters 143-A, 143-B, . . . 143-N. The splitter array 140 is configured to connect the power amplifier 120 with one or more antenna coverage areas 190 of the one or more antennas 130 in response to control signals provided by the RFIC 160. Additionally, the third RF power transmitter device 100 includes an optional switch matrix 145 (i.e., transmitter-side switch), positioned between the power amplifier 120 and the one or more antennas 130, having a plurality of switches 147-A, 147-B, . . . 147-N. The switch matrix 145 is configured to switchably connect the power amplifier 120 with one or more antenna coverage areas 190 of the one or more antennas 130 in response to control signals provided by the RFIC 160. In some embodiments, the switch matrix 145 allows for connections and terminations of different antenna (elements) within the one or more antennas 130. In some embodiments, as described below in reference to FIGS. 9A-10D, the one or more antennas 130 can include an integrated sensor. The integrated sensor can perform one or more functions of the sensors 165 without interfering with the radiated RF energy.

To accomplish the above, each switch 147 is coupled with (e.g., provides a signal pathway to) a different antenna coverage area 190 of the one or more antennas 130. For example, switch 147-A may be coupled with a first antenna 130-1 (FIG. 1B) of the one or more antennas 130, switch 147-B may be coupled with a second antenna 130-2 of the one or more antennas 130, and so on. Each of the plurality of switches 147-A, 147-B, . . . 147-N, once closed, creates a unique pathway between a power amplifier 120 and a respective antenna coverage area of the one or more antennas 130. Each unique pathway through the switch matrix 145 is used to selectively provide RF signals to specific antenna coverage areas of the one or more antennas 130. It is noted that two or more of the plurality of switches 147-A, 147-B, . . . 147-N may be closed at the same time, thereby creating multiple unique pathways to the one or more antennas 130 that may be used simultaneously.

In some embodiments, the RFIC 160 (or the PAIC 161A, or both) is (are) coupled to the switch matrix 145 and is configured to control operation of the plurality of switches 147-A, 147-B, . . . 147-N (illustrated as a "control out" signal in FIGS. 1A and 1B). For example, the RFIC 160 may close a first switch 147-A while keeping the other switches open. In another example, the RFIC 160 may close a first switch 147-A and a second switch 147-B, and keep the other switches open (various other combinations and configuration are possible). Moreover, the RFIC 160 is coupled to the power amplifier 120 and is configured to generate a suitable RF signal (e.g., the "RF Out" signal) and provide the RF signal to the power amplifier 120 the power amplifier 120, in turn, is configured to provide the RF signal to one or more antenna coverage areas of the one or more antennas 130 via the switch matrix 145, and/or the splitters 143 depending on which switches 147 in the switch matrix 145 are closed by the RFIC 160. In some embodiments, when a portion of the circuit segment associated with an antenna within the one or more antennas 130 is not used, the corresponding switch 147 will be turned off.

To further illustrate, the power transmitter system can be configured to transmit test power transmission signals, and/or regular power transmission signals, using different antenna coverage areas, e.g., depending on a location of a receiver on the power transmitter. In some embodiments, the power transmitter and client devices use standard Bluetooth low energy ("BLE") communications paths to enable power transmitter to monitor and track the location of the client devices. Accordingly, when a particular antenna coverage area is selected for transmitting test signals or regular power signals, a control signal is sent to the switch matrix 145 from the RFIC 160 to cause at least one switch 147 to close. In doing so, an RF signal from at least one power amplifier 120 can be provided to the particular antenna coverage area using a unique pathway created by the now-closed at least one switch 147. In some embodiments, each antenna coverage area 190 includes a single antenna, and only a single antenna coverage area 190 with a single antenna is utilized in certain embodiments.

In some embodiments, the switch matrix 145 may be part of (e.g., internal to) the one or more antennas 130. Alternatively, in some embodiments, the switch matrix 145 is separate from the one or more antennas 130 (e.g., the switch matrix 145 may be a distinct component, or may be part of another component, such as the power amplifier 120). It is noted that any switch design capable of accomplishing the above may be used, and the design of the switch matrix 145 illustrated in FIG. 1C is merely one example.

As is shown in FIGS. 1A and 1B, in some embodiments, the sensors 165 also provide data to the RFIC 160, which then allows the RFIC 160 to use that data to, e.g., assist with ranging and object-classification operations. Some of the data from sensors 165 can also be provided to the PA IC 161A, which can also assist with processing the sensor data.

Figure 1D:
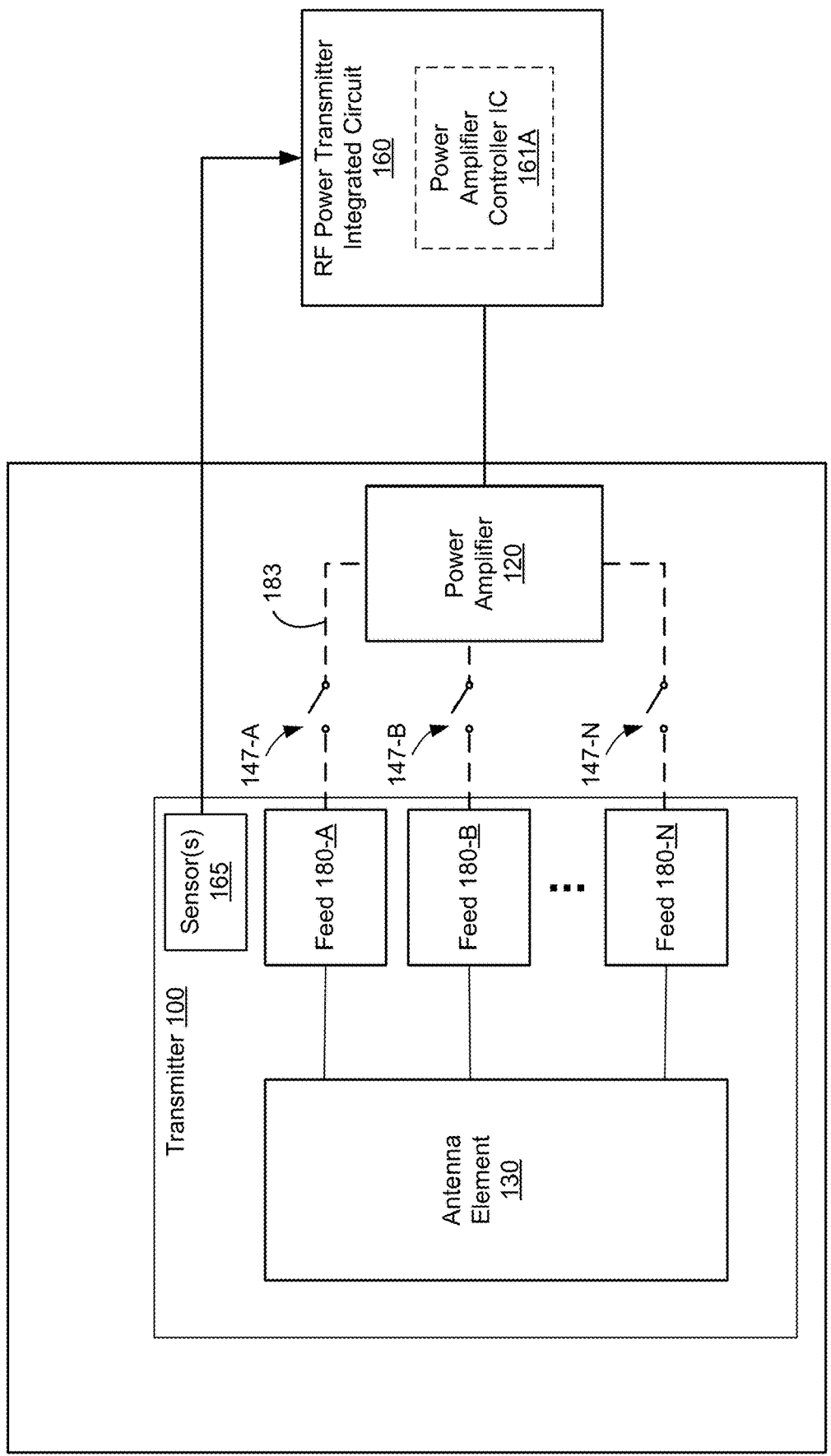
FIG. 1D is a block diagram showing components of an example RF power transmitter that includes an RF power transmitter integrated circuit coupled to one or more feeds, in accordance with some embodiments.

FIG. 1D is a block diagram of a fourth RF power transmitter device 100 in accordance with some embodiments. For ease of discussion and illustration, the fourth RF power transmitter device 100 is analogous to the wireless-power transmitter device described above in reference to FIGS. 1A-1C, and includes one or more additional and/or distinct components, or omits one or more components. The fourth RF power transmitter device 100 illustrates an example antenna configuration. As one of skill will appreciate upon reading this disclosure, many different antennas can be utilized in the systems described herein.

The fourth RF power transmitter device 100 includes a single antenna 130 responsible for radiating RF energy (i.e., transmitting power to receiver devices located within) a representative antenna coverage area 190 (e.g., FIGS. 1A-1C). One example is an antenna 130 with a number of different feeds that can each be selectively activated, as is schematically depicted in FIG. 1D.

The non-limiting example fourth RF power transmitter device 100 includes an antenna element 130, one or more feeds 180-A, 180-B, . . . 180-N, and a power amplifier 120 (e.g., a single power amplifier). The components of the fourth RF power transmitter device 100 are coupled via busing 183 or the components are directly coupled to one another. Additionally, the representative fourth RF power transmitter device 100 includes switches 147-A, 147-B, . . . 147-N positioned between the power amplifier 120 and each respective feed 180.

Figure 3:
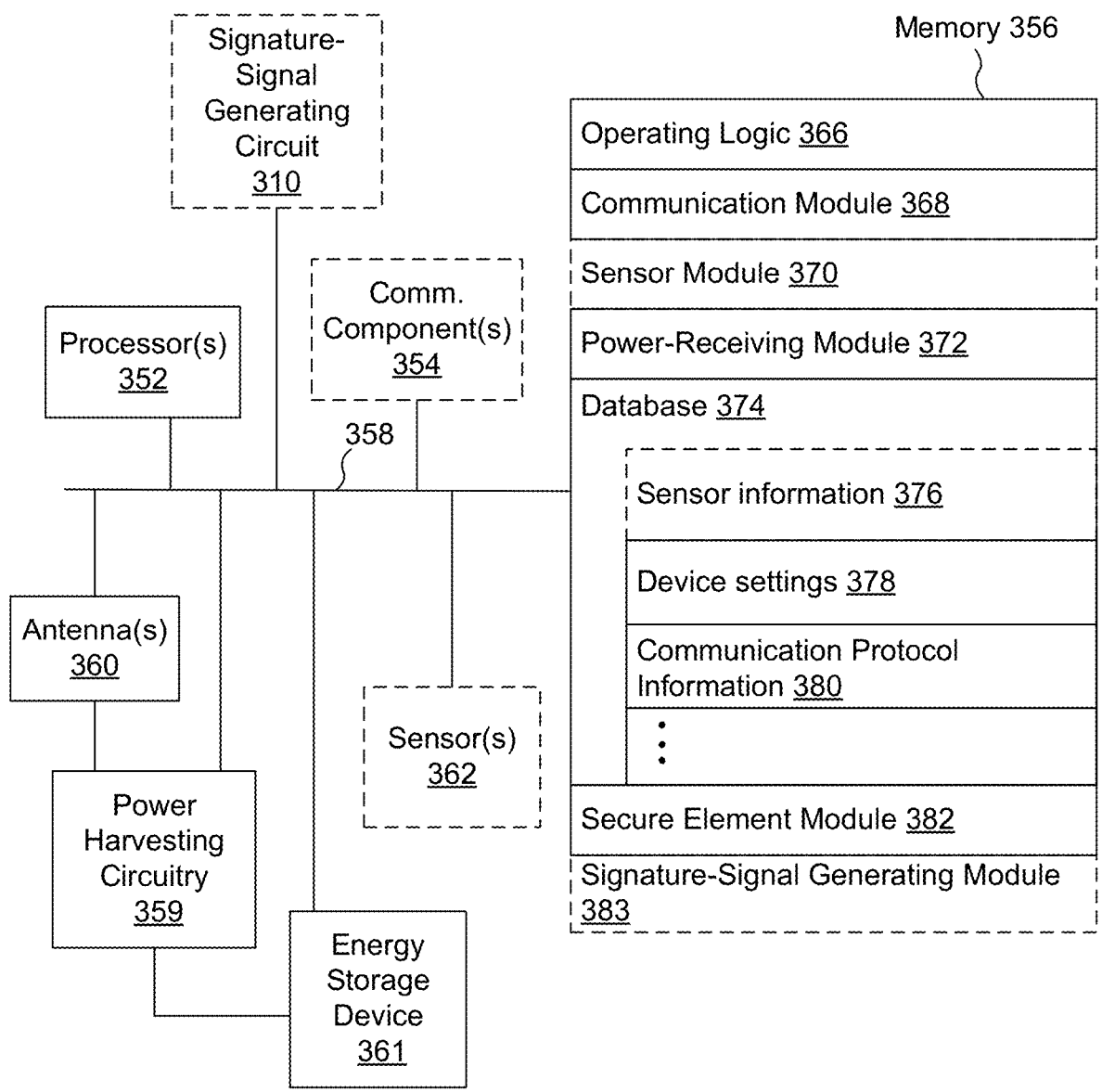
FIG. 3 is a block diagram illustrating an example receiver device, in accordance with some embodiments.

In some embodiments, the power amplifier 120 and any switches 147 can be configured as part of the fourth RF power transmitter device 100 while, in other embodiments, the power amplifier 120 and any switches 147 can be configured as external to the fourth RF power transmitter device 100 and coupled to feeds of an antenna element 130 (as illustrated in FIG. 3). In some embodiments, power amplifier 120 may be shared across multiple transmitter coverage areas 190-1.

The antenna element 130 can be coupled with the one or more feeds 180-A, 180-B, . . . 180-N. In some embodiments (as shown in FIG. 1D), the antenna element 130 is directly coupled with each of the feeds 180-A, 180-B, . . . 180-N. The antenna element 130 is used to radiate one or more RF signals that provide wirelessly delivered power to a receiver 304. In some embodiments, the radiated one or more RF signals are received by the receiver device 304 (FIG. 3) when the receiver is located anywhere between a top surface of the transmitter coverage area 190-1 and up to a wavelength of an operating frequency of the fourth RF power transmitter device 100 away from the transmitter coverage area 190-1 (e.g., the receiver device 304 is within a near-field transmission distance of the fourth RF power transmitter device 100).

In some embodiments, the antenna element 130 is a conductive wire forming a loop antenna (e.g., a substantially contiguous loop antenna). The antenna element 130 may be made from a suitable material that is capable of conducting the RF signals. In some embodiments, the antenna element 130 is any antenna type described below. The one or more antennas may include antenna types for operating in frequency bands, such as roughly 900 MHz to about 100 GHz or other such frequency band, such as about 1 GHz, 5.8 GHz, 24 GHz, 60 GHz, and 72 GHz. In some embodiments, the one or more antennas may be directional and include flat antennas, patch antennas, dipole antennas, and any other antenna for wireless-power transmission. The antenna types may include, for example, patch antennas with heights from about ⅛ inch to about 6 inches and widths from about ⅛ inch to about 6 inches. The shape and orientation of the one or more antennas may vary in dependency of the desired features of the fourth RF power transmitter device 100; the orientation may be flat in X-axis, Y-axis, and Z-axis, as well as various orientation types and combinations in three-dimensional arrangements. In some embodiments, the one or more antennas can have a loop shape. In some embodiments, the one or more antennas can have an "H" shape. In some embodiments, the one or more antennas can have an "L"

shape. In some embodiments, the antenna can have a meandering pattern (e.g., an "S" shape) that includes a predetermined number of turns (e.g., at least one turn, three turns, five turns, etc.) In some embodiments, as described below in reference to FIGS. 9A-10D, the one or more antennas 130 can include an integrated sensor. The integrated sensor can perform one or more functions of the sensors 165 without interfering with the radiated RF energy.

The antenna materials may include any material that may allow RF signal transmission with high efficiency and good heat dissipation. The number of antennas may vary in relation with the desired range and power transmission capability of the fourth RF power transmitter device 100. In addition, the antenna may have at least one polarization or a selection of polarizations. Such polarization may include vertical polarization, horizontal polarization, circularly polarized, left hand polarized, right hand polarized, or a combination of polarizations. The selection of polarizations may vary in dependency of the fourth RF power transmitter device 100 characteristics. In addition, the antenna may be located in various surfaces of the fourth RF power transmitter device 100. The antenna may operate in single array, pair array, quad array and any other arrangement that may be designed in accordance with the one or more parameters. In another implementation, a low number of power amplifiers, for example, 1-5 power amplifiers can be used to control the radiation profiles of the antennas in a wireless-power transmission system.

Additional examples of antennas that can be used with the systems described herein are discussed with reference to FIGS. 3A-3C of commonly-owned U.S. patent application Ser. No. 16/932,631, which is incorporated by reference in its entirety for all purposes; and FIGS. 3A-3C of commonly-owned U.S. Published Patent Application 2019/0288567 which is also incorporated by reference in its entirety for all purposes.

Each feed 180 can be coupled with the antenna element 130 at a different position on the antenna element 130. For example, the feed 180-A is coupled with the antenna element 130 at a first position, the feed 180-B is coupled with the antenna 130 at a second position, and so on. Each of the one or more feeds 180-A, 180-B, ... 180-N provides the one or more RF signals to be radiated by the antenna element 130 at a particular position along the antenna element 130 (as explained in more detail below). Each feed 180 may be made from any suitable conductive material (e.g., aluminum, copper, etc.).

The power amplifier 120 can be used to selectively provide power to one or more of the feeds 180-A, 180-B, ... 180-N by closing one or more of the switches 147-A, 147-B, ... 147-N. The power amplifier 120 may be instructed (e.g., by the RFIC 160 and/or PAIC 161A depicted in FIGS. 1B-1C) to close a respective switch of the one or more of the switches 147-A, 147-B, ... 147-N depending on a location of the receiver device 304 relative to the one or more feeds 180-A-180-D. Although not shown, the one or more of the switches 147-A, 147-B, ... 147-N may be part of (e.g., internal to) the power amplifier 120. Operation of the power amplifier 120 is discussed in further detail below with reference to the method 1800.

In some embodiments, the power amplifier 120 is coupled with a power supply (not shown), and the power amplifier 120 draws energy from the power supply to provide RF signals to one or more of the feeds 180-A, 180-B, ... 180-N. Moreover, in some embodiments, the power amplifier 120 is coupled with the RFIC 160 (e.g., as shown in FIGS. 1B-1C, and 2A). The RFIC 160 is configured to generate and provide instructions to the power amplifier 120 to generate a suitable RF signal, and the power amplifier 120 in turn provides the suitable RF signal to one or more of the feeds 180-A, 180-B, ... 180-N. In some embodiments, the power amplifier 120 is coupled to an internal or external (with respect to the fourth RF power transmitter device 100) RFIC 160 and PAIC 161A. In some embodiments, the RFIC 160 includes an RF oscillator and/or a frequency modulator that is used to generate the RF signal so that is appropriate for transmission to a wireless power receiver (e.g., the RF signal has an appropriate power level, frequency, etc. to ensure that a maximum amount of energy is transferred from the fourth RF power transmitter device 100 to the wireless power receiver (described in FIG. 3)).

The different RF power transmitter device 100 configurations described above are capable of complying with one or more safety requirements as disclosed herein. The RF power transmitter device 100 configurations provide low-cost systems that are still able to achieve a safe transmission of wireless power, thus producing a system that is commercially viable both for its ability to comply with regulatory requirements and for its ability to be built at a cost point that is palatable for customers. Such a system also places a lower computing requirements on the one or more ICs, because less components need to be controlled, and also because the system does not require any active beamforming control.

Figure 2:
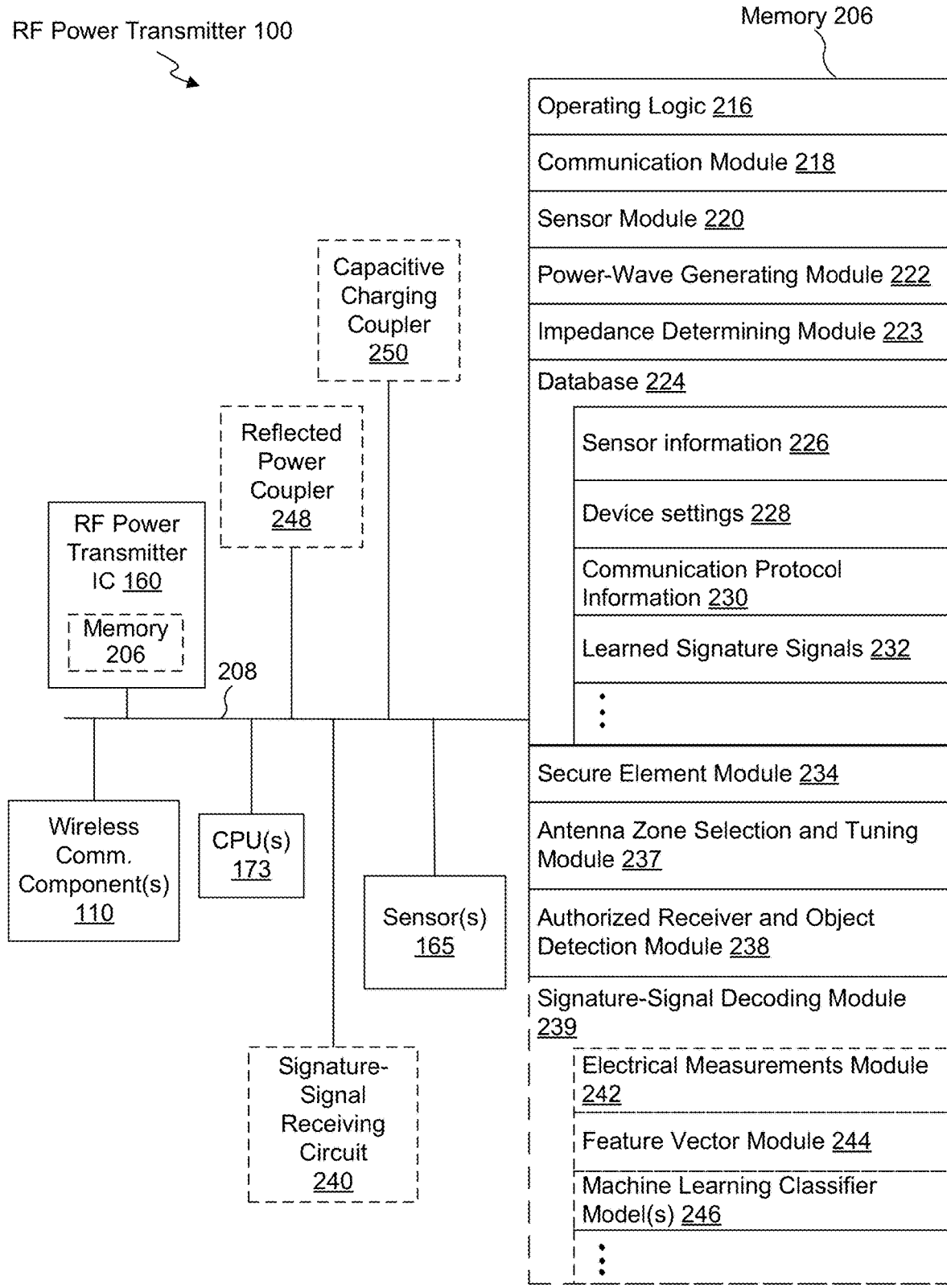
FIG. 2 is a block diagram illustrating an example RF power transmitter, in accordance with some embodiments.

FIG. 2 is a block diagram illustrating one or more components of an RF power transmitter device 100, in accordance with some embodiments. In some embodiments, the RF power transmitter device 100 includes an RFIC 160 (and the components included therein, such as a PAIC 161A and others described above in reference to FIGS. 1A-1D), memory 206 (which may be included as part of the RFIC 160, such as nonvolatile memory 206 that is part of the CPU subsystem 170), one or more CPUs 173, and one or more communication buses 208 for interconnecting these components (sometimes called a chipset). In some embodiments, the RF power transmitter device 100 includes one or more sensors 165. In some embodiments, the RF power transmitter device 100 includes one or more output devices such as one or more indicator lights, a sound card, a speaker, a small display for displaying textual information and error codes, etc. In some embodiments, the RF power transmitter device 100 includes a location detection device, such as a GPS other geo-location receiver, for determining the location of the RF power transmitter device 100.

In some embodiments, the one or more sensors 165 include one or more capacitive sensors, inductive sensors, ultrasound sensors, photoelectric sensors, time-of-flight sensors (e.g., IR sensors, ultrasonic time-of-flight sensors, phototransistor receiver systems, etc.), thermal radiation sensors, ambient temperature sensors, humidity sensors, IR sensors or IR LED emitter, occupancy sensors (e.g., RFID sensors), ambient light sensors, motion detectors, accelerometers, heat detectors, hall sensors, proximity sensors, sound sensors, pressure detectors, light and/or image sensors, and/or gyroscopes, as well as integrated sensors in one or more antennas as described below in reference to FIGS. 9A-10D. Uses and arrangements of certain examples of these sensors 165 is described in more detail below in reference to FIGS. 5A-7B.

In some embodiments, the RF power transmitter device 100 further includes an optional signature-signal receiving circuit 240, an optional reflected power coupler 248, and an optional capacitive charging coupler 250.

The memory 206 includes high-speed random access memory, such as DRAM, SRAM, DDR SRAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory 206, or alternatively the non-volatile memory within memory 206, includes a non-transitory computer-readable storage medium. In some embodiments, the memory 206, or the non-transitory computer-readable storage medium of the memory 206, stores the following programs, modules, and data structures, or a subset or superset thereof:

- Operating logic 216 including procedures for handling various basic system services and for performing hardware dependent tasks;
- Communication module 218 for coupling to and/or communicating with remote devices (e.g., remote sensors, transmitters, receivers, servers, mapping memories, etc.) in conjunction with wireless communication component(s) 110;
- Sensor module 220 for obtaining and processing sensor data (e.g., in conjunction with sensor(s) 165) to, for example, determine or detect the presence, velocity, and/or positioning of object in the vicinity of the RF power transmitter device 100 as well as classify a detected object (as described below in reference to FIGS. 5A-7B);
- Power-wave generating module 222 for generating and transmitting power transmission signals (e.g., in conjunction with antenna coverage areas 190 and the antennas 130 respectively included therein), including but not limited to, forming pocket(s) of energy at given locations, and controlling and/or managing the power amplifier (e.g., by performing one or functions of the PAIC 161A). Optionally, the power-wave generating module 222 may also be used to modify values of transmission characteristics (e.g., power level (i.e., amplitude), phase, frequency, etc.) used to transmit power transmission signals by individual antenna coverage areas;
- Impedance determining module 223 for determining an impedance of the power amplifier based on parametric parameters obtained from one or more measurement points within the RF power transmitter device 100 (e.g., determining an impedance using one or more Smith charts). Impedance determining module 223 may also be used to determine the presence of a foreign object, classify a receiver, detect changes in impedances, detect movement of a foreign object and/or receiver, determine optimal and/or operational impedances, as well as a number of other functions describe below;
- Database 224, including but not limited to:
  - Sensor information 226 for storing and managing data received, detected, and/or transmitted by one or more sensors (e.g., sensors 165 and/or one or more remote sensors);
  - Device settings 228 for storing operational settings for the RF power transmitter device 100 and/or one or more remote devices including, but not limited to, lookup tables (LUT)s for SAR, e-field roll-off, producing a certain radiation profile from among various radiation profiles, Smith Charts, antenna tuning parameters, and/or values associated with parametric parameters of the RF power transmitter device 100 for different configurations (e.g., obtained during simulation, characterization, and/or manufacture tests of the RF power transmitter device 100 and/or updated during operation (e.g., learned improvements to the system)). Alternatively, raw values can be stored for future analysis;
  - Communication protocol information 230 for storing and managing protocol information for one or more protocols (e.g., custom or standard wireless protocols, such as ZigBee, Z-Wave, etc. and/or custom or standard wired protocols, such as Ethernet); and
  - Optional learned signature signals 232 for a variety of different wireless-power receivers and other objects (which are not wireless-power receivers).
- A secure element module 234 for determining whether a wireless-power receiver is authorized to receive wirelessly delivered power from the RF power transmitter device 100;
- An antenna zone selection and tuning module 237 for coordinating a process of transmitting test power transmission signals with various antenna coverage areas (e.g., various antenna coverage areas can combine to produce the transmission field of the transmitter device discussed herein; or, for systems utilizing a single antenna, that antenna's coverage area can be the system's transmission field) to determine which antenna coverage area or coverage areas should be used to wirelessly deliver power to various wireless-power receivers (as is explained in more detail in reference to FIGS. 9A-9B of PCT Patent Application No. PCT/US2019/015820 (U.S. Pat. No. 10,615,647), which is incorporated by reference in its entirety for all purposes; also explained in more detail in PCT/US2017/065886 (U.S. Pat. No. 10,256,677), which is incorporated by reference in its entirety for all purposes);
- An authorized receiver and object detection module 238 used for detecting various signature signals from wireless-power receivers and from other objects, and then determining appropriate actions based on the detecting of the various signature signals (as is explained in more detail in reference to FIGS. 9A-9B of PCT Patent Application No. PCT/US2019/015820 (U.S. Pat. No. 10,615,647), which is incorporated by reference in its entirety for all purposes; also explained in more detail in PCT/US2017/065886 (U.S. Pat. No. 10,256,677), which is incorporated by reference in its entirety for all purposes); and
- An optional signature-signal decoding module 239 used to decode the detected signature signals and determine message or data content. In some embodiments, the module 239 includes an electrical measurement module 242 to collect electrical measurements from one or more receivers (e.g., in response to power beacon signals), a feature vector module 244 to compute feature vectors based on the electrical measurements collected by the electrical measurement module 239, and/or machine learning classifier model(s) 246 that are trained to detect and/or classify foreign objects (additional detail provided in commonly-owned U.S. Patent Publication No. 2019/0245389, which is incorporated by reference herein for all purposes).

Each of the above-identified elements (e.g., modules stored in memory 206 of the RF power transmitter device 100) is optionally stored in one or more of the previously mentioned memory devices, and corresponds to a set of instructions for performing the function(s) described above. The above-identified modules or programs (e.g., sets of instructions) need not be implemented as separate software programs, procedures, or modules, and thus various subsets of these modules are optionally combined or otherwise rearranged in various embodiments. In some embodiments, the memory 206, optionally, stores a subset of the modules and data structures identified above.

FIG. 3 is a block diagram illustrating a representative receiver device 304 (also sometimes interchangeably referred to herein as a receiver, power receiver, or wireless-power receiver), in accordance with some embodiments. In some embodiments, the receiver device 304 includes one or more processing units (e.g., CPUs, ASICs, FPGAs, microprocessors, and the like) 352, one or more communication components 354, memory 356, antenna(s) 360, power harvesting circuitry 359, and one or more communication buses 358 for interconnecting these components (sometimes called a chipset). In some embodiments, the receiver device 304 includes one or more optional sensors 362, similar to the one or sensors 165 described above with reference to FIG. 2. In some embodiments, the receiver device 304 includes an energy storage device 361 for storing energy harvested via the power harvesting circuitry 359. In various embodiments, the energy storage device 361 includes one or more batteries, one or more capacitors, one or more inductors, and the like.

In some embodiments, the power harvesting circuitry 359 includes one or more rectifying circuits and/or one or more power converters. In some embodiments, the power harvesting circuitry 359 includes one or more components (e.g., a power converter) configured to convert energy from power waves and/or energy pockets to electrical energy (e.g., electricity). In some embodiments, the power harvesting circuitry 359 is further configured to supply power to a coupled electronic device, such as a laptop or phone. In some embodiments, supplying power to a coupled electronic device include translating electrical energy from an AC form to a DC form (e.g., usable by the electronic device).

In some embodiments, the optional signature-signal generating circuit 310 includes one or more components as discussed with reference to FIGS. 3A-3D of commonly-owned U.S. Patent Publication No. 2019/0245389, which is incorporated by reference in its entirety for all purposes.

In some embodiments, the antenna(s) 360 include one or more of the meandering line antennas that are described in further detail in PCT Patent Application No. PCT/US2017/065886 (U.S. Pat. No. 10,256,677), which is incorporated by reference in its entirety for all purposes (e.g., with particular reference to FIGS. 6A-7D, and elsewhere). In some embodiments, the antenna(s) 360 may also or alternatively include capacitive charging couplers (such as those described with reference to FIGS. 5A-5B of commonly-owned U.S. Patent Publication No. 2019/0245389, which was incorporated by reference above) that correspond in structure to those that may be present in a near-field power transmitter.

In some embodiments, the receiver device 304 includes one or more output devices such as one or more indicator lights, a sound card, a speaker, a small display for displaying textual information and error codes, etc. In some embodiments, the receiver device 304 includes a location detection device, such as a GPS (global positioning satellite) or other geo-location receiver, for determining the location of the receiver device 304.

In various embodiments, the one or more sensors 362 include one or more thermal radiation sensors, ambient temperature sensors, humidity sensors, IR sensors, occupancy sensors (e.g., RFID sensors), ambient light sensors, motion detectors, accelerometers, and/or gyroscopes. It is noted that the foreign object detection techniques can operate without relying on the one or more sensor(s) 362.

The communication component(s) 354 enable communication between the receiver device 304 and one or more communication networks. In some embodiments, the communication component(s) 354 are capable of data communications using any of a variety of custom or standard wireless protocols (e.g., IEEE 802.15.4, Wi-Fi, ZigBee, 6LoWPAN, Thread, Z-Wave, Bluetooth Smart, ISA100.11a, WirelessHART, MiWi, etc.) custom or standard wired protocols (e.g., Ethernet, HomePlug, etc.), and/or any other suitable communication protocol, including communication protocols not yet developed as of the filing date of this document. It is noted that the foreign object detection techniques can operate without relying on the communication component(s) 354.

The communication component(s) 354 include, for example, hardware capable of data communications using any of a variety of custom or standard wireless protocols (e.g., IEEE 802.15.4, Wi-Fi, ZigBee, 6LoWPAN, Thread, Z-Wave, Bluetooth Smart, ISA100.11a, WirelessHART, MiWi, etc.) and/or any of a variety of custom or standard wired protocols (e.g., Ethernet, HomePlug, etc.), or any other suitable communication protocol, including communication protocols not yet developed as of the filing date of this document.

The memory 356 includes high-speed random access memory, such as DRAM, SRAM, DDR SRAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory 356, or alternatively the non-volatile memory within memory 356, includes a non-transitory computer-readable storage medium. In some embodiments, the memory 356, or the non-transitory computer-readable storage medium of the memory 356, stores the following programs, modules, and data structures, or a subset or superset thereof:

- Operating logic 366 including procedures for handling various basic system services and for performing hardware dependent tasks;
- Communication module 368 for coupling to and/or communicating with remote devices (e.g., remote sensors, transmitters, receivers, servers, mapping memories, etc.) in conjunction with communication component(s) 354;
- Optional sensor module 370 for obtaining and processing sensor data (e.g., in conjunction with sensor(s) 362) to, for example, determine the presence, velocity, and/or positioning of the receiver 103, a RF power transmitter device 100, or an object in the vicinity of the receiver 103;
- Wireless power-receiving module 372 for receiving (e.g., in conjunction with antenna(s) 360 and/or power harvesting circuitry 359) energy from, capacitively-conveyed electrical signals, power waves, and/or energy pockets; optionally converting (e.g., in conjunction with power harvesting circuitry 359) the energy (e.g., to direct current); transferring the energy to a coupled electronic device; and optionally storing the energy (e.g., in conjunction with energy storage device 361);
- Database 374, including but not limited to:
  - Sensor information 376 for storing and managing data received, detected, and/or transmitted by one or more sensors (e.g., sensors 362 and/or one or more remote sensors);

Device settings 378 for storing operational settings for the receiver 103, a coupled electronic device, and/or one or more remote devices; and Communication protocol information 380 for storing and managing protocol information for one or more protocols (e.g., custom or standard wireless protocols, such as ZigBee, Z-Wave, etc. and/or custom or standard wired protocols, such as Ethernet);

A secure element module 382 for providing identification information to the RF power transmitter device 100 (e.g., the RF power transmitter device 100 uses the identification information to determine if the wireless-power receiver 304 is authorized to receive wirelessly delivered power); and An optional signature-signal generating module 383 used to control (in conjunction with the signature-signal generating circuit 310) various components to cause impedance changes at the antenna(s) 360 and/or power harvesting circuitry 359 to then cause changes in reflected power as received by a signature-signal receiving circuit 240.

Each of the above-identified elements (e.g., modules stored in memory 356 of the receiver 304) is optionally stored in one or more of the previously mentioned memory devices, and corresponds to a set of instructions for performing the function(s) described above. The above-identified modules or programs (e.g., sets of instructions) need not be implemented as separate software programs, procedures, or modules, and thus various subsets of these modules are optionally combined or otherwise rearranged in various embodiments. In some embodiments, the memory 356, optionally, stores a subset of the modules and data structures identified above. Furthermore, the memory 356, optionally, stores additional modules and data structures not described above, such as an identifying module for identifying a device type of a connected device (e.g., a device type for an electronic device that is coupled with the receiver 304).

In some embodiments, the near-field power transmitters disclosed herein may use adaptive loading techniques to optimize power transfer. Such techniques are described in detail in commonly-owned and incorporated-by-reference PCT Application No. PCT/US2017/065886 and, in particular, in reference to FIGS. 3A-8 and 12-15 of PCT Application No. PCT/US2017/065886.

In some embodiments, the receiver device 304 is coupled to or integrated with an election device, such as a phone, a tablet, a laptop, a hearing aid, smart glasses, headphones, computer accessories (e.g., mouse, keyboard, remote speakers), and/or other electrical devices. In some embodiments, the receiver device 304 is coupled to or integrated with small consumer device, such as a fitness band, a smart watch, and/or other wearable product. Alternatively, in some implementation, the receiver device 304 is an electronic device.

Figure 4:
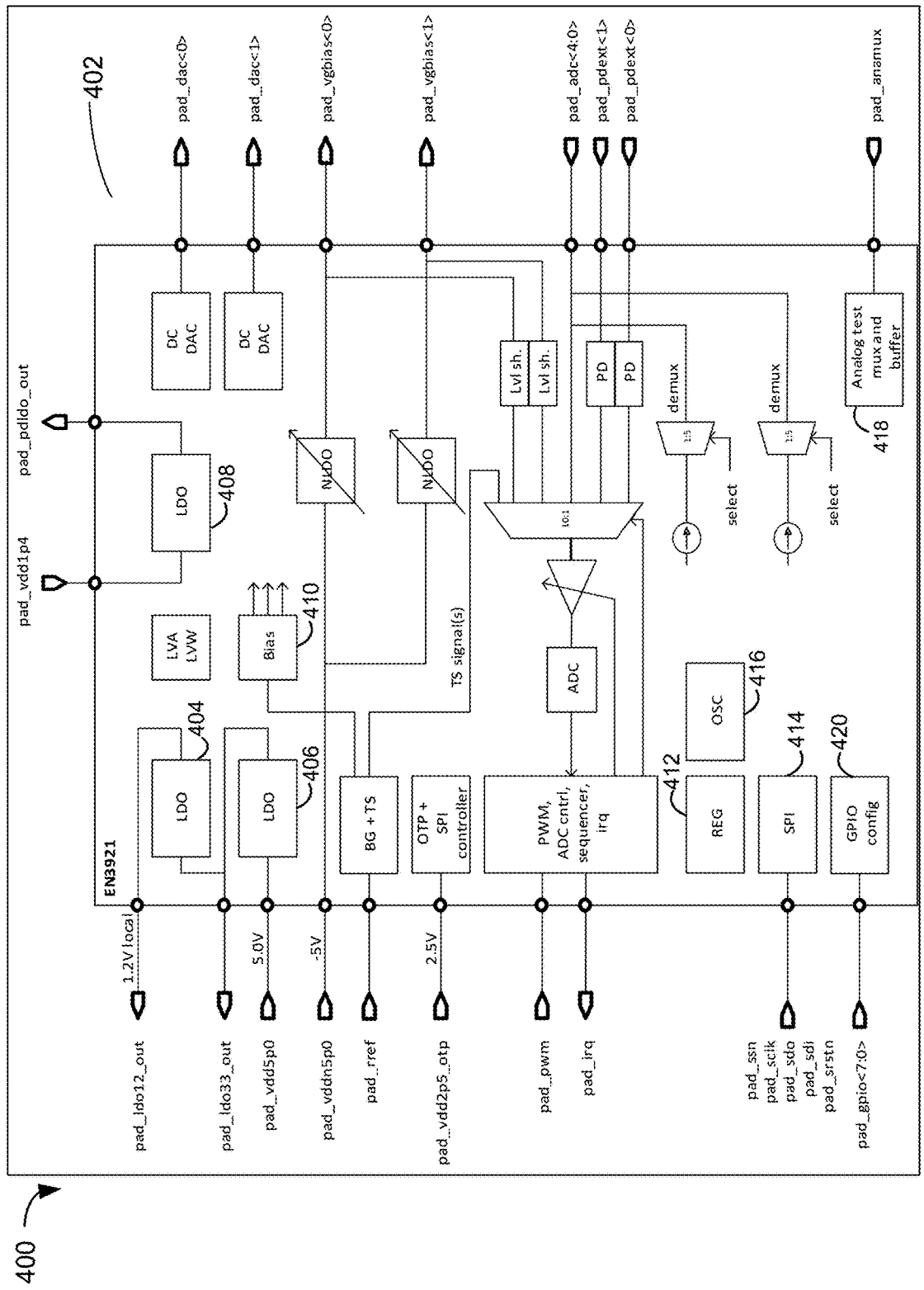
FIG. 4 shows a power amplifier controller engineering diagram, in accordance with some embodiments.

FIG. 4 shows a power amplifier controller engineering diagram 400, according to some embodiments. In some embodiments, the power amplifier includes a controller 402 (e.g., PAIC 161A). Alternatively or additionally, in some embodiments, the RFIC 160 includes the controller 402. In some embodiments, the controller 402 a standalone component coupled to the RFIC 160 and/or the power amplifier. In some embodiments, the power amplifier controller 402 includes an LDO (Low Dropout) 404. In some embodiments, the power amplifier controller 402 includes an LDO 406. In some embodiments, the power amplifier controller 402 includes an LDO 408. In some embodiments, the power amplifier controller 402 includes a Bias 410. In some embodiments, the power amplifier controller 402 includes an REG (register) 412. In some embodiments, the power amplifier controller 402 includes an SPI (serial peripheral interface) 414. In some embodiments, the power amplifier controller 402 includes an OSC (e.g., on-board calibrated oscillator) 416. In some embodiments, the power amplifier controller 402 includes an Analog test mux and buffer 418. In some embodiments, the PAIC 161A includes flexible general-purpose input/output (GPIO) 420.

In some embodiments, the PAIC 161A includes a system status state machine with programmable alarm thresholds and/or an interruption request (IRQ) generator. In some embodiments, the PAIC's 161A includes multi-output negative bias control. In some embodiments, the PAIC's 161A includes at least one or more of: multi-channel ADCs and DACs, dual power detectors, and a temperature sensor. In some embodiments, one or more modules within the power amplifier controller 402 are optional. For instance, to control the power amplifier, the PAIC 161A utilizes the single digital pin for the power amplifier enable/disable (e.g., power amplifier sequencing discussed above), the multi-output negative bias control, and the on-board calibrated oscillator. To perform impedance detection/sensing, the PAIC 161A utilizes the system status state machine with programmable alarm thresholds, the IRQ generator, the multi-channel ADC and DAC, dual power detectors, the temp sensor, the SPI high speed host interface, and the flexible GPIO. In some embodiments, the PAIC 161A can be split into two separate chipsets to control the power amplifier and perform impedance detection/sensing, respectively.

Figure 5A:
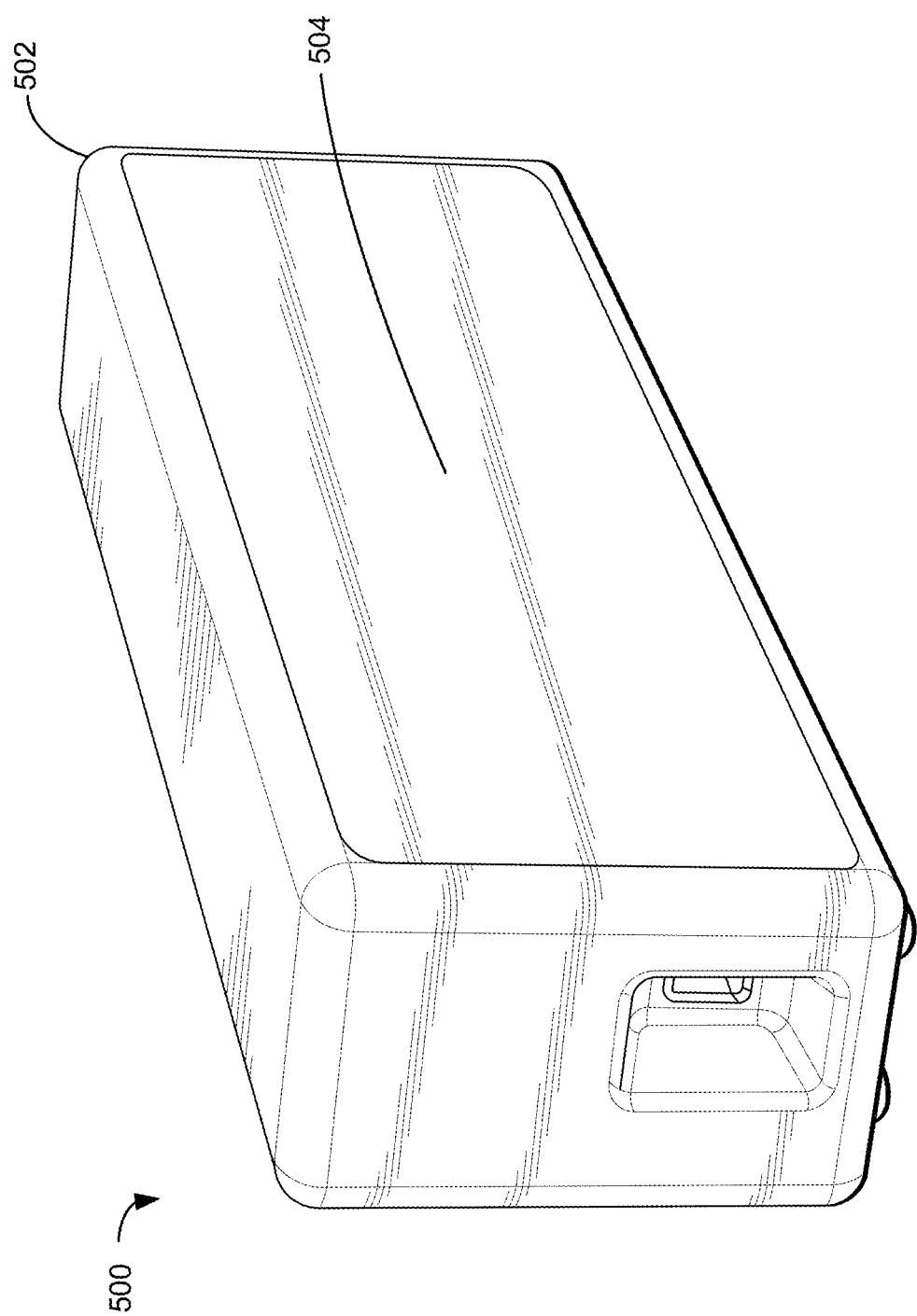
FIGS. 5A and 5B are isometric illustrations of a device (e.g., an electronic device, such as a smart speaker) with an included wireless-power transmitter (and, in some embodiments, the device also includes at least two sensors that are used for ranging and object-classification purposes, or one sensor, such as the capacitive sensor integrated with an antenna, that can be configured to provide data used to perform ranging and object-classification functions), in accordance with some embodiments.

FIG. 5A is an isometric illustration of a device 500 including a wireless-power transmitter device (e.g., any wireless-power transmitter device 100 described above in reference to FIGS. 1A-2) or operating as a wireless-power transmitter device 100, according to some embodiments. The device 500 includes an enclosure housing 502 and a front face 504. The device 500 can have an integrated or included wireless-power transmitter device 100. In some embodiments, the device 500 uses one or more components of the wireless-power transmitter device 100 to provide wireless power to receiver devices 304 (FIG. 3). For example, the device 500 can utilize one or more sensors (e.g., at least two sensors of at least two different types or one sensor that is integrated with an antenna), one or more antennas, one or more power amplifiers, and/or one or more integrated circuits of the wireless-power transmitter device 100 to radiate RF energy as described herein. In some embodiments, the device 500 can include a single antenna (e.g., a loop antenna) and a single power amplifier. In some embodiments, the device 500 can include one or more antennas with integrated sensors as described below in reference to FIGS. 9A-10D. In some embodiments, the wireless-power transmitter device 100 is integrated with or included within an electronic device enclosure such as that of a television, a display, a laptop, a gaming system or video player, television set top box or similar device. Alternatively, in some embodiments, the wireless-power transmitter device 100 is a standalone device. In some embodiments, the device 500 is a smart speaker (as illustrated in FIGS. 5A-5C and 8A-8C).

In some embodiments, the device 500 is configured to provide wireless power to one or more client devices (e.g., wireless-power receivers 304, or an electronic device with an integrated or coupled wireless-power receiver 304 as described above in FIG. 3) within its transmission field. In some embodiments, the device 500 is configured to provide wireless power to at least two client devices within its transmission field. More specifically, the device 500 is configured to provide wireless power to multiple client devices within its transmission field. In some embodiments, the transmission field extends away from the front face 504 of the device 500. The transmission field of the device 500 is an instance of one or more antenna coverage area(s) 190 (described above in reference to FIGS. 1A-1D).

Figure 5B:
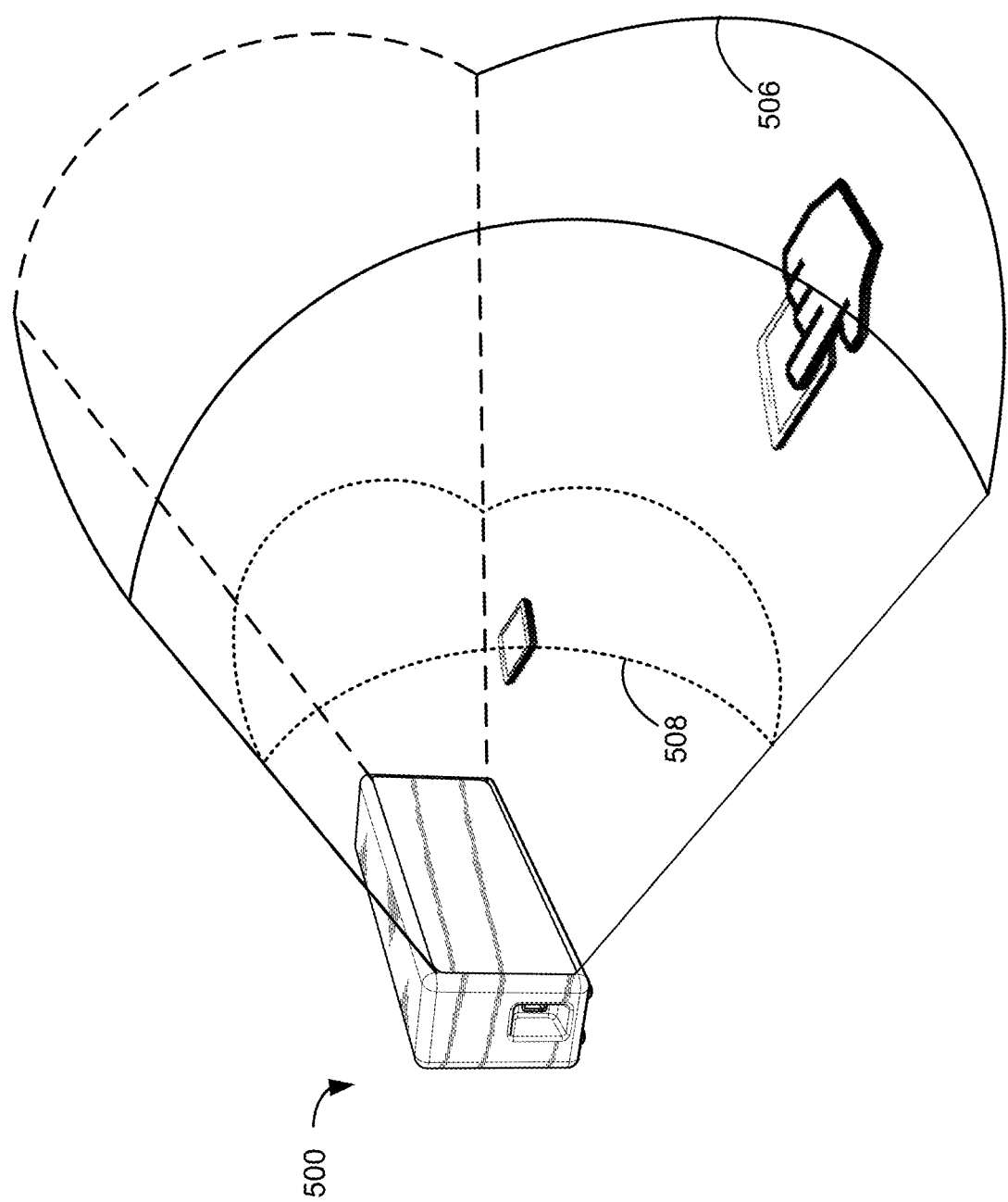

FIG. 5B is an isometric illustrations of a three-dimensional space of a transmission field 506 and a keep-out zone 508, in accordance with some embodiments.

Figure 5C:
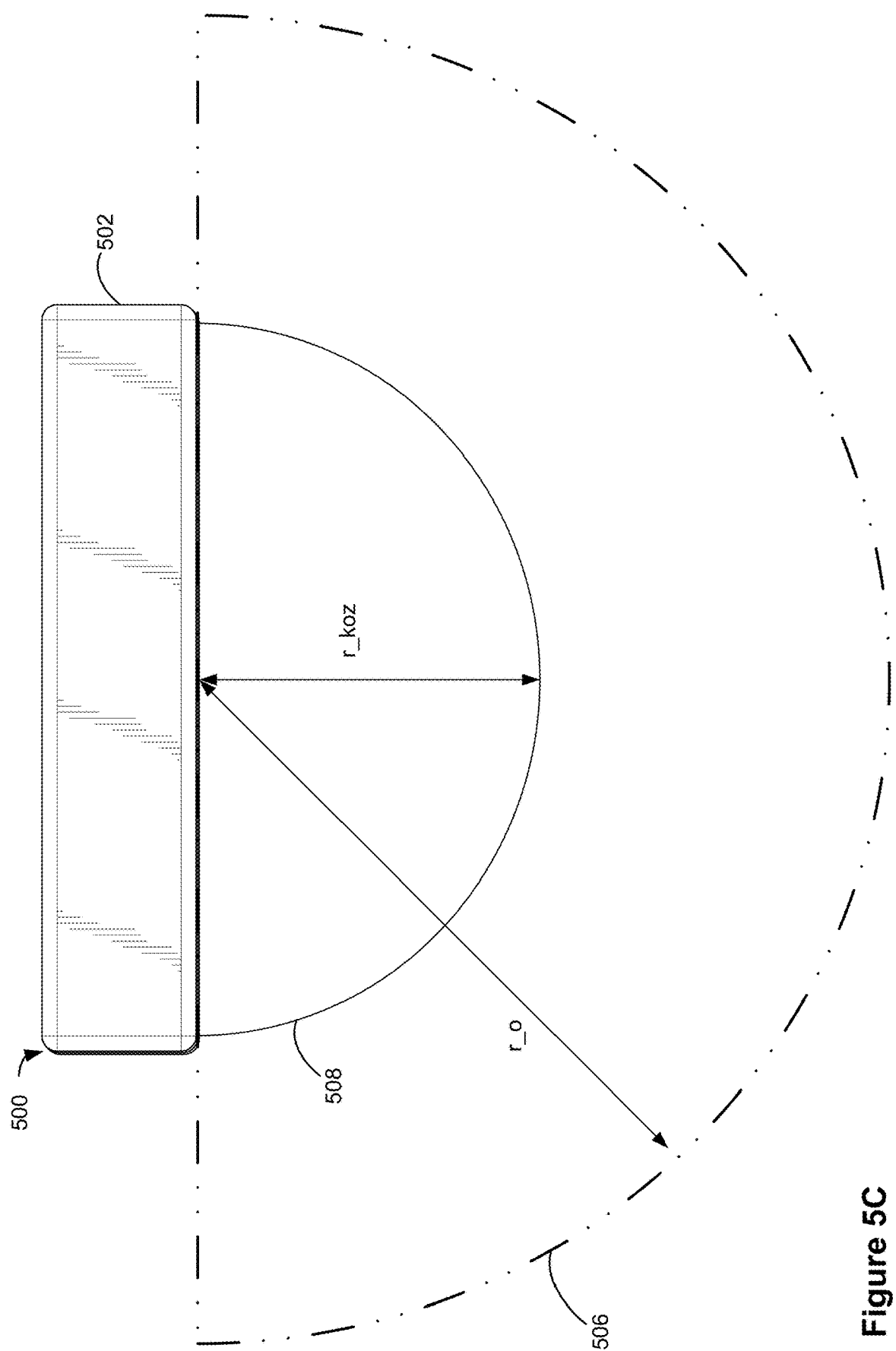
FIG. 5C is a top view of the device with and its associated transmission field (e.g., an area of space extending away from an exterior housing of the device into which an included wireless-power transmitter of the device transmits radio-frequency energy to one or more receiving devices), in accordance with some embodiments.

FIG. 5C is a top view of the device 500 and its transmission field, according to some embodiments. For ease of illustration, the three-dimensional spaces of the transmission field 506 and the keep-out zone 508 are represented in two dimensions. In some embodiments, the transmission field 506 is a space directly in front of the device's 500 one or more antennas 130 (FIGS. 1A-1D and FIG. 8A-9C). For example, the transmission field 506 has a shape of a portion of an oval or circle extending from the front face 504 of the device 500. In some embodiments, the transmission field 506 extends no greater than 15 cm (+/−2 cm) away from the front face 504 of the device 500. In some embodiments, the transmission field 506 extends no greater than 30 cm (+/−2 cm) away from the front face 504 of the device 500. In some embodiments, the transmission field 506 extends no greater than 1 meter (+/−2 cm) away from the front face 504 of the device 500. More specifically, in some embodiments, the transmission field 506 has a first predetermined radius (operating radius "r_o") from the front face 504 of the device 500 (also shown in FIG. 5B). The first predetermined radius extends radially from a center point of the device 500, as is depicted in FIG. 5B. In some embodiments, the predetermined radius of the transmission field 506 includes a margin of error (e.g., 2% to 5%) that extends the transmission field slightly beyond the boundary used for illustrative purposes.

The device 500 is configured to transmit (e.g., radiate) RF energy that can be received a location of a receiver device 304. In some embodiments, the radiated RF energy is based on an amplified RF signal provided to the one or more antennas of the device 500 from the power amplifier. The amplified RF signal, when received by the one or more antennas, cause the one or more antennas to radiate the RF energy focused at the client device within the transmission field 506 of the device 500. In some embodiments, the radiated RF energy is focused at the client device within the transmission field 506 while forgoing any active beamforming control (e.g., the wireless-power transmitter device 100 does not modify the phase, gain, etc. of the radiated RF energy for beamforming purposes). Radiating RF energy focused at a client device within the transmission field 506, in some embodiments, means that a peak level of RF energy is at its maximum at the location of the client device.

The device 500 transmits RF energy in accordance with a determination that one or more sensitive objects are not within a keep-out zone 508 of the device 500 as discussed below. The keep-out zone 508 is an area of space in front of the device 500. In some embodiments, the keep-out zone 508 is not symmetrically shaped (e.g., can have a shape that is distinct from a shape of the transmission field 506). For example, the keep-out zone 508 can include side lobes and/or need to implement SAR exclusion at top of the device 500. In some implementations, the device 500 can detect objects on the sides, top, bottom and other locations of the field-of-view (FOV) angle of the device 500. The FOV angle, as used herein, is a "cone angle" expressed in degrees. In some implementations, the one or more sensors 165 have a wide FOV angle of at least 90 degrees (and positioned so multiple sensors have zonal overlap). In other words, each sensor of the one or more sensors 165 can have a view angle of at least 90 degrees (e.g., at least 45 degrees in each direction from a centerline (or center detection position) of the sensor). In some embodiments, the keep-out zone is an area of space in which an overall SAR value is above (US and/or European) regulatory standards and/or above safety thresholds (i.e., at unsafe levels for living or biological organisms). For example, the SAR value within the keep-out zone may be at least 1.6 W/kg. In some embodiments, the SAR value within the keep-out zone may be at or above 2.0 W/kg. In other words, the keep-out zone 508 is a boundary where absorbed power is at or exceeds a safety metric (i.e., a SAR value at or exceeding regulatory standards).

In some embodiments, the keep-out zone 508 is no greater than 10 cm (+/−2 cm) away from the front face 504 of the device 500. In some embodiments, the keep-out zone 508 is no greater than 15 cm (+/−2 cm) away from the front face 504 of the device 500. In some embodiments, the keep-out zone 508 is no greater than 20 cm (+/−2 cm) away from the front face 504 of the device 500. More specifically, in some embodiments, the keep-out zone 508 is defined by a second predetermined radius (keep-out zone radius "r_koz" in FIG. 5B) away from the front face 504 of the device 500. The second predetermined radius is distinct from (and smaller than) the first predetermined radius of the transmission field 506. The second predetermined radius extends from a center point of the device 500. In some embodiments, the keep-out zone 508 covers the entire front face 504. While radii are used as examples of ways to define the keep-out zone ("r_koz" in FIG. 5B) and transmission field/operating area ("r_o" in FIG. 5B), one of skill in the art upon reading this disclosure will also recognize that area of volumes of space can also be used. For instance, the keep-out zone can be defined by a first volume of space extending away from the front face 504, while the transmission filed/operating area can be defined by a second volume of space (larger than the first volume of space and, in some cases, at least twice as large as the first volume of space) extending away from the front face 504.

In some embodiments, the device 500 utilizes at least two sensors (e.g., two sensors 165 depicted in FIGS. 1A-2 and also described in reference to these figures). In some embodiments, the at least two sensors include a first subset of sensors and a second subset of sensors. In some embodiments, the first subset of sensors and the second subset of sensors include different types of sensors. Alternatively, in some embodiments, the first subset of sensors and the second subset of sensors are similar (or the same) sensors that are configured to perform different functions (e.g., one function being a ranging detection for detecting presence of objects within the keep-out zone and a second function being an object-classification function for classifying objects as certain types of objects within the transmission field). In some embodiments, the first subset of sensors and the second subset of sensors are similar (or the same) sensors that are configured to switch between different functions (e.g., switching from the ranging function to the object-classification function, which can occur for example once an object is detected in the keep-out zone while one sensor is performing the ranging function, which can then cause the one sensor to switch to the object-classification function to then determine what type of object is in the keep-out zone. In some embodiments or circumstances, a same set of data from the one sensor can be used for both ranging and object-detection purposes.).

In some embodiments, the at least two sensors are located within the enclosure housing 502. Additionally or alternatively, in some embodiments, one or more sensors are included or coupled to an interior or exterior of the enclosure housing 502. For example, in some embodiments, one or more sensors may be located in or at one or more corners, the top center, the bottom center, directly in the center, on one or more of the edges, and/or any other position of the enclosure housing 502. In some embodiments, one or more sensors of the at least two sensors are integrated with the one or more antennas as described below in reference to FIG. 9A-9C. Examples of the different types of sensors were also described above in reference to FIG. 2.

In some embodiments, the first subset of sensors includes one or more sensors. In some embodiments, the number of sensors included in the first subset of sensors is based on the specifications of the device 500. In particular, the number of sensors included in the first subset of sensors may be based on the dimensions (length, width, depth) of the device 500, the size of transmission field 506, the size of the keep-out zone 508, and other factors. Alternatively, in some embodiments, the number of sensors included in the first subset of sensors is based on the FOV angle (e.g., at least 90 degrees for a single sensor) of the device 500. In particular, in some embodiments, the first subset of sensors requires a predetermined number of sensors such that the first subset of sensors detect one or more objects within the FOV angle of the device 500. In some embodiments, the first and second sensor data is used together to help determine the number of objects within the keep-out zone.

In some embodiments, the first subset of sensors can be configured to operate as ranging sensors. In particular, the first subset of sensors is configured to accurately detect (e.g., accurately detect range of distance of objects within about +/−5 mm of the object's true location) one or more objects entering, exiting, and/or within the keep-out zone 508. Additionally, the first subset of sensors is configured to detect one or more objects that are stationary (or non-moving) within the keep-out zone 508. For example, the first subset of sensors can detect a pencil, a rolling ball, a cup, an unauthorized receiver (e.g., a receiver device 304 without a recognized signature signal as described above in reference to FIGS. 2 and 3), and/or any other object that may have been left or stops moving within the keep-out zone 508.

In some embodiments, the first subset of sensors is configured to sense data regarding objects located at a predetermined distance or boundary. In some embodiments, the predetermined distance or boundary is equal to the second predetermined radius (keep-out zone radius "r_koz"). In some embodiments, the first subset of sensors has a maximum range sensing threshold such that movement that occurs outside of this threshold is not detected or, even if detected, is discarded. In some embodiments, the maximum range sensing threshold is equal to the second predetermined radius +/−2 cm (or +/−5% of the size of the keep-out zone). In some embodiments, the first subset of sensors is configured such that no data is sensed outside of the maximum range sensing threshold. In other embodiments, the device 500 (and its included RF IC 160 and PA IC 161A) receive data from the first subset of sensors, but the portion of that data corresponding to sensor readings outside of the maximum range sensing threshold is discarded. Alternatively or additionally, in some embodiments, the first subset of sensors (continuously) provides first sensor data to the device 500, which compares the first sensor data with stored threshold measurements and/or other determined measurements to detect or verify detection of an object. Although the first subset of sensors can be configured such that data is sensed outside maximum range sensing threshold, the first subset of sensors can sense objects at greater distances.

In some embodiments, the first subset of sensors detects moving and non-moving (stationary) objects. In some embodiments, the device 500 is configured to discard sensor data from the first subset of sensors that corresponds to stationary objects. In this way, stationary objects (which can include objects that have already been detected and classified and which do not need to be processed further until new movement of those objections is detected) do not receive additional processing by the device 500, which can instead focus on processing data associated with other objects that are newly entering or exiting the keep-out zone 508.

In some embodiments, the second subset of sensors includes one or more sensors. In some embodiments, the number of sensors included in the second subset of sensors is determined as described above with respect to the number of sensors for the first subset of sensors. The second subset of sensors is configured to operate as object-classification sensors. In particular, the second subset of sensors is configured to provided data that is used to classify one or more objects as sensitive objects. A sensitive object is a living or biological organism (e.g., humans, dogs, cats, plants, etc.). In some embodiments, the second subset of sensors is configured to detect reflected power (e.g., reflected power off human tissue, plastics, etc.)

In some embodiments, the second subset of sensors includes sensors that are non-directional and/or do not provide accurate ranging (e.g., ranging cannot be performed to determined object locations within about +/−5 mm of an object's true location). In some embodiments, the second subset of sensors is general in nature and, at times, over detect in noncritical areas (i.e., areas outside of the keep-out zone 508). As such, the second subset of sensors is configured to provide data used to classify one or more objects within the keep-out zone 508. Additionally or alternatively, in some embodiments, the second subset of sensors is configured to provide data (e.g., second sensor data) used to classify one or more objects within the keep-out zone 508 after the first subset of sensors is triggered (i.e., after the first subset of sensors detects one or more objects within the keep-out zone 508).

In some embodiments, the second subset of sensors is configured to detect second sensor data that is used to classify one or more objects. In some embodiments, the second subset of sensors (continuously) provides the second sensor data to the device 500 (and its included one or more integrated circuits, such as the RC IC 160 and the PA IC 161A). In some embodiments, the device 500 compares the second sensor data with stored threshold measurements and/or other determined measurements to determine whether one or more objects (e.g., detected by the first subset of sensors) are sensitive objects or not.

In some embodiments, the second subset of sensors includes variable output values (i.e., data values that change over time) that can be monitored and/or compared with a threshold value to classify one or more objects. For example, the second subset of sensors (continuously) detect data for an object as it moves within the within the keep-out zone 508 (i.e., the variable output values), and monitors and/or compares the detect data for the object with a threshold value to determine whether the object is a sensitive object or not. In some embodiments, one or more sensors of the second subset of sensors have varying outputs due to their position. For example, a wireless-power transmitter device 100 including a variable power amplifier can operate at different power levels or the wireless-power transmitter device 100 can adjust a radiation profile (based on one or more safety thresholds), and the one or more sensors of the second subset of sensors, based on their position with respect to the wireless-power transmitter device 100 and/or the transmission field, can have varying outputs. In some embodiments, one or more adjustments to the second subset of sensors are applied to compensate for the variable detection threshold offsets at various power levels (of a selected power level or of an adjusted radiation profile). This allows the device 500 to reduce or eliminate false detections.

In some embodiments, the threshold values can include settable trigger levels, which can be set during factory manufacturing, set based on simulated values, and/or set on characterization of the device 500's operation. In some embodiments, the settable trigger levels are adjustable. In some embodiments, the settable trigger levels are dynamically adjusted during operation of the device 500 and/or based on the device's 500 operation. For example, the settable trigger levels may be adjusted based on the number of detected objects, the combination of objects in the transmission field 506 and/or keep-out zone 508, and/or other factors.

As mentioned above, in some embodiments, the first subset of sensors and the second subset of sensors are the same type of sensors, with each subset of sensors configured to operate differently (e.g., ranging detection and object-classification). For example, the at least two sensors can be capacitive sensors (or other sensor type described in FIGS. 1A-2) with a first capacitive sensor being configured for ranging detection and a second capacitive sensor being configured for object classification as described above. Alternatively, in some embodiments, the first subset of sensors and the second subset of sensors are the same sensors (i.e. a single subset of sensors), and the device 500 is able to switch operation of one or more of the sensors. For example, the device 500 can include a single subset of sensors with each sensor in a ranging detection mode (or configured for ranging detection) and, upon detection of an object, switch (or reconfigure) at least one sensor of the single subset of sensors to an object-classification mode. In some embodiments, the device 500 can uniformly switch (or reconfigure) the operating mode of the single subset of sensors (i.e., all sensor configured for ranging detection or all sensors configured for object-classification). In some implementations, a single sensor is used for ranging detection and object classification. For example, the single sensor can be in a ranging detection mode, and switched to an object-classification mode (e.g., when an object is detected in ranging detection mode).

In some embodiments, the device 500 performs sensor integrity checks (i.e., sensor failure detection). One or more sensor integrity checks include determining whether the provided sensor data is continually unreasonable or radically out of bound of certain characteristics or specifications of the device 500 (e.g., excessive capacitance readings relative to stored thresholds for a sensor configuration (i.e., ranging or object-classification mode)); communication between any sensor and the device 500 stops (i.e., a sensor does not provide any acknowledgement, read back of known data failure, etc.); responses to device 500 queries do not come back in the expected timeframe (e.g., 1 ms or less, 3 ms or less, etc.) If one or more of the above situations are detected, the device 500 assumes a sensor failure. In some embodiments, the device 500 reduces a power level of the power amplifier 120 (FIG. 1A-1D) to a safe level, or is disabled in response to detecting such a sensor-failure condition. In some embodiments, the device 500 is disabled until a power cycle is performed. Once a power cycle is performed, the device 500 re-performs the sensor integrity checks.

In some embodiments, the first subset of sensors and the second subset of sensors can be used to compensate for one or more failures. For example, the device 500 can reconfigure one or more sensors of a first subset of sensors (configured to operate for range detection) to operate in an object-classification operation based on a second subset of sensors failing, and vice versa. Alternatively, in some embodiments, the first subset of sensors can perform one or more operations of the second subset of sensors, and vice versa. In this example situation, the first subset of sensors and the second subset of sensors can perform both functions with slight degradations (e.g., reduced range of 2% from baseline). In this way, a failure at either the first subset of sensors or the second subset of sensors does not impact the overall safety improvements that the sensors offer to the device 500's overall operations.

In some embodiments, depending on the nature and/or size of the receiver devices 304 being charged, the receiver devices 304 may be initially detected as sensitive objects (i.e., false positives). For example, larger dimensions, materials, metallic content may skew a reading slightly above the sensitive object threshold value or trigger levels (described above in reference to the second subset of sensors) when placed near the device 500. This results in the device 500 erroneously determining that a sensitive object is in the keep-out zone 508. To help correct this erroneous detection, in some embodiments, the receiver device 304 also provides data via communication signals (e.g., using BLE) to the device 500), which can then be used to offset the risk of erroneous detections of sensitive objects. In some embodiments, the receiver device 304 provides data via communication signals whenever it is in communication range (e.g., an area at least as large as the transmission field 506) of the device 500. Alternatively, in some embodiments, the device 500 requests data via communication signals from the receiver devices 304 (or other detected object) after a sensitive object is detected.

The communication signals allow the device 500 and the receiver device 304 to use the data to validate one another. After the device 500 (and/or wireless-power transmitter device 100) validates the receiver device 304, a bias or offset value is applied to the second subset of sensors detection threshold (i.e., the device 500 raises the sensitive object threshold value or adjusts the trigger levels). The bias or offset value disables the initial false detection and still allows subsequent detection of sensitive objects (e.g., human intrusion) from afar. In particular, the bias or offset value allow the device 500 to transmit RF energy to the receiver device 300 while also continuing to allow the device 500 to detect sensitive objects entering the keep-out zone 508. In some embodiments, the bias or offset value is removed after the receiver device 304 is removed and/or the receiver device 304 and the device 500 cease communicating.

While the above descriptions concerning processing of sensor data for purposes of performing ranging and object-classification functions referred to the device 500 as performing certain operations, one of skill will understand upon reading these descriptions that components of the device 500 are used in the performance of these operations (e.g., one or more integrated circuits of the device 500, such as the RC IC 160 and/or the PA IC 161A are used in the performance of the described operations for the device 500).

Figure 6A:
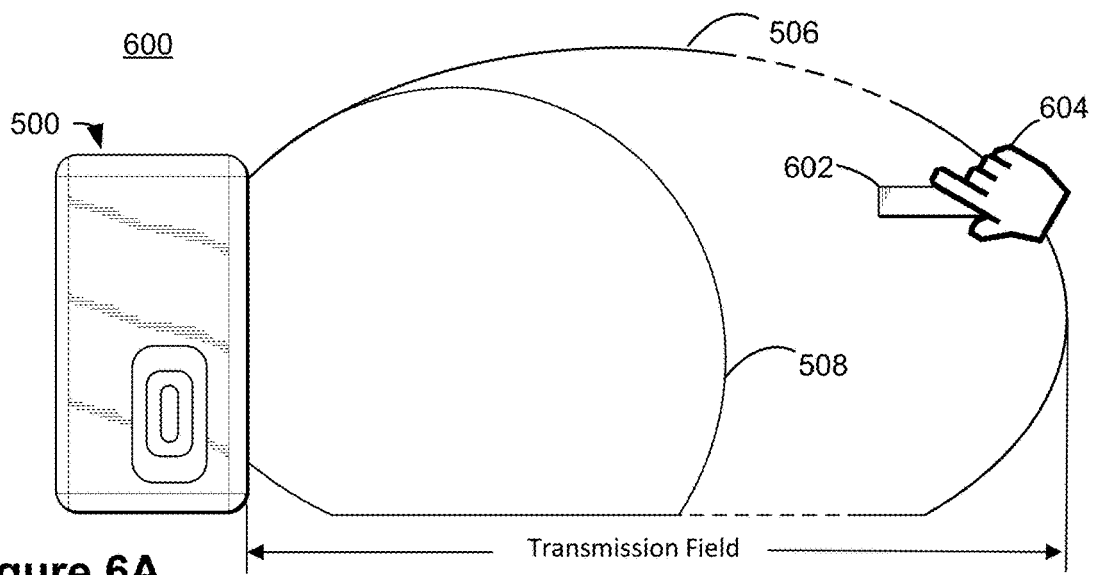
FIGS. 6A-6C illustrate side views of one example operation scenario for the device, according to some embodiments.
Figure 6B:
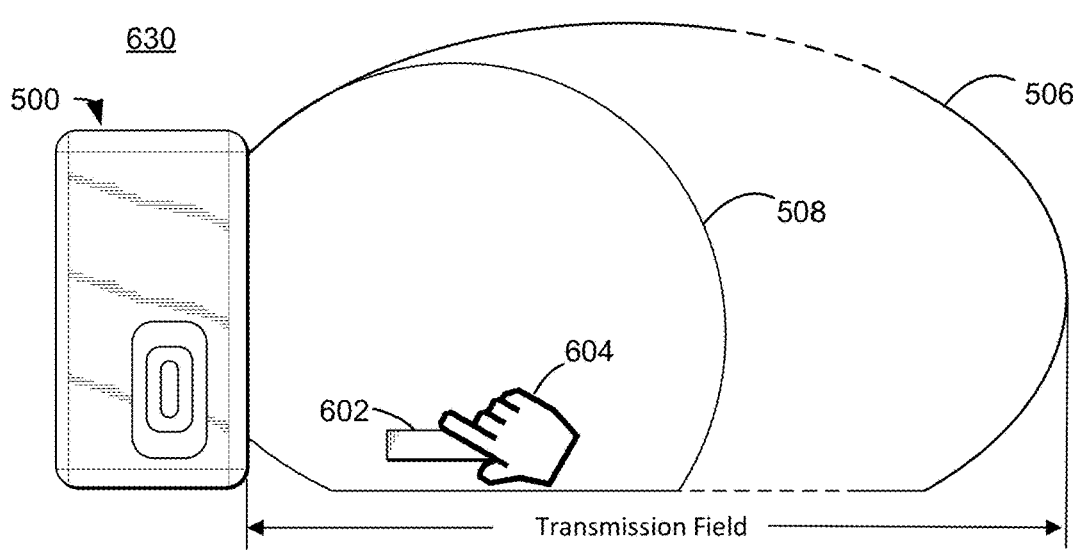
Figure 6C:
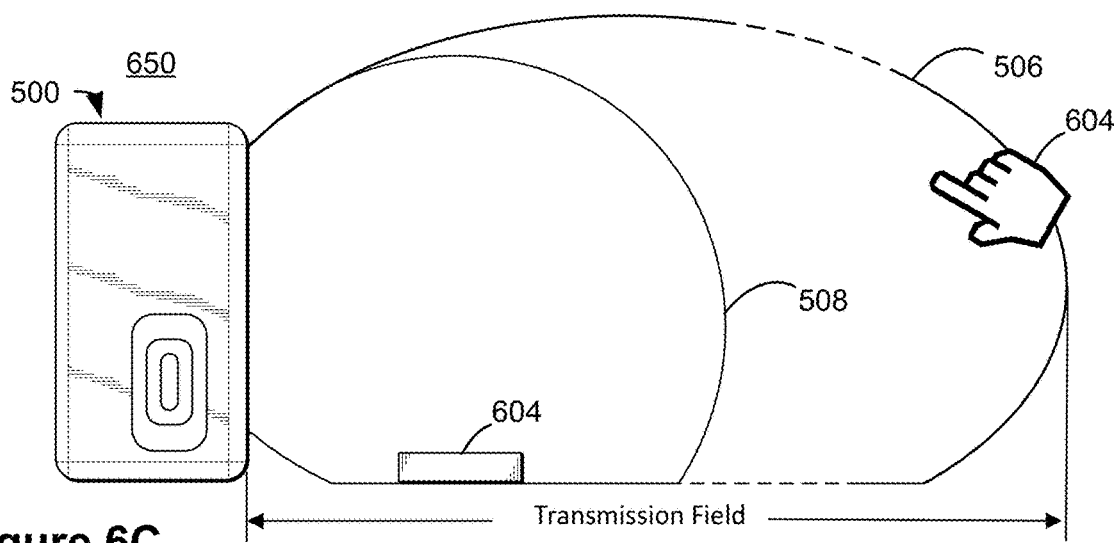

FIGS. 6A-6C illustrate side views of an operation scenario for the device 500, according to some embodiments. The different side views include the device 500, transmission field 506, keep-out zone 508, a client device 602 (including a wireless-power receiver 304, which can be coupled with an electronic device), and a user 604 (represented by a human hand). In some embodiments, the client device 602 is a small consumer device, such as a fitness band, a smart watch, and/or other wearable product with a wireless-power receiver 304 coupled thereto. Additional examples of a consumer device include a phone, a tablet, a laptop, a hearing aid, smart glasses, headphones, computer accessories (e.g., mouse, keyboard, remote speakers), and/or other electrical devices.

In a first view 600, the client device 602 is moved within the transmission field 506 of the device 500 to receive wireless power transmitted from the device 500. More specifically, a user 604 holding the client device 602 enters the transmission field 506 of the device 500 to charge the client device. As illustrated in side view 600 of FIG. 6A, in some embodiments, the transmission field 506 is larger than the keep-out zone 508. The keep-out zone 508 is an area within the transmission field 506. While the keep-out zone 508 has SAR values above safety thresholds or that do not comply with regulatory standards, a remainder of the transmission field 506 (e.g., that portion of the transmission field 506 other than the keep-out zone 508) may, in some scenarios, may be in compliance with regulatory standards or have SAR values below safety thresholds. As such, in some scenarios, when the user 604 enters or is within the remainder of the transmission field 506, the device 500 may not need to be disabled (i.e., stop the transmission of wireless power to another electronic device with a wireless-power receiver that can be also be within the transmission field 506).

On the other hand, when the user 604 enters or is within the keep-out zone 508 (described in more detail with reference to FIG. 6B below), transmission of wireless power by the device 500 needs to be disabled or adjusted to protect the user 604. In the example of FIG. 6A, the device 500, using one or more sensors, detects that one or both of the client device 602 and user 604 has entered the transmission field 506. For example, in some embodiments, the device 500 uses one or more sensors (e.g., capacitive sensors, IR sensors, or other examples of sensors described in reference to FIG. 2) to measure reflected power within the transmission field 506 to determine one or more changes in the transmission field 506, and based on the measured reflected power determines that one or both of the client device 602 and user 604 has entered the transmission field 506. In the example of FIG. 6A, because the user 604 has not entered the keep-out zone 508, transmission of wireless power to another electronic device that might also be within the transmission field 506 does not need to be interrupted.

In a second view 630, the client device 602 is moved within the keep-out zone 508 of the device 500 to receive wireless-power transmitted from the device 500. More specifically, a user 604 holding the client device 602 enters the keep-out zone 508 of the device 500 to charge the client device 602. As described above, when the user 604 enters or is within the keep-out zone 508, the device 500 disables transmission of wireless power or adjusts the radiation profile. In one example, the device 500 uses at least two sensors to detect and then classify one or both of the client device 602 and the user 604. More specifically as to this example, the device 500 uses a first subset of sensors to perform a ranging function and determine when one or both of the client device 602 and the user 604 has entered the keep-out zone 508, and uses a second subset of sensors to help determined whether one or both of the client device 602 and the user 604 should be classified as sensitive objects. In some embodiments, the object-classification function is performed after the ranging function has been performed (i.e., data from the first subset of sensors is used to determine that an object is within the keep-out zone 508 and then the second subset of sensors is activated to perform the object-classification function and determine whether the object is a sensitive object). If the device 500 classifies any object within the keep-out zone as a sensitive object, then the device 500 stops transmitting wireless power.

In some embodiments, after sensor data from one or both of the first subset of sensors and the second subset of sensors trigger detection or a sensitive object threshold, the device 500 adjusts a hysteresis timer and disables or adjusts the transmission of wireless-power in accordance with the hysteresis timer. The hysteresis timer is a time window in which the device 500 does not transmit wireless power (i.e., is disabled). Alternatively, in some implementations, the hysteresis timer is a time window in which the device 500 the transmission of wireless power is delayed (or pulsed) until an object-classification or other determination described herein can be made. In other words, instead of shutting the device 500 on and off each time an object is detected by one or more of the first subset of sensors and the first subset of sensors, the device 500 is able to pulse the transmission of wireless power (or increase the length of the pulse). In some embodiments, triggering of both the first subset of sensors and the second subset of sensors causes the device to adjust the hysteresis timer. Alternatively, in some embodiments, triggering of one of the first subset of sensors or the second subset of sensors causes the device to adjust the hysteresis timer. Example values for the hysteresis timer include 100, 50, or 20 milliseconds.

In some embodiments, the device 500 resamples data from one or both of the first subset of sensors and the second subset of sensors to perform the ranging and object-classification functions described above at predetermined time increments (such as every 10 milliseconds or every 15 milliseconds). Each time the device 500 determines that an object is within a threshold range (e.g., within the keep-out zone 508) and that the object is classified as a sensitive object, then the device 500 adds to the hysteresis timer up to a certain maximum hysteresis value, such as 7 seconds. In this way, the hysteresis timer does not grow indefinitely. The net effect of the hysteresis timer is to behave as a noise filter for weak detection scenarios where detection of wireless-power receivers and/or living or biological organisms is discontinuous and/or inconsistent. More specifically, the device 500 is able to adjust the hysteresis timer based on an initial detection of an object (whether a false positive or not), and further adjust the hysteresis timer based on resampled data from one or both of the first subset of sensors and the second subset of sensors to remove false positives or reaffirm an initial sensitive object detections. Example of weak detection scenarios include reduced reflected power measurements, reduced impedance measurement, and/or other similar scenarios.

In a third view 650, the client device 602 is placed on a surface (e.g., table, counter, etc.) adjacent to the device 500 and within the keep-out zone 508 and the user 604 has exited the keep-out zone 508. In some embodiments, the client device 602 is placed on a surface of the device 500 (i.e., contacting the surface). Once the device 500 is enabled to transmit wireless-power after expiration of the hysteresis timer discussed above, the device 500 will transmit wireless-power to and charge the client device 602. In the third view 630, the user 604 has left the keep-out zone 508, which allows the hysteresis timer to countdown even though the user 604 is still within the transmission field 506 of the device 500 (because a sensitive object is no longer detected within the keep-out zone 508, so no additional time will be added to the hysteresis timer).

FIGS. 6A-6C illustrate one scenario for detecting and classifying an object within the keep-out zone 508. A non-exhaustive list of scenarios include:

| User Actions | Transmitter Status |
|---|---|
| Sensitive object alone enters the keep-out zone | Disabled |
| Sensitive object alone leaves the keep-out zone | Enabled (if a client device is already being charged) |
| Sensitive object and client device enters the keep-out zone | Disabled |
| Sensitive object leaves the keep-out zone while the client device remains in the keep-out zone | Enabled |
| Sensitive object and client device leave the keep-out zone | Disabled (if no client device is being charged) |

Any different number of scenarios can be monitored using the first and second subsets of sensors described here. Additionally, while the primary examples above were described as using two sensors, one sensor configured to be used to help perform two different functions (e.g., ranging and object-classification functions) can instead be used, so the descriptions above also apply to use of one sensor in this way. An example process flow for determining that the sensor data from one or more of the first subset of sensors and the second subset of sensors have triggered detection or a sensitive object threshold, and the subsequent adjustments to the hysteresis timer are discussed below in reference to FIGS. 7A-7B.

Figure 7A:
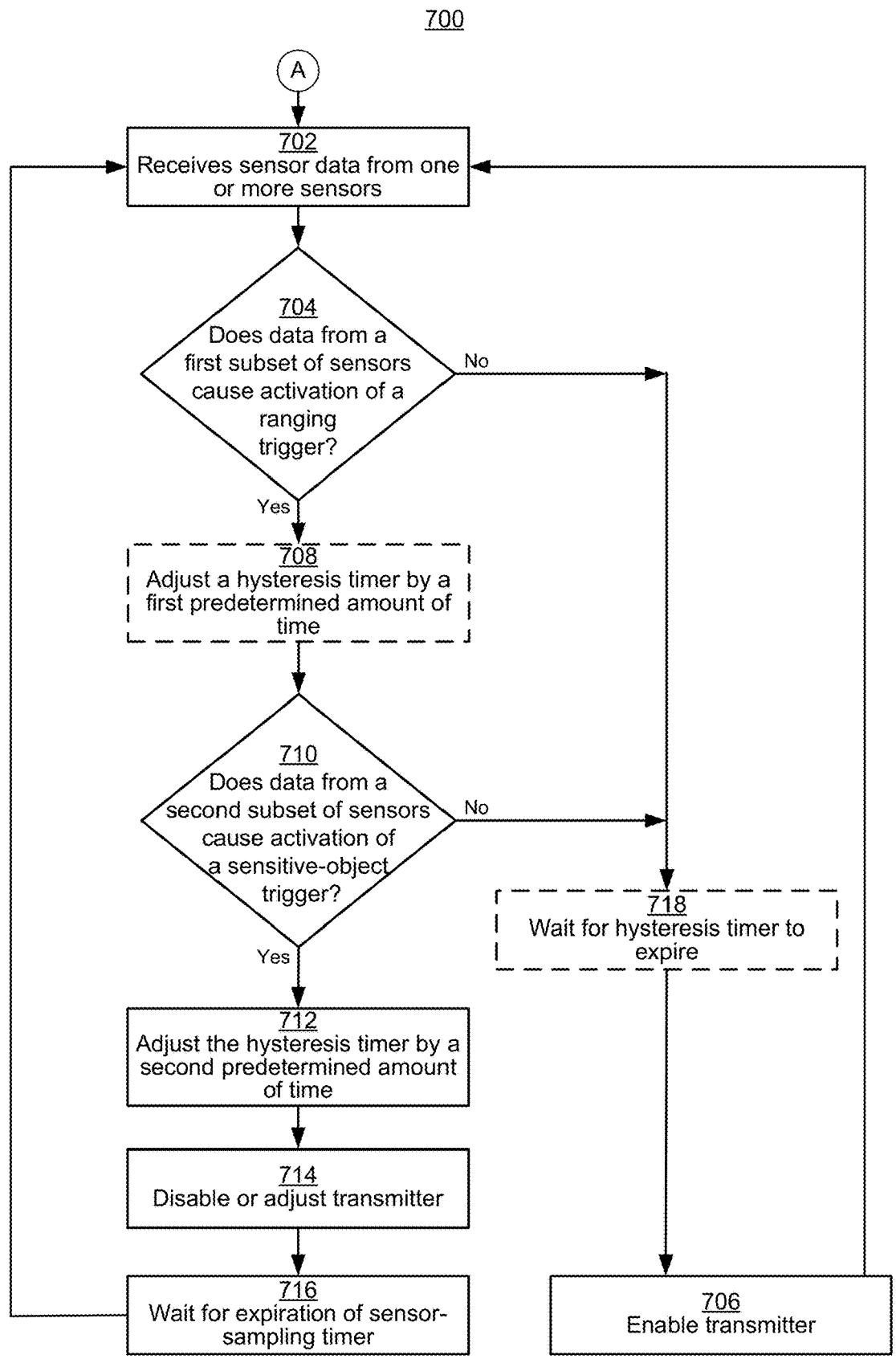
FIG. 7A-7B are flow diagrams illustrating different example operations performed by a wireless-power transmitter device and/or one or more integrated circuits, in accordance with some embodiments.
Figure 7B:
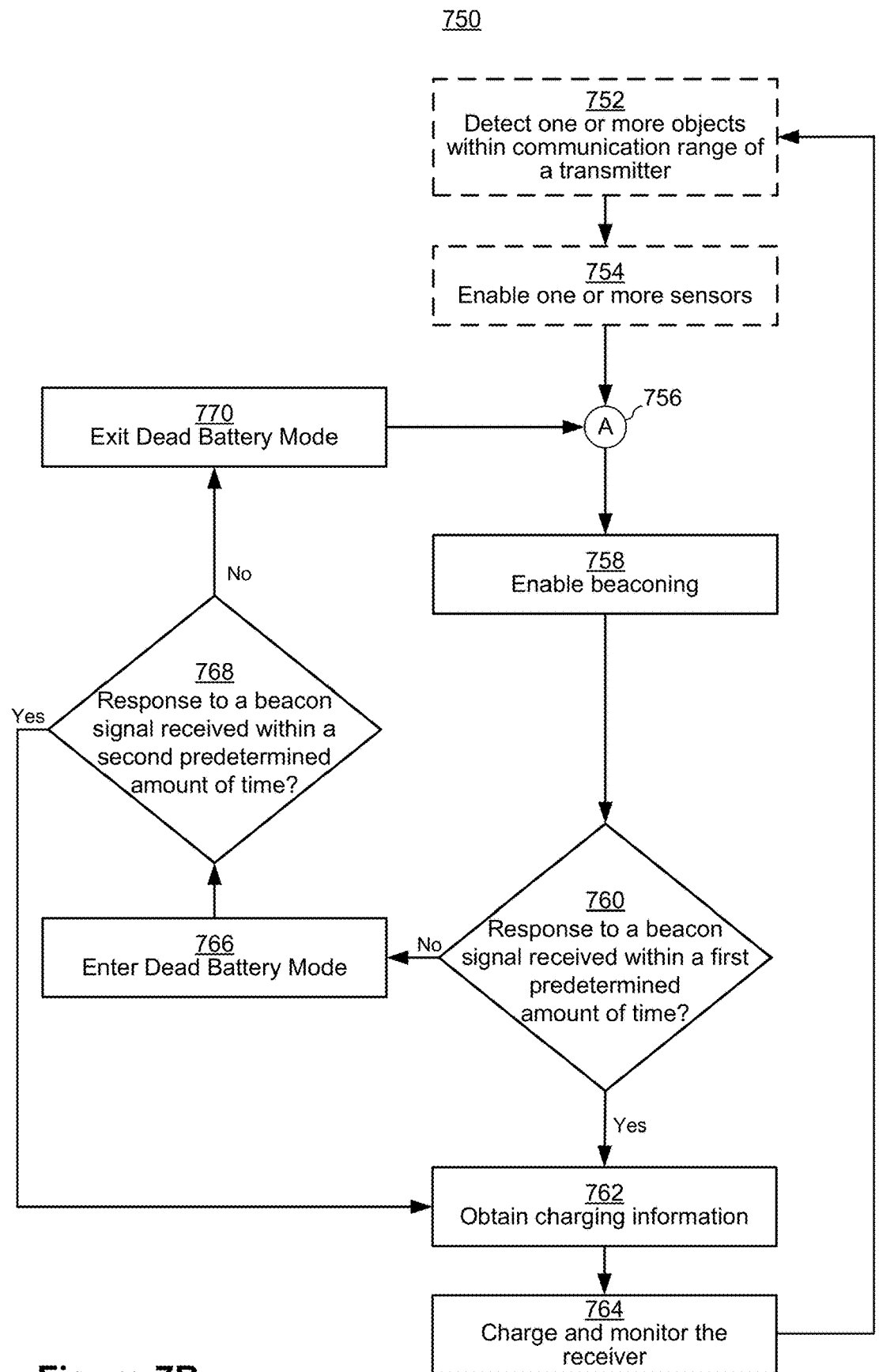

FIGS. 7A and 7B illustrates a process for controlling the transmission of RF energy, in accordance with some embodiments. The processes of FIGS. 7A and 7B can be performed by transmitter device 100 (FIG. 1) and/or one or more integrated circuits (e.g., RFIC 160 and/or PAIC 161A as shown in at least FIGS. 1A-2). At least some of the operations shown in FIGS. 7A and 7B correspond to instructions stored in a computer memory or computer-readable storage medium (e.g., memory 172 and 174 of the transmitter device 100, FIG. 1B; memory 206 of the transmitter device 100). In some embodiments, some, but not all, of the operations illustrated in FIGS. 7A and 7B, are performed. Similarly, one or more operations illustrated in FIGS. 7A and 7B may be optional or performed in a different sequence. Furthermore, two or more operations of Figure FIGS. 7A and 7B the transmitter device 100 and/or the one or more integrated circuits consistent with the present disclosure may be overlapping in time, or almost simultaneously. For brevity, the examples provided below are performed at a transmitter device 100.

FIG. 7A illustrates a process of detecting and classifying one or more objects within the transmission filed of the transmitter device 100, in accordance with some embodiments. In some embodiments, the transmitter device 100 receives 702 sensor data from one or more sensors (e.g., sensors 165). In some embodiments, the one or more sensors includes a first subset of sensors and a second subset of sensors. In some embodiments, the first subset of sensors and the second subset of sensors include different types of sensors. Alternatively, in some embodiments, the first subset of sensors and the second subset of sensors are similar sensors; however configured for different operation (i.e., a first subset configured for ranging detection and a second subset configured for object-classification). In some embodiments, the one or more sensors is a single subset sensors, and one or more sensors of the single subset sensors can be switched or reconfigured between different operations (e.g., between ranging detection and object-classification). In some embodiments, the transmitter device includes a single sensor that can be switched or reconfigured between different operations (e.g., ranging detection and object-classification). Examples of the different types of sensors are discussed above in reference to FIG. 1A-2.

In some embodiments, the transmitter device 100 determines 704 whether data from the first subset of sensors causes activation of a ranging trigger. The activation of the ranging trigger is caused when the first subset of sensors detects one or more objects and provides the transmitter device 100 first sensor data. In some embodiments, the first subset of sensors of the one or more sensors are ranging sensors configured to detect one or more objects within a transmission field of the transmitter device 100. The ranging trigger can be activated once it is determined (based on the first sensor data) that an object is present within a certain predetermined range of the device 100, such as within at least 10 cm, at least 20 cm, or at least 30 cm away from an exterior housing of the transmitter device 100.

If the transmitter device 100 determines that the first subset of sensors of the one or more sensors is not triggered (e.g., the ranging trigger is not activated), the transmitter device 100 is enabled 706 to transmit RF energy focused near a receiver device 304 (FIG. 3) that requires charging (if within the transmission field of the transmitter device 100). The process returns to operation 702 after the transmitter device 100 is enabled 706 and waits to receive additional sensor data from the one or more sensors. In some embodiments, the transmitter device 100 is enabled 706 as soon as the first subset of sensors of the one or more sensors does not detect an object (e.g., data from the first subset of sensors does not activate the ranging trigger). Alternatively or in addition, the transmitter device 100 waits 718 for a hysteresis timer (if active) to expire before being enabled. The hysteresis timer is a time window in which the transmitter device 100 cannot radiate RF energy. The hysteresis timer is considered active when it is a non-zero value. The hysteresis timer can be adjusted based on one or more detected and/or classified objects as described below.

In some embodiments, if the transmitter device 100 determines that the first subset of sensors of the one or more sensors is triggered, the transmitter device 100 adjusts 708 a hysteresis timer by a first predetermined amount of time. In some embodiments, the hysteresis timer is equal to the first predetermined amount of time. In some embodiments, the hysteresis timer is equal to the sum of each adjusted predetermined amounts of time. For example, the first subset of sensors can detect a first object that causes the transmitter device 100 to adjust the hysteresis timer by the first predetermined amount of time, and then detect a second object that causes the transmitter device to adjust the hysteresis timer by an additional first predetermined amount of time. In some embodiments, the first predetermined amount of time is no more than 100 milliseconds, no more than 50 milliseconds, or no more than 20 milliseconds. In some embodiments, the first predetermined amount of time is based on the sensor type. In some embodiments, the hysteresis timer (when each adjusted predetermined amount of time is aggregated) is no greater than 10 seconds, 5 seconds, 3 seconds, etc. In this way, the hysteresis timer does not increase indefinitely and allows for the transmitter device 100 to radiate RF energy without significant delay and while also ensuring that transmitting the RF energy is done safely.

In some embodiments, the transmitter device 100 adjusts the hysteresis timer after the first subset of sensors of the one or more sensors is triggered as an additional safety measure. By adjusting the duration of the hysteresis timer after the first subset of sensors of the one or more sensors is triggered, the transmitter device 100 can avoid radiating RF energy at objects that quickly pass through the keep-out zone (i.e., enter and leave). Additionally, the hysteresis timer may provide the transmitter device 100 additional time in which to classify one or more objects as described below. It should be noted that the transmitter device 100 is able to classify the one or more objects without the additional time provided by the hysteresis timer, and as such, operation 708 is optional as indicted by the broken lines in FIG. 7A.

Alternatively, after the transmitter device 100 determines that the first subset of sensors of the one or more sensors is triggered (e.g., the ranging threshold has been determined to be activated/satisfied because data from the first subset of sensors indicates presence of an object within the keep-out zone), the transmitter device 100 determines 710 whether data from the second subset of sensors causes activation of a sensitive-object trigger. The activation of the sensitive-object trigger is caused when one or more of the objects detected by the first subset of sensors of the one or more sensors is determined to be (e.g., classified as) a sensitive object. In particular, the second subset of sensors provides the transmitter device 100 second sensor data, and the transmitter device 100 uses the second sensor data to determine whether to classify the one or more objects detected by the first subset of sensors of the one or more sensors as a sensitive object. The second subset of sensors of the one or more sensors are classification sensors configured to detect data that allows the transmitted device to classify detected objects. The detected object can be classified as sensitive objects and/or non-sensitive objects. The second subset of sensors of the one or more sensors are configured to detect data within a defined boundary (i.e., keep-out zone) of the first subset of sensors of the one or more sensors. In some embodiments, the accuracy of the second subset of sensors of the one or more sensors decreases when detecting data related to objects located outside of the keep-out zone.

If the transmitter device 100 determines that the second subset of sensors of the one or more sensors is not triggered (e.g., data from the second subset of sensors causes activation of the sensitive-object trigger), the transmitter device 100 is enabled 706 to transmit RF energy focused near a receiver device 304 (FIG. 3) that requires charging (if that receiver device 304 is currently within the transmission field of the transmitter device 100). In some embodiments, the transmitter device 100 waits 718 for the hysteresis timer (if active) to expire before being enabled. The process returns to operation 702 after the transmitter device 100 is enabled 706 and waits to receive additional sensor data form the one or more sensors.

Alternatively, if the transmitter device 100 determines that the second subset of sensors of the one or more sensors is triggered (e.g., data from the second subset of sensors causes activation of the sensitive-object trigger), the transmitter device 100 adjusts 712 the hysteresis timer by a second predetermined amount of time and disables or adjusts 714 the transmitter device 100. Adjusting the transmitter device 100 includes adjusting a power lever of a power amplifier 120 (FIGS. 1A-1D) or adjusting a radiation profile as discussed below in reference to FIGS. 12A-14 as well as in commonly-owned U.S. patent application Ser. No. 16/932,631, which is incorporated by reference in its entirety for all purposes. Similar to the first predetermined amount of time, in some embodiments, the second predetermined amount of time is no more than 100 milliseconds, no more than 50 milliseconds, or no more than 20 milliseconds. The first predetermined amount of time and the second predetermined amount of time can be the same or distinct. In some embodiments, the second predetermined amount of time is based on the sensor type. The hysteresis timer can be the sum of the first predetermined amount of time, the second predetermined amount of time, and other predetermined amounts of time by which the hysteresis timer is adjusted.

After operation 714, the transmitter device 100 waits 716 for expiration of a sensor-sampling timer before returning to operation 702. More specifically, the process returns to operation 702 after the transmitter device 100 is disabled or adjusted 714 and waits for expiration of the sensor-sampling timer to then receive updated and/or additional sensor data from the one or more sensors (i.e., the transmitter 100 waits before resampling). In some embodiments, the sensor-sampling timer is no more than 100, 50, or 20 milliseconds. In some embodiments, the hysteresis timer does not begin to countdown (e.g., operation 718) until the first subset of sensors do not detect an object and/or the second subset of sensors do not classify an object as a sensitive object. In other words, the hysteresis timer begins to countdown after the first subset of sensors and the second subset of sensors are not triggered (or, stated another way, until after it is determined that both the ranging threshold and the sensitive-object threshold have not been activated/satisfied).

FIG. 7B illustrates a process of using a beacon signal and/or detecting receivers with a dead battery, in accordance with some embodiments. In some embodiments, the transmitter device 100 detects 752 one or more objects within its communication range (e.g., an area at least as large as, and typically larger than, the transmission field 506 (FIG. 5)). In some embodiments, the transmitter device 100 detects the one or more objects within its transmission filed 506 based on impedance measurements, reflected power, beacons signals (e.g., BLE or other communication signals). Alternatively, in some embodiments, the one or more objects are detected within the transmitter device 100's transmission filed 506 based on contact with the transmitter device 100 (e.g., an object contacting a charging surface of the transmitter device 100).

Upon detecting one or more objects within its transmission field 506, the transmitter device 100 enables 754 one or more sensors (e.g., first enables the ranging sensor and then waits to enable the sensor used for object-classification). Alternatively, in some embodiments, the one or more sensors are already enabled and are used to detect the one or more objects within the transmission field 506 of the transmitter device 100. The transmitter device 100 uses the enabled one or more sensors to perform 756 operations 702-718 of FIG. 7A. More specifically, the transmitter device 100 utilizes the at least one or more sensors to detect one or more objects within the transmission field 506 and/or keep-out zone 508 (FIG. 5) of the transmitter device 100, and/or to classify one or more detected objects as a sensitive object. If the detected object is a sensitive object, the transmitter device 100 disables transmission of wireless power within its transmission field. Alternatively, if the detected object is not a sensitive object, the transmitter device 100 is enabled and can continue or being transmitting wireless power within its transmission field.

With continued reference to FIG. 7B, the transmitter device 100 enables 758 beaconing. In particular, the transmitter device 100 transmits one or more communication signals to identify one or more of the detected objects. For example, once an object is detected, the transmitter device 100 attempts to discover one or more receiver devices 304 (FIG. 3) from the one or more detected objects. In some implementations, transmitter device 100 utilizes BLE as the communication signals used to discover the one or more receiver devices 304. In some embodiments, the transmitter device 100 enables beaconing while performing the operations 702-718 of FIG. 7A. Alternatively, in some embodiments, the transmitter device 100 enables beaconing after one or more of the detected objects are not classified as sensitive objects. In certain circumstances, the use of this beaconing process can be used to distinguish different types of electronic devices that might be in different states of charge, for instance an electronic device with a dead battery that needs charging can be distinguished from an electronic device that lacks a capability to be charged wirelessly.

After enabling beaconing, the transmitter device 100 determines 760 whether a response to a beacon signal is received from one or more of the detected objects within a first predetermined period of time. More specifically, the transmitter device 100 determines whether a receiver device 304 has been discovered (e.g., the transmitter device 100 and the receiver device 304 communicatively couple). If a response to a beacon signal is received from one or more of the detected objects within the first predetermined period of time, the transmitter device obtains 762, from the discovered receiver devices 304, charging information (described above in reference to FIGS. 1A-1D). The transmitter device 100 uses the charging information to charge 764 and monitor the charging of the discovered receiver devices 304. Once the receiver has been charged, the transmitter device returns to operation 752 and waits for another object to be detected within the transmission filed 506 of the transmitter device 100. Alternatively, in some embodiments, the transmitter device 100 returns to operation 756 (i.e., detection and/or classification of objects using the one or more sensors as described above in reference to FIG. 7A).

Alternatively, if a response to a beacon signal is not received from one or more of the detected objects within the first predetermined period of time, the transmitter device 100 enters 766 a dead battery mode. While in dead battery mode, the transmitter device 100 is able to supply power (i.e., radiate RF energy) capable of bringing a dead receiver device 304 (i.e., a receiver device with a dead battery) back to life. In this way, receiver devices 304 with dead batteries are still capable of being charged by the transmitter device 100 even if they are not able to respond to a beacon signal. While in dead battery mode, the transmitter device 100 determines 768 whether a response to a beacon signal is received from one or more of the detected objects within a second predetermined period of time. More specifically, the transmitter device 100 waits to receive a response from a dead receiver device that now has a sufficient charge to provide a responsive communication signal, the sufficient charge being given to the dead receiver device using the supplied power that the transmitter device 100 provided while in dead battery mode. If a response to a beacon signal is received from one or more of the dead (now live) receiver devices, the transmitter device performs operations 762 and 764 as described above.

Alternatively, if a response to a beacon signal is not received from one or more of the detected objects within the second predetermined period of time, the transmitter device 100 exits 770 the dead battery mode and returns to operation 756 (i.e., detection and/or classification of objects using the one or more sensors as described above in reference to FIG. 7A). In some embodiments, before entering dead battery mode, the transmitter device 100 determines whether the detected object was determined to be a receiver device 304 or includes receiver device 304 configured to receiver wireless power (e.g., using sensor data from the one or more sensors (e.g., an object-classification sensor)). In some embodiments, the transmitter device 100 returns to operation 752 and awaits for another object to be detected within the transmission filed 506 of the transmitter device 100.

Figure 8A:
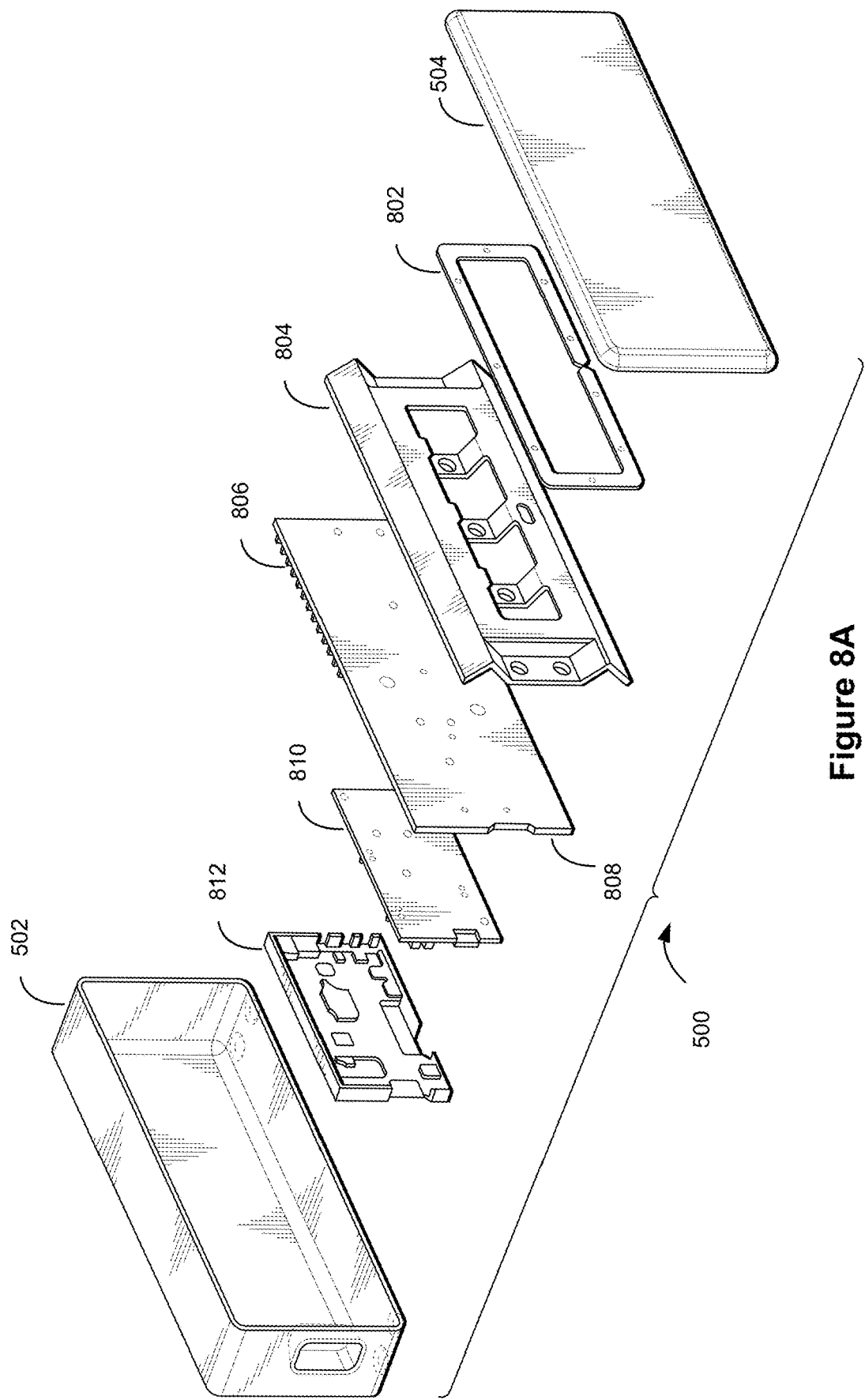
FIG. 8A-8C are different views of a device with an included wireless-power transmitter (and, in some embodiments, also including at least two sensors, or one sensor configured to provide data used to perform at least two different functions), according to some embodiments

FIG. 8A is an exploded view of a device 500 (FIGS. 5A-5C) with an included wireless-power transmitter (FIG. 1A-2), according to some embodiments. In some embodiments, the device 500 includes components such as a front face 504 of the device 500 enclosure housing 502, a loop antenna 802, an antenna mount 804, one or more sensors 806, a ground plane 808, a control printed circuit board (PCB) 810, and a PCB shield or heatsink 812. Although a loop antenna 802 is shown, any antenna described with reference to FIGS. 1A-1D and/or 9A-9C can be used. In some embodiments, the loop antenna 802 includes one feed 180 (FIG. 1D). In some embodiments, the device 500 includes a single loop antenna 802. In some embodiments, the antenna 802 has a rectangular aperture that is approximately 2 inches by 6 inches and 10 mm thick formed as a loop backed by a PCB 810 and/or a ground plane 808 as a reflector. In some other embodiments, the device 500 multiple antennas, the multiple antennas consisting of one or more types described above in reference to FIGS. 1A-1D. The multiple antennas can be of any dimensions that fit the device's 500 dimension and/or generate the desired frequencies and/or performance.

In some embodiments, the one or more sensors 806 are integrated or placed on the ground plane 808. In some embodiments, although not shown, additional sensors of one or more sensor types (not shown) are located exterior to the device 500 and/or near the front face 504 (e.g., along the edges, the corners directly in the center of device 500 and/or the front face 504). In some embodiments, the front face 504 is made of plastic. In some embodiments, the antenna mount 804 is made of plastic. In some embodiments, the enclosure housing 502 is made of plastic.

Figure 8B:
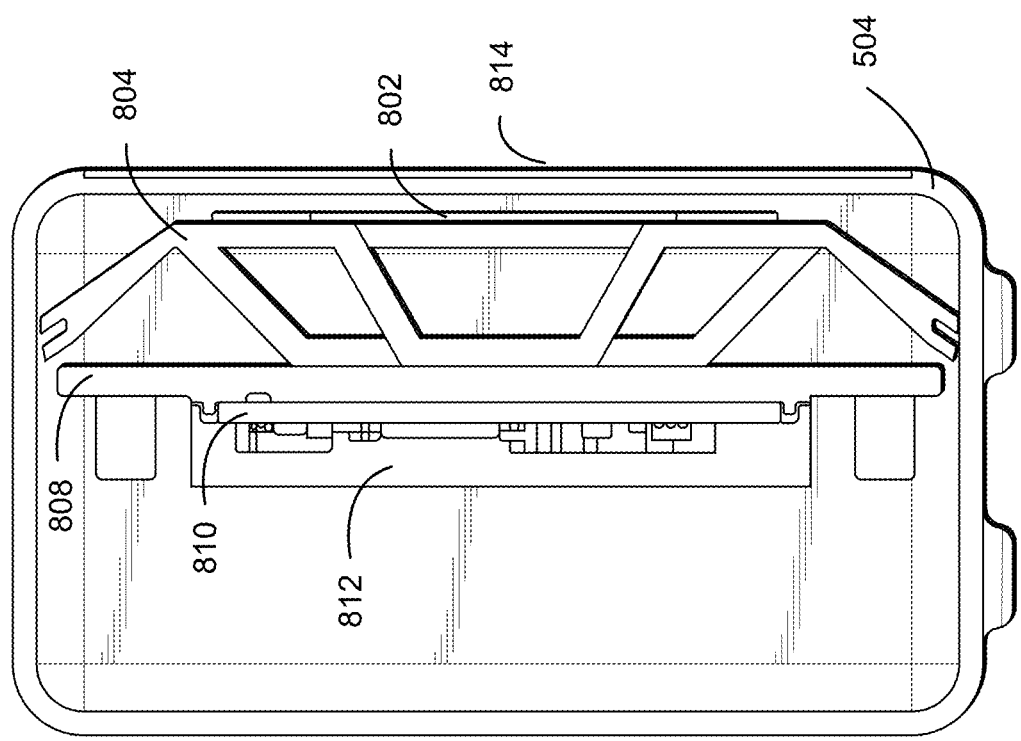
Figure 8C:
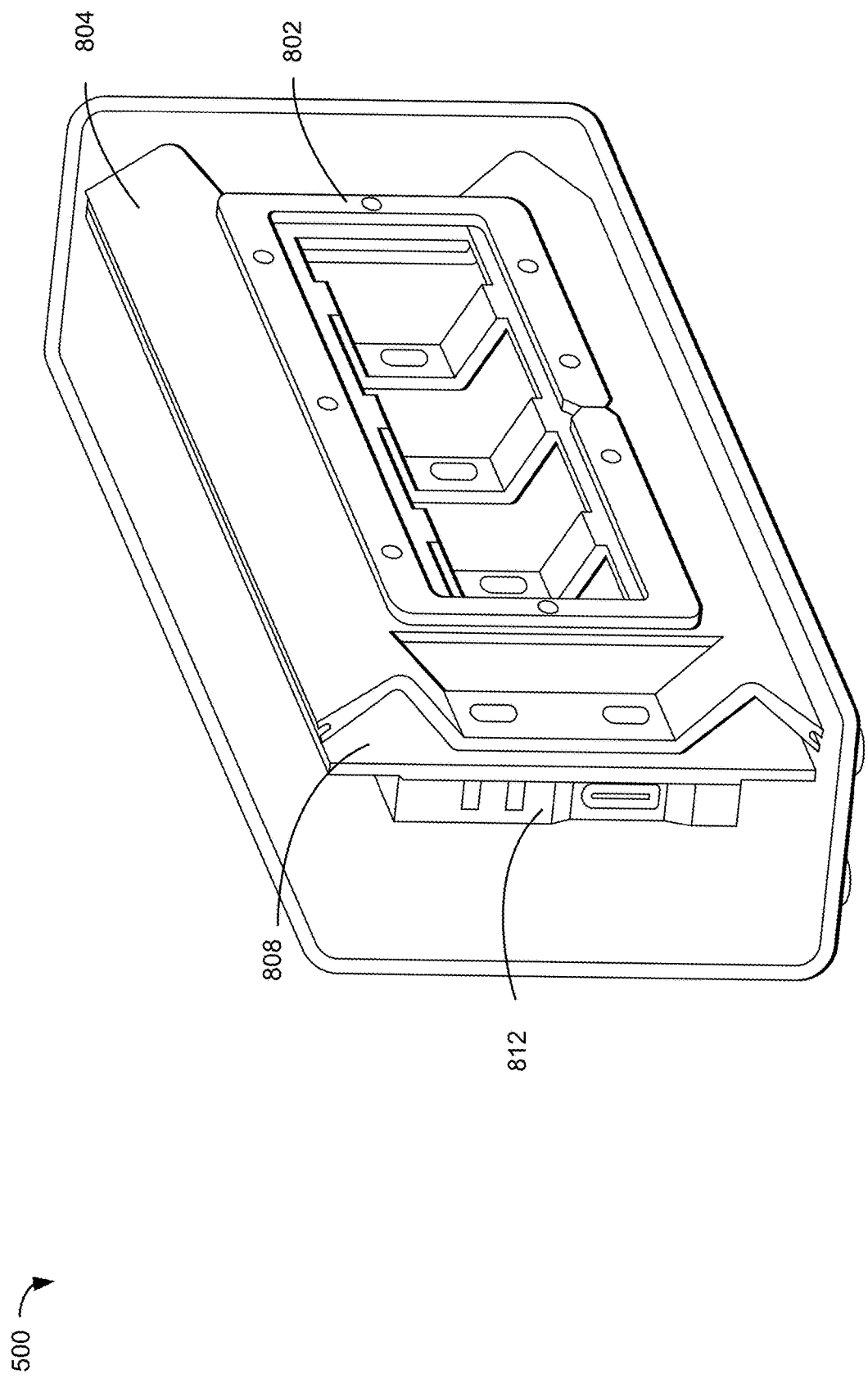

The mechanical illustrations are further depicted in FIGS. 8B and 8C. FIG. 8B is a side cross-sectional view illustration of a device 500 with an included wireless-power transmitter, according to some embodiments. In some embodiments, the loop antenna 802 is placed very close to the front surface 814 or front cover (enclosure) 1502 of the device 500. The loop antenna 802 is placed on the antenna mount 804. A PCB shield or heatsink 812 is covered on the control PCB 810.

FIG. 8C is a transparent illustration of an assembled device with an included wireless-power transmitter, according to some embodiments. The loop antenna 802 can be viewed from the transparent side view. Example dimensions of the device 500 include a 7 cm height, a 4 cm depth, and a 15 cm length. In some embodiments, the loop antenna 802 is configured to generate and use locally RF energy at 917.5 MHz.

Figure 9A:
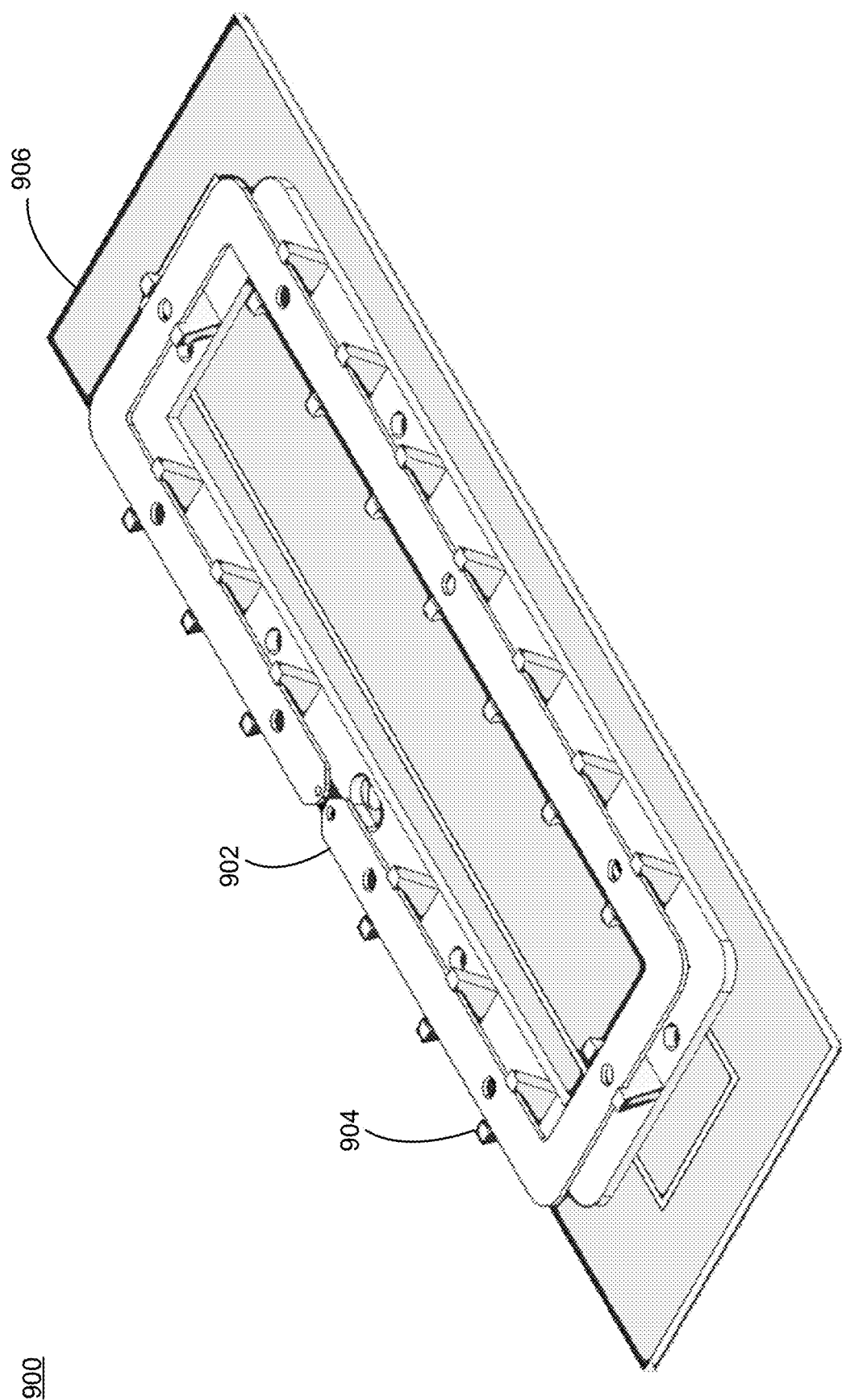
FIGS. 9A-9C illustrate front perspective views of an antenna with an integrated capacitive sensor, in accordance with some embodiments.
Figure 9B:
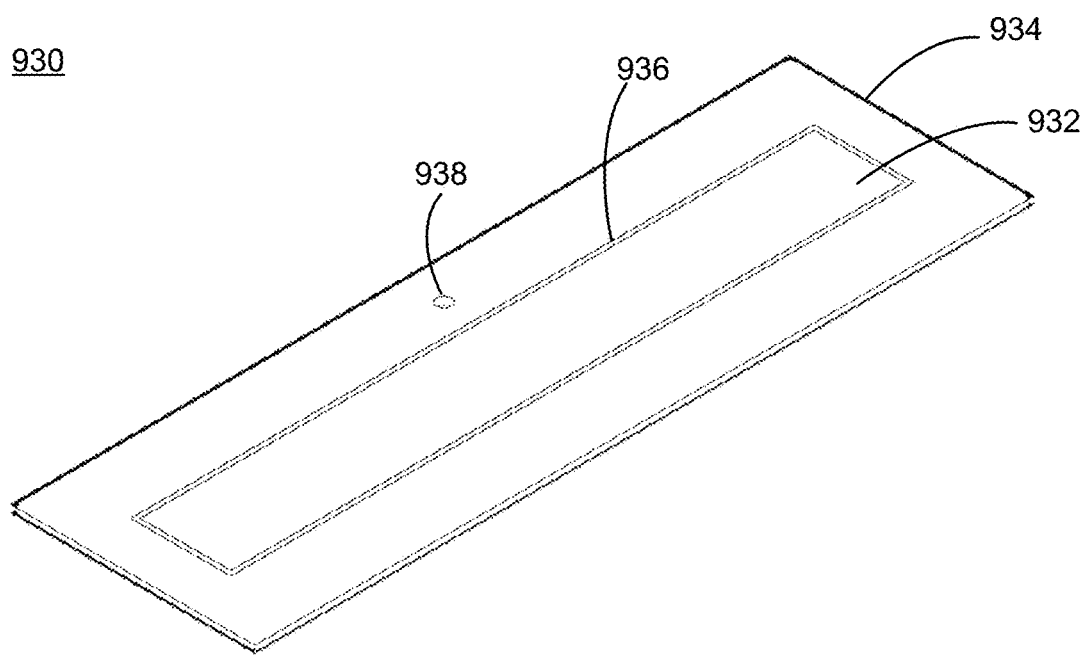
Figure 9C:
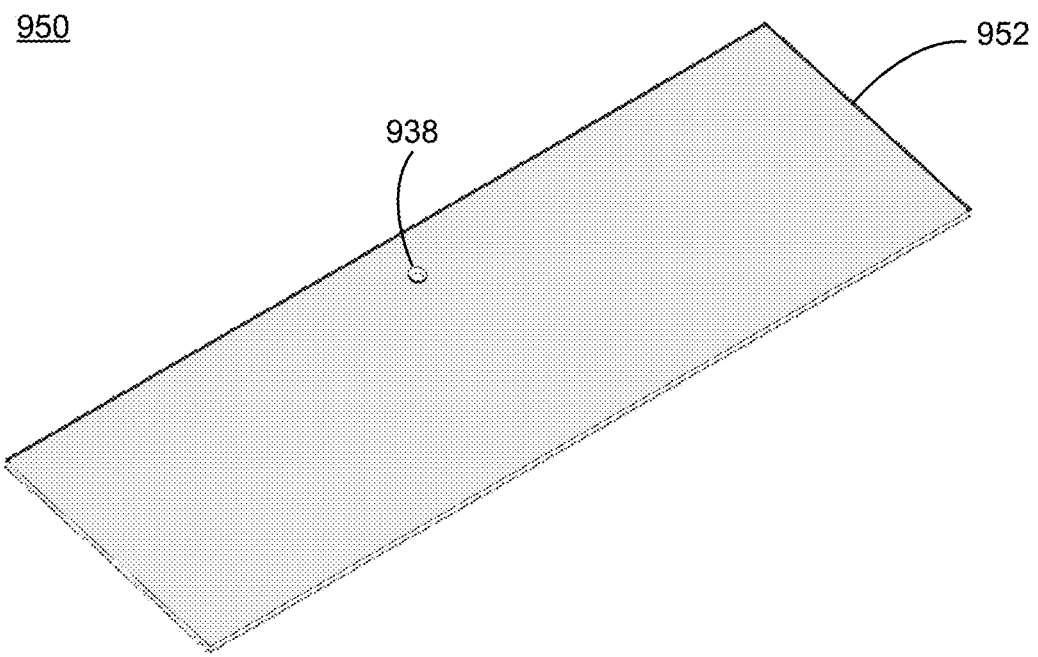

FIGS. 9A-9C illustrate an antenna with an integrated capacitive sensor, in accordance with some embodiments. In some embodiments, the antenna with the integrated capacitive sensor (referred to as a "modified antenna" 900)

includes a resonator element 902, a spacer 904, and a modified ground plane 906. The modified antenna 900 is configured to provide wireless-power to wireless-power receivers 304 within the modified antenna's 900 transmission field (e.g., transmission field 506; FIG. 5). In some embodiments, the transmission field of the modified antenna 900 extends from the front face of a device (e.g., device 500; FIG. 5). In some embodiments, the modified antenna 900 is configured to be disabled based on the detection and/or classification of one or more objects within the keep-out zone (e.g., keep-out zone 508; FIG. 5) of the modified antenna 900. In other words, the modified antenna 900 is configured to transmit wireless power in an acceptable range (i.e., areas within allowable SAR values in front of the antenna), and/or when sensitive objects are not detected within the keep-out zone of a transmitter device (e.g., device 500) associated with the modified antenna 900. In some embodiments, the modified antenna 900 includes a signal feed configured to conduct a radio frequency (RF) signal received from a power amplifier. Alternatively or additionally, in some embodiments, the modified antenna 900 includes multiple feeds. The modified antenna 900 can be implemented in any of the wireless-power transmitter devices of FIGS. 1A-2, 5A-6C, and 8A-8C.

In some embodiments, the resonator element 902 is a unitary a resonator formed from a single piece of metal. In some embodiments, the resonator element 902 is formed of a stamped metal. In some embodiments, the resonator element 902 is planar with respect to the front face 504. The resonator element 902 directly contacts the signal feed, which causes the resonator element 902 to radiate RF energy in a predetermined transmission field based on the RF signal. In some embodiments, the predetermined transmission field is in front of a wireless-power transmitter device in which the modified antenna is used (e.g., as shown in FIGS. 5A and 5B). In some embodiments, the radiated RF energy has a peak gain of at least 6 dB (+/−1 dB). In some embodiments, the radiated RF energy has a 3 dB beam width of approximately 70 degrees (+/−2 degrees). The modified antenna 900 and one or more example radiation profiles associated therewith are provided in FIGS. 10A-10D.

The spacer 904 is coupled between the resonator element 902 and the modified ground plane 906. In some embodiments, the spacer 904 is made of a material distinct from the material of which the resonator element 902 is made (e.g., the spacer 904 is made of plastic and the resonator element 902 is made of metal). Alternatively, in some embodiments, the spacer 904 can be part of an antenna mount 804 as described above in reference to FIG. 8.

The ground plane 906 (referred to as "modified ground plane 906" since it is part of the modified antenna 900 and, in some embodiments, has also been modified to include one or more capacitive sensors) includes one or more components of the wireless-power transmitter device 100. For example, the modified ground plane 906 can include one or more sensors, one or more power amplifiers, and/or other components identified in FIG. 2. In some embodiments, the one or more components of the wireless-power transmitter device 100 are coupled behind the modified ground plane 906. In this way, the one or more components of the wireless-power transmitter device 100 are positioned such that there is little to no interaction between the resonator element 902 and the one or more components, which helps to ensure efficient operation of the components and the resonator element 902, allowing the modified antenna 900 to assist with performance of multiple functions simultaneously.

In some embodiments, a PCB design is used to integrate a capacitive sensor into the modified ground plane 906. The modified ground plane 906 (with the integrated capacitive sensor) does not interfere substantially with the modified antenna's 900 performance. More specifically, the modified ground plane 906 forms a capacitive sensor configured to detect and/or classify one or more object within the predetermined transmission field of the modified antenna 900 without substantially (or, in some embodiments, at all) interfering with the radiation of RF energy by the modified antenna 900. The detection and/or classification of one or more objects within the predetermined transmission field is discussed above in reference to FIGS. 5A-7B and these detection and classification functions can be performed using the antenna 900 and its integrated one or more sensors (which can be a capacitive sensor). In some embodiments, an entire surface are of the modified ground plane 906 is used as a capacitive sensor. By using the entire surface area of the modified ground plane 906 as a capacitive sensor, the capacitive sensors range can be maximized (e.g., with an ability to sense objects within the full transmission field 506 or keep-out zone 508). Alternatively, in some embodiments, a portion of the surface area of the modified ground plane 906 is used as a capacitive sensor (and other portions could be used to integrate other types of sensors or additional capacitive sensors).

In some embodiments, the modified ground plane 906 operating as a capacitive sensor is configured to detect one or more objects up to 15 in. away from the modified ground plane 906. In some embodiments, the modified ground plane 906 operating as a capacitive sensor is configured to detect one or more objects up to 12 in. away from the modified ground plane 906. In some embodiments, the modified ground plane 906 operating as a capacitive sensor is configured to detect one or more objects up to 6 in. away from the modified ground plane 906. In some embodiments, the modified ground plane 906 operating as a capacitive sensor is configured to detect one or more objects up to 3 in. away from the modified ground plane 906. For example, in some embodiments, when no object is in front of the modified ground plane 906 a measured capacitance is 110 pF (capacitance variation is not applicable). Continuing this example, if an object is 3 in. in front of the modified ground plane 906, a measured capacitance is 117.8 pF (a capacitance variation of 7.1 percent). Continuing this example, if an object is 6 in. in front of the modified ground plane 906, a measured capacitance is 114.5 pF (a capacitance variation of 4.1 percent). Continuing this example, if an object is 12 in. in front of the modified ground plane 906, a measured capacitance is 112.2 pF (a capacitance variation of 1.1 percent).

FIGS. 9B and 9C illustrate the modified ground plane, in accordance with some embodiments. In some embodiments, the modified ground plane 906 is a solid copper plane. Alternatively, in some embodiments, the modified ground plane 906 is a PCB including at least two or more layers. In some embodiments, the at least two layers of the PCB are made of copper. The two or more layers of the PCB include a first layer 930 and a second layer 950 where the first layer 930 is a top layer and the second layer 950 is a bottom layer. In some embodiments, the first layer 930 is coupled to the resonator element 902 using the spacer 904, and the second layer 950 is coupled to one or more components of the wireless-power transmitter device 100. The one or more components of the wireless-power transmitter device 100 are opposite the resonator element 902. In this way, the modified ground plane 906 reduces or eliminates interference that could be caused by the one or more components of the wireless-power transmitter device 100 (on a transmission field of the resonator element 902).

The first layer 930 of the two or more layers includes at least two sections. In some embodiments, a first section 932 of the first layer 930 is centrally located on the modified ground plane 906, and a second section 934 of the first layer 930 is coplanar with and surrounds the first section 932. In some embodiments, the first section 932 and the second section 934 define a rectangle 936 between the two sections. The rectangle 936 can have a predetermined gap between its inner edge and its outer edge that is based on the desired performance of the integrated capacitive sensor. In some embodiments, the first layer 930 includes a hole 938. The hole 938 is configured to allow one or more cables or other components to go through the modified ground plane 906 and connect to the resonator element 902. The second layer 952 of the two or more layers is a solid copper layer in some embodiments. Like the first layer 930, second layer 952 includes the hole 938 to allow one or more cables or other components to go through the modified ground plane 906 and connect to the resonator element 902. In some embodiments, the backplane of the modified ground plane 906 is mainly used as the resonator element 902 ground.

The integrated capacitive sensor of the modified ground plane 906 is formed from the first layer 930, the second layer 950, and the backplane. The performance of the integrated capacitive sensor is based on the size of the first section 932 of the first layer 930 (i.e., the center piece in the first layer 930), the rectangle 936 of the first layer 930 (which is defined by a gap between the first section 932 and the second section 934), and the modified ground plane 906 material and thickness (i.e., the PCB material and thickness). Different designs and dimensions of the modified ground plane 906 can be used to produce an integrated capacitive sensor with desired performance features.

Figure 10A:
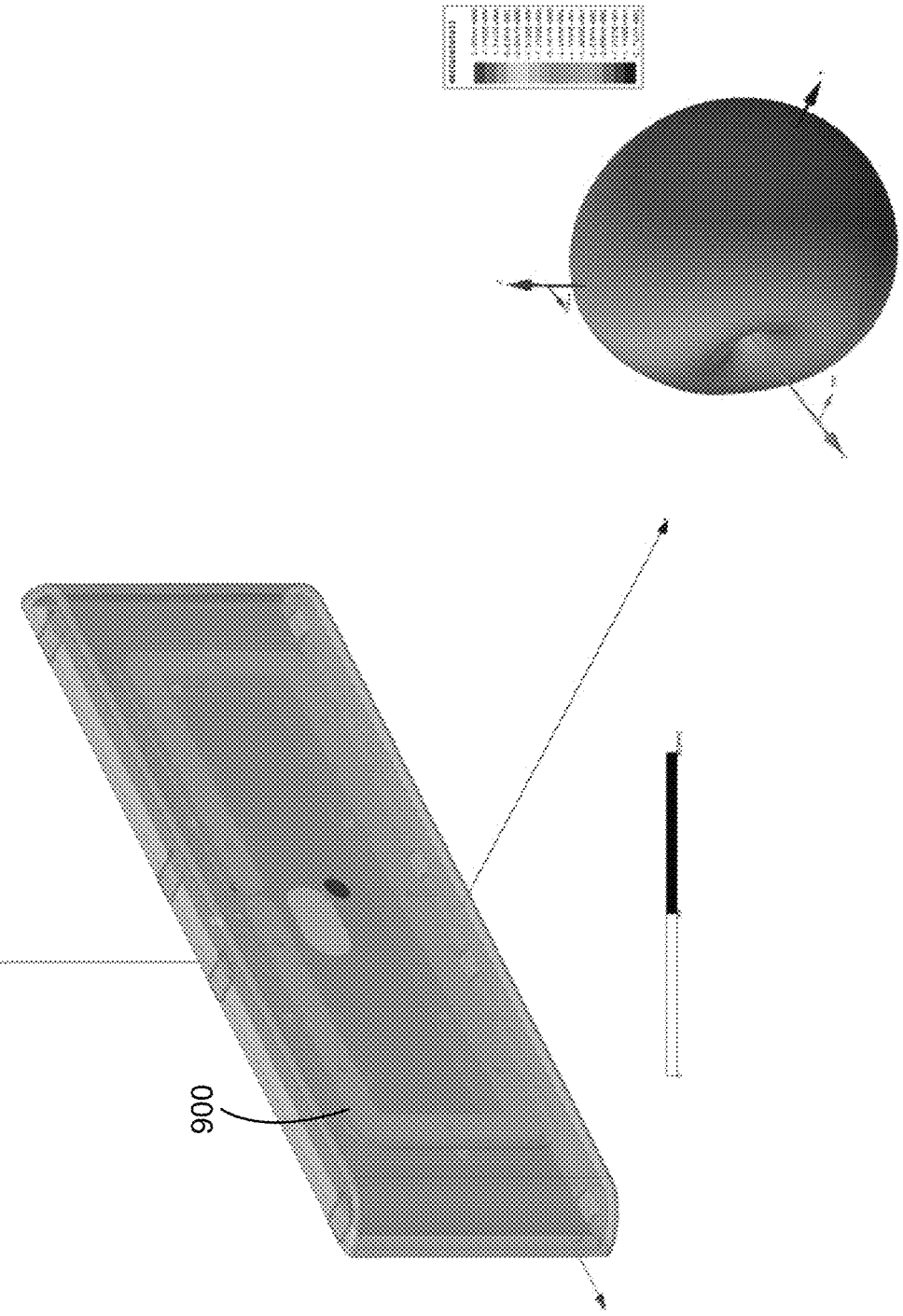
FIGS. 10A-10D illustrate RF radiation profiles and E-field patterns of the antenna with the integrated capacitive sensor, in accordance with some embodiments.
Figure 10B:
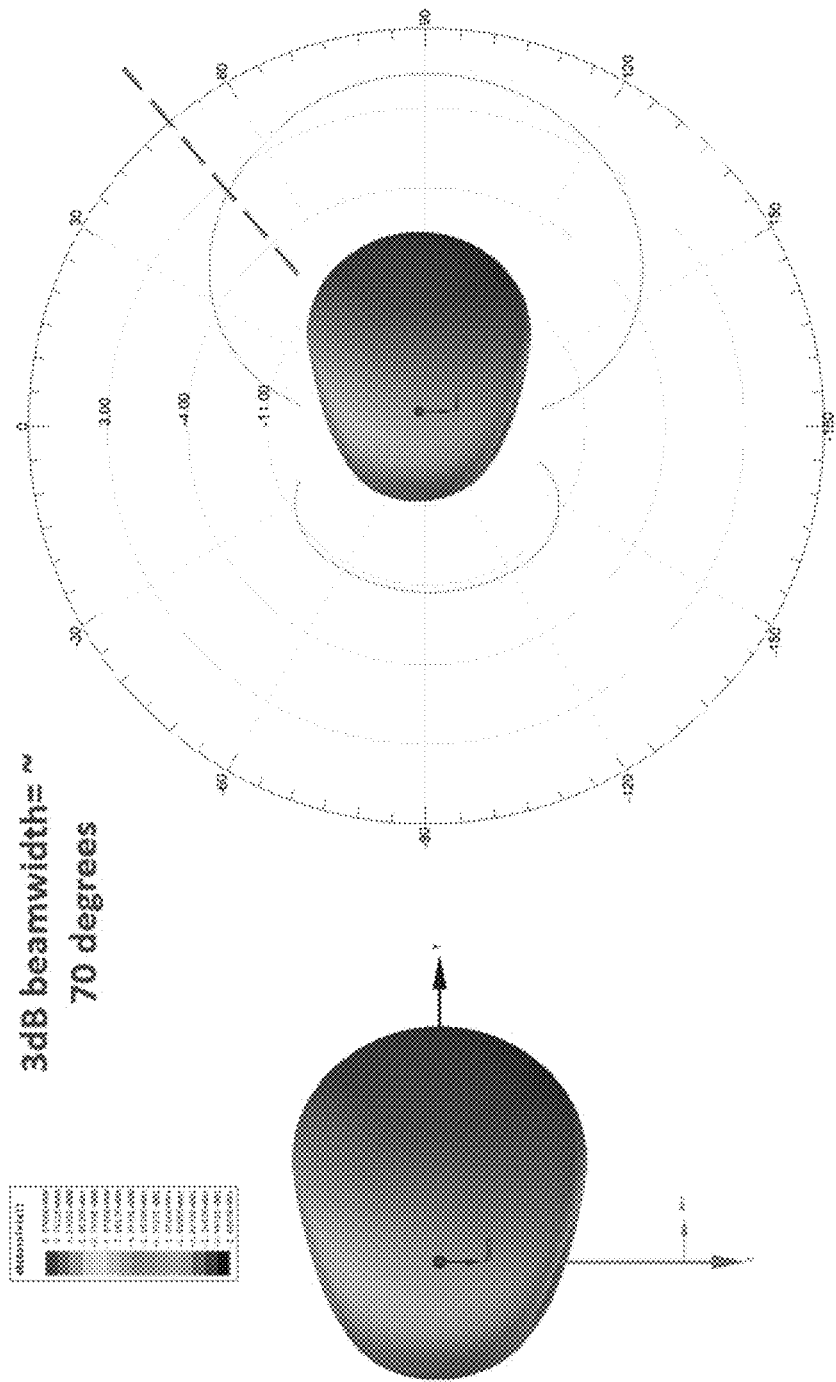
Figure 10C:
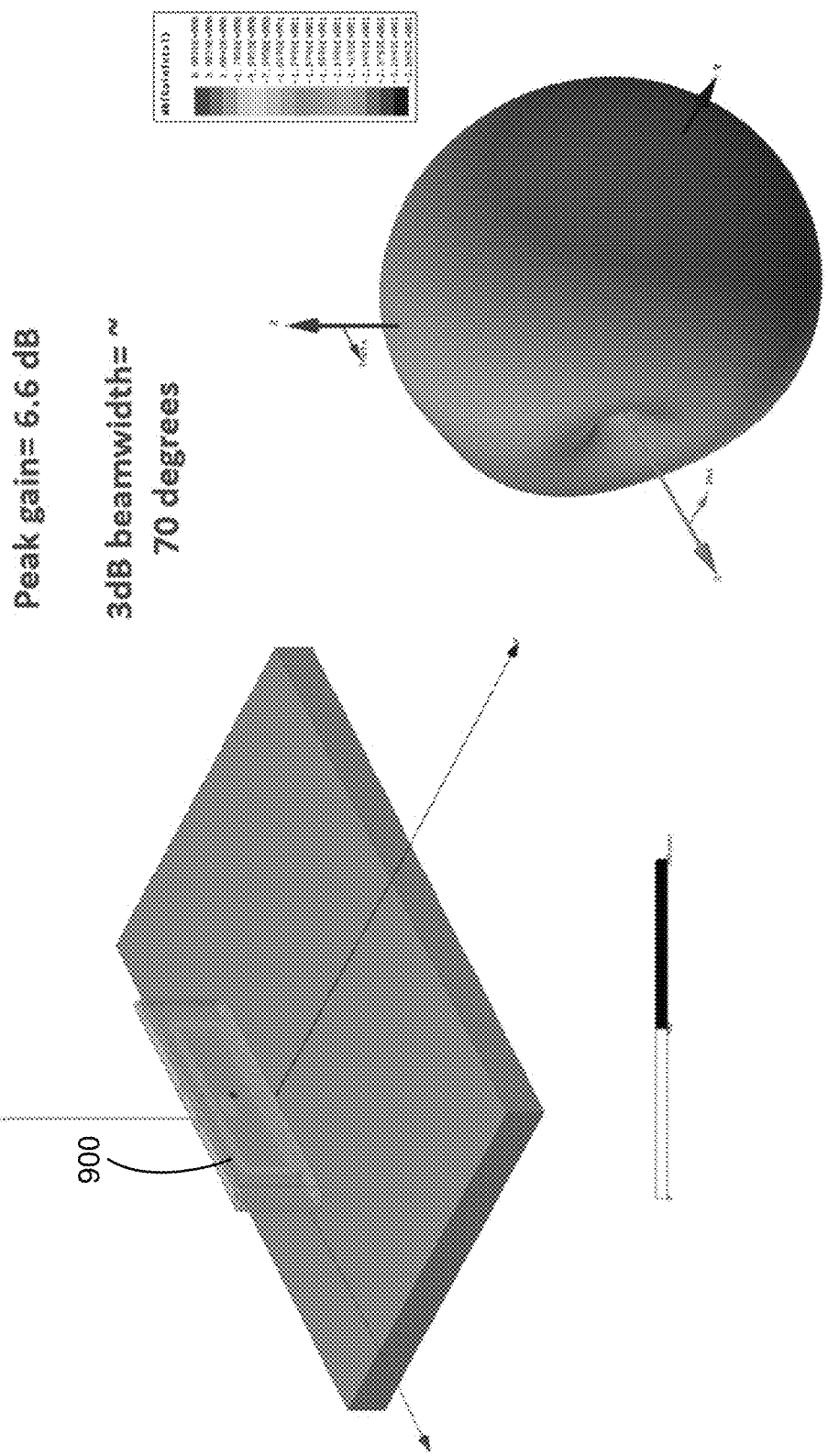
Figure 10D:
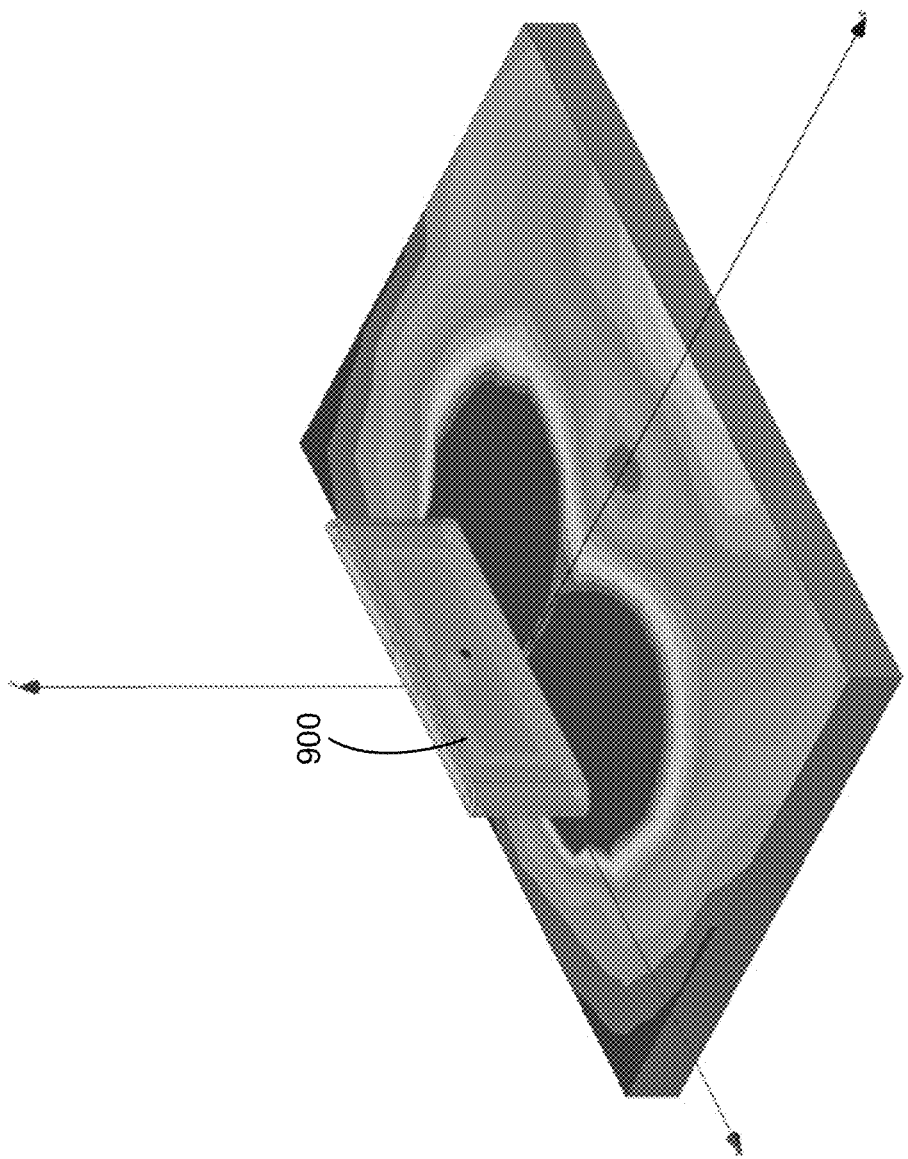
Figure 12A:
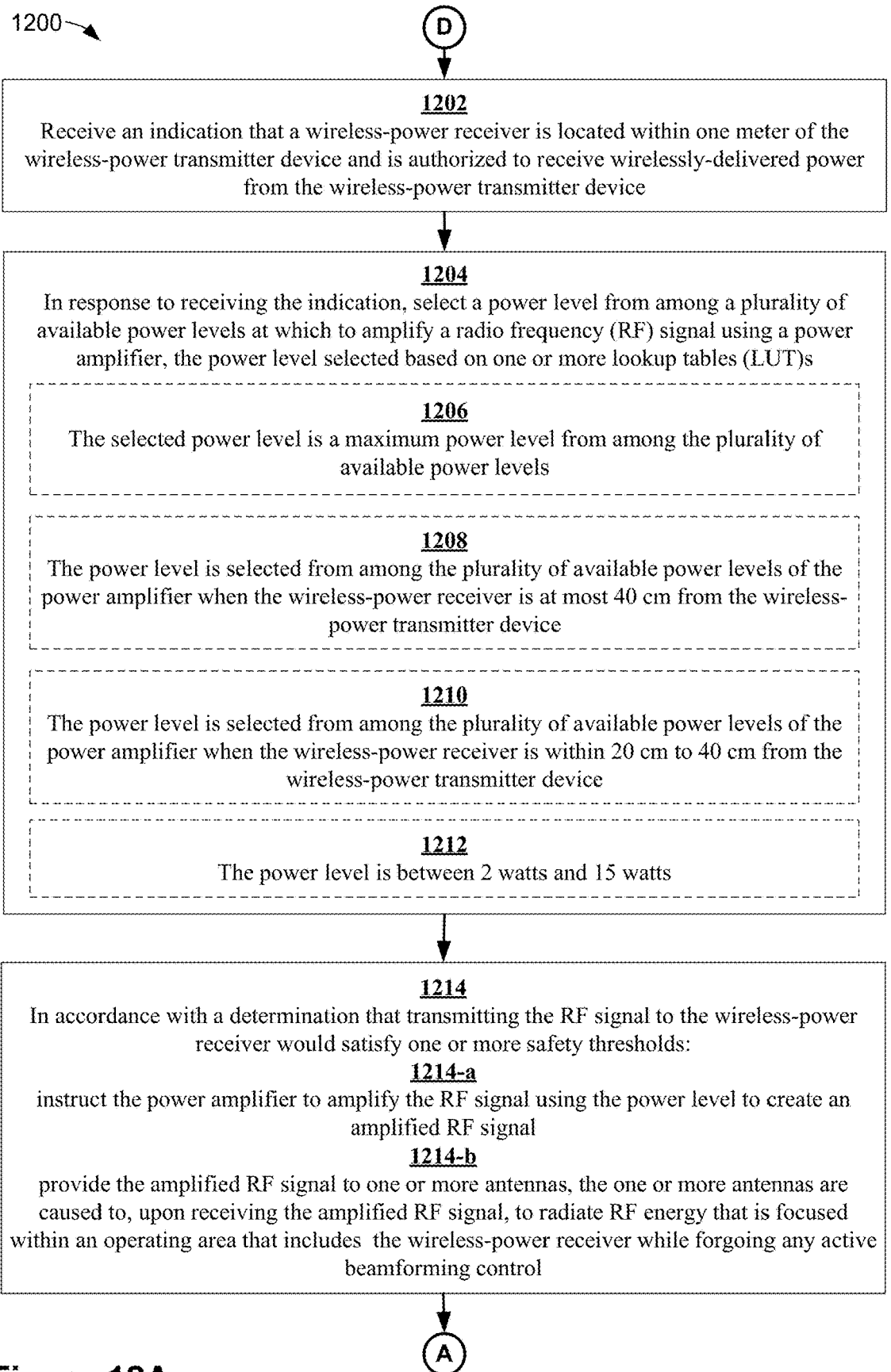

FIGS. 10A-10D illustrate RF radiation profiles and E-field patterns of the modified antenna 900, in accordance with some embodiments. FIG. 10A shows the modified antenna 900 (e.g., which can be included in the device 500 of FIG. 5). In particular, FIG. 10A shows radiated RF energy at a predetermined location in front of the modified antenna 900. FIG. 10B shows an RF radiation profile/pattern produced by the modified antenna 900 in accordance with some embodiments. FIG. 10C shows the modified antenna 900 on a table and/or counter radiating RF energy at a predetermined location in front of the device. FIG. 10D illustrates an E-field pattern of the modified antenna 900.

FIGS. 11A and 11B are flow diagrams illustrating a method of controlling and/or managing operation of a transmitter device, in accordance with some embodiments. Operations (e.g., steps) of the method 1100 may be performed by one or more integrated circuits (e.g., RFIC 160 of transmitter device 100 as shown in in at least FIGS. 1A-1D, and/or a PAIC 161A as shown in at least FIGS. 1B-1D) of a device 500 with an included transmitter device 100 (which has the RFIC 160 and/or the PAIC 161A). At least some of the operations shown in FIGS. 11A and 11B correspond to instructions stored in a computer memory or computer-readable storage medium (e.g., memory 172 and 174 of the transmitter device 100, FIG. 1B; memory 206 of the RF power transmitter device 100). The operations of the method 1100 consistent with the present disclosure may include at least some, but not all, of the operations illustrated in FIGS. 11A and 11B, performed in a different sequence. Similarly, one or more operations illustrated in FIGS. 11A and 11B may be optional. Furthermore, the operations of the method 1100 consistent with the present disclosure may include at least two or more steps performed overlapping in time, or almost simultaneously.

For brevity, the operations of method 1100 described below are performed at by the one or more integrated circuits of a transmitter device 100. The transmitter device 100 includes at least two sensors (e.g., sensors 165; FIGS. 1A-2), one or more antennas (e.g., antennas 130; FIG. 1), the one or more integrated circuits, and a power amplifier (e.g., power amplifier 120; FIGS. 1A-1C) configured to amplify an RF signal that is provided to the one or more antennas. The one or more antennas, upon receiving the amplified RF signal, are configured to radiate RF energy within a transmission field of the transmitter device 100. In some embodiments, the at least two sensors are different types of sensors. Alternatively, in some embodiments, the at least two sensors are the same types of sensors, which can be configured to perform at least two different functions (e.g., ranging and object-classification functions). In some embodiments, the at least two sensors include one or more of an ultrasonic sensor, a photoelectric sensor, capacitive sensor, and an infrared sensor. In some embodiments, a sensor of the at least two sensors is a sensor configured to detect impedance changes at the transmitter device 100. Alternatively or additionally, in some embodiments, a sensor of the at least two sensors is a sensor configured to measure reflected power that can be used to detect and/or classify objects.

The method 1100 includes receiving (1102), from a first sensor of the at least two sensors, first sensor data indicating presence of an object within a keep-out zone (e.g., keep-out zone 508 FIG. 5A-6C) of the transmission field (e.g., transmission field 506 FIG. 5A-6C) of the transmitter device 100. The transmission field may include an area of three-dimensional space that is greater than an area of three-dimensional space that is included in the keep-out zone (i.e., the keep-out zone is within the transmission field). In some embodiments, the transmission field of the transmission device 100 is at least 1 m away from an exterior housing of the transmission device 100. In some embodiments, the first sensor is a ranging sensor configured to detect objects that enter (and/or within) the keep-out zone. In some embodiments the first sensor is accurate up to a first predetermined distance (e.g., at least 40 cm (+/−2 cm) from the transmitter device 100). In some embodiments, the first sensor is configured to detect one or more objects at least 20 cm away from an exterior housing of the transmitter device 100. The first predetermine distance can be selected to correspond to dimensions of a keep-out zone for the transmitter device 100 (examples of keep-out zones were provided above).

The method 1100 includes, in response to the receiving, classifying (1104), using second sensor data from a second sensor distinct from the first sensor, the object as a sensitive object. In particular, the second sensor is a classification sensor configured to detect data that allows the one or more integrated circuits to classify one or more objects within the keep-out zone. In some embodiments, the sensitive object is (1106) a human hand. In some embodiments, the sensitive object is a living or biological organism (e.g., humans, dogs, cats, plants, etc.). In some embodiments, the second sensor is not able to perform accurate ranging (i.e., the second sensors accuracy drops for detected objects outside of the keep-out zone). In some embodiments the second sensor is accurate up to a second predetermined distance (e.g., at least 20 cm (+/−2 cm) from the transmitter device 100).

The method 1100 includes, while continuing to detect presence of the sensitive object within the keep-out zone, forgoing (1108) providing an instruction to the power amplifier to amplify the RF signal. In some embodiments, an electronic device (e.g., receiver 304) that requires charging is also present (1110) within the transmission field while the one or more integrated circuits continue to detect the presence of the sensitive object within the keep-out zone. In some embodiments the electronic device is classified (e.g., authorized receiver, non-authorized receiver, etc.) as described above in reference to FIGS. 2 and 3.

The method 1100 includes, in accordance with a first determination that the sensitive object is no longer within the keep-out zone, determining (1112) whether an electronic device that requires charging is within the transmission field. In some embodiments, the electronic device that requires charging can be detected using one or more of the first sensor, the second sensor, a signature-signal detecting process (described above in reference to FIG. 2), and a short-range communication radio (such as a BLE radio). In some implementation, the first determinations includes (1114) determining that the sensitive object is no longer within the keep-out zone but is still within the transmission field.

The method 1100 includes, in accordance with a second determination that the electronic device that requires charging is within the transmission field, instructing (1116) the power amplifier to amplify the RF signal to cause the one or more antennas to radiate RF energy focused near the electronic device that requires charging. In some embodiments, the instruction (1118) to the power amplifier to cease amplifying the RF signal is provided within a predetermined amount of time of detecting the second classified object. In some implementation, the predetermined amount of time is less than 150 milliseconds, less than 100 milliseconds, less than 50 milliseconds, or other amount of time. In some embodiments, providing the instruction to the power amplifier to cease amplifying the RF signal within the predetermined amount of time is critical to ensuring that power transmission is performed in a safe manner by shutting of the power transmission in a very short amount of time after detecting presence of a human (or other biological organism). Additionally, the predetermined amount of time minimizes software overhead, and allows for quick disablement for fast moving intruders (i.e., sensitive objects). In some embodiments, the instruction to the power amplifier to cease amplifying the RF signal is provided after waiting a subsequent predetermined period of time (e.g., 100 milliseconds or less). In some embodiments, a first instruction to the power amplifier to cease amplifying the RF signal is provided within a first predetermined amount of time of receiving, from the first sensor of the at least two sensors, the first sensor data; and a second instruction to the power amplifier to cease amplifying the RF signal is provided within a second predetermined amount of time of detecting the second classified object, the first and second predetermined amount of times being distinct (e.g., the first predetermined amount of time being less than 25 milliseconds and the second predetermined amount of time being less than 100 milliseconds).

In some embodiments, the method 1100 includes, while radiating the RF energy focused near the electronic device, receiving (1120-*a*), from the first sensor of the at least two sensors, additional sensor data from the first sensor (i.e., third sensor data) indicating presence of another object within the keep-out zone of the transmission field of the wireless-power transmission system. The method 1100 includes, in response to the receiving, classifying (1120-*b*), using additional sensor data from the second sensor (i.e., fourth sensor data), the other object as a second classified object (e.g., a human hand). The method 1100 further includes, in accordance with a third determination that the second classified object is another sensitive object, instructing (1120-*c*) the power amplifier to cease amplifying the RF signal while the presence of the other sensitive object is detected within the keep-out zone. In some embodiments, the ceasing instruction could be provided to another component of the transmitter device 100, for example an instruction could be provided to the one or more antennas to cease radiating the RF energy.

In some embodiments, the first sensor data indicates presence of at least two objects within the keep-out zone of the transmission field of the transmitter device, and the method 1100 includes determining (1122-*b*) a number of objects within the keep-out zone based on the first sensor data. In some embodiments, the method 1100 includes classifying (1124-*a*) using the second sensor data from the second sensor distinct from the first sensor, each object within the keep-out zone, and, in accordance with a fifth determination that at least one classified object is a sensitive object, instructing (1124-*b*) the power amplifier to cease amplifying the RF signal while the presence of the other sensitive object is detected within the keep-out zone.

In some embodiments, the method 1100 includes discarding (1126) data from the first sensor indicating presence of a non-moving target that has remained in the keep-out zone for a predetermined amount of time. In this way, the non-moving objects that have been within the keep-out zone (and are not living or biological organisms) do not interfere with the at least two sensors' ability to detect and/or classify new objects entering the keep-out zone (and/or transmission field of the transmitter device 100). Alternatively or additionally, in some embodiments, the method 1100 includes discarding (1128) data from the first sensor indicating presence of objects that are outside of the keep-out zone. This allows the transmitter device 100 to operate efficiently by activating the second sensor when an object is within the keep-out zone, and allows the transmitter device 100 to ignore extraneous data improving the accuracy of detected other objects and also improving performance of the system by processing sensor data from the at least two sensors more quickly.

FIGS. 12A-12D are flow diagrams showing a method of wirelessly-transmitting RF energy to a receiver device without using active beam-forming control in accordance with some embodiments. The methods described below allow for the efficient and effective transmission of wireless power signals by controlling and managing the power amplifier while forgoing any modifications to the amplified RF signal (e.g., the system does not modify phase, gain, etc. such that no active beamforming occurs). The methods described below also allow for the determination that one or more safety thresholds (e.g., user-safety thresholds and/or power-amplifier-protection thresholds) are satisfied before transmitting an RF signal as disclosed above.

Further, the methods described below can be performed without tuning the one or more antennas. In some embodiments, antenna tuning can be combined with the methods described below (e.g., the methods described below can be performed independent of antenna tuning). Operations (e.g., steps) of the method 1200 may be performed by one or more integrated circuits (e.g., RFIC 160 of transmitter device 100 as shown in in at least FIGS. 1A-1D, and/or a PAIC 161A as shown in at least FIGS. 1B-1D), the transmitter including one or more transmitter coverage areas (e.g., transmitter coverage areas 190, FIGS. 1B-1C; which each include respective one or more transmitters (e.g. one or more antennas 130, FIGS. 1A-1D)). At least some of the operations shown in FIGS. 12A-12D correspond to instructions stored in a computer memory or computer-readable storage medium (e.g., memory 172 and 174 of the transmitter device 100, FIG. 1B; memory 206 of the RF power transmitter device 100). For simplicity, the examples provided below discuss a single wireless-power receiver (e.g., receiver devices 304; FIG. 3); however the same operations can be performed for multiple wireless-power receivers.

The method 1200 includes receiving (1202) an indication that a wireless-power receivers is located within one meter of the wireless-power transmitter device (e.g., transmitter device 100; FIGS. 1A-2) and is authorized to receive wirelessly-delivered power from the wireless-power transmitter device. In some embodiments, the indication that the wireless-power receiver is located within one meter of the wireless-power transmitter device is received via data from at least two sensors (e.g., sensors 165; FIG. 1A-2). For example, utilizing a ranging sensor to detect the presence (and/or location) of an object within the transmission field of the wireless-power transmitter device as discussed above in reference to FIGS. 5A-7B. In some embodiments, the indication that the wireless-power receiver is located within one meter of the wireless-power transmitter device is received via a BLE signal and/or other communication protocol sent by the wireless-power receiver. Similarly, in some embodiments, the wireless-power receiver is determined to be authorized to receive wirelessly-delivered power from the wireless-power transmitter device based on the data from one or more sensors of the at least two sensors, BLE signal, and/or other communication protocol sent by the wireless-power receiver. Alternatively or additionally, in some embodiments, the indication that the wireless-power receiver is located within one meter of the wireless-power transmitter device is received by detecting a change in impedance at the power amplifier. Similarly, in some embodiments, the wireless-power receiver is determined to be authorized to receive wirelessly-delivered power from the wireless-power transmitter device based on detecting change in impedance and utilizing one or more signature-signals as in FIGS. 1A-3.

Method 1200 includes, in response to receiving the indication, selecting (1204) a power level from among a plurality of available power levels at which to amplify a radio frequency (RF) signal using a power amplifier. In some embodiments, the power level selected based on one or more lookup tables (LUT)s. In some embodiments, the LUTs include measurement values obtained during simulation, characterization, and/or manufacturing tests of the wireless-power transmitter device 100. In some embodiments, the indication includes information that allows the wireless-power transmitter device to determine a location of the wireless-power receiver, and the power level among the plurality of available power levels is selected based, at least in part, on the location of the wireless-power receiver. Alternatively, rather than basing selection of the power level on the receiver's location, in some other embodiments, the wireless-power transmitter device 100 selects a maximum power level among the plurality of available power levels, the maximum power level being the highest power level (e.g. 15 W) of the plurality of available power levels that satisfies one or more safety thresholds as described below. For example, the wireless-power transmitter device 100 can select a first power level (e.g., the maximum power level) at a first time and, based on a determination that the first power level fails to satisfy the one or more safety thresholds, select a second power level (e.g., the second power level being less than the maximum power level).

In some embodiments, the selected (1206) power level is a maximum power level from among the plurality of available power levels. In some embodiments, the power level is selected (1208) from among the plurality of available power levels of the power amplifier when the wireless-power receiver is at most 40 cm from the wireless-power transmitter device 100. In some embodiments, the power level is selected (1210) from among the plurality of available power levels of the power amplifier when the wireless-power receiver is within 20 cm to 40 cm from the wireless-power transmitter device 100. In some embodiments, the selected (1210) from among the plurality of available power levels of the power amplifier when the wireless-power receiver is 40 cm or further from the wireless-power transmitter device 100 (e.g., at least 1 m or more). In some embodiments, the power level (1212) is between 2 W and 15 W. In some embodiments, the power level (1212) is greater than 15 W (e.g., 20 W, 50 W, etc.). In some embodiments, the selected power level at which to generate the RF signal is increased as the distance between the wireless-power receiver between and the wireless-power transmitter device 100 increases.

The method 1200 includes, in accordance with a determination that transmitting the RF signal to the wireless-power receiver would satisfy (1214) one or more safety thresholds, instructing (1214-a) the power amplifier to amplify the RF signal using the power level to create an amplified RF signal, and providing (1214-b) the amplified RF signal to one or more antennas. The one or more antennas are caused to, upon receiving the amplified RF signal, radiate RF energy that is focused within a transmission field that includes the wireless-power receiver while forgoing any active beamforming control. In some embodiments, radiated RF energy is said to be focused within a transmission field that includes the wireless-power receiver when a peak level of RF energy is at its maximum at the location of the wireless-power receiver. In some embodiments, the method 1200 instructs (1214-a) the power amplifier to amplify the RF signal using the power level while forgoing any modification to the amplified RF signal that is consistent with beamforming. In other words, the wireless-power transmitter device 100 does not modify the phase, gain, etc. of an RF signal for beamforming purposes. In some embodiments, the method 1200 includes, in accordance with a determination that no power level from among the plurality of available power levels that would satisfy the one or more safety thresholds, instructing the power amplifier to shut down. In some embodiments. a determination that a power level from among the plurality of available power levels would satisfy the one or more safety thresholds is based data retrieved from one or more LUTs (described above in reference to FIGS. 1A-2).

By determining that transmitting the RF signal to the wireless-power receiver would satisfy (1214) one or more safety thresholds before instructing (1214-a) the power amplifier ensures that an appropriate power level (e.g., safe and efficient) from among the plurality of available power levels is selected for use in amplifying the RF signal, such that the one or more safety thresholds will still be satisfied after the RF signal is transmitted. In particular, the system can reference stored values in LUTs to select a power level that is known to satisfy the one or more safety thresholds. Alternatively or additionally, in some embodiments, the system can predict that transmitting the RF signal in the future would result in a formation of RF energy at the wireless-power receiver that satisfies the one or more safety thresholds, the prediction based on referencing, at least, the dynamically obtained impedance measurements with the LUTs (data from one or more sensors of the at least two sensors can also be used to reference the LUTs). Additional examples of the safety thresholds are discussed in detail in FIG. 5 of commonly-owned U.S. patent application Ser. No. 16/932,631, which is incorporated by reference in its entirety for all purposes.

In some embodiments, the one or more safety thresholds include (1216) a maximum specific absorption rate (SAR) value of not greater than 2 W/kg, and the determination that transmitting the RF signal would satisfy the one or more safety thresholds is made when it is determined that transmitting the RF signal would create a maximum SAR value of not greater than 2 W/kg at the wireless-power receiver (e.g., determined by referencing one or more LUTs, or by ensuring that the system uses only those operation characteristics (e.g., operational impedance, output power, etc.) designed to ensure that the SAR value is always satisfied). In some embodiments, the one or more safety thresholds include (1218) a maximum specific absorption rate (SAR) value of not greater than 0.8 W/kg, and the determination that transmitting the RF signal would satisfy the one or more safety thresholds is made when it is determined that transmitting the RF signal would create a maximum SAR value of not greater than 0.8 W/kg at the wireless-power receiver (e.g., determined by referencing one or more LUTs or by ensuring that the system uses only those operation characteristics (e.g., operational impedance, output power, etc.) designed to ensure that the SAR value is always satisfied). In some embodiments, the wireless-power transmitter device 100 described herein is capable of even greater control over the maximum SAR value, such as by ensuring that radiated RF energy focused within a transmission field that includes the wireless-power receiver will create a maximum SAR value that is no greater than a value of 1.6 W/kg, 1.5 W/kg, 0.7 W/kg, down to a value as low as 0.5 W/kg.

In some embodiments, the one or more safety thresholds include (1220) a predetermined roll-off of 3 dB at each predetermined distance increment relative to a peak amount of RF energy produced by radiated RF energy, and the determination that transmitting the RF signal would satisfy the one or more safety thresholds is made when it is determined that transmitting the RF signal would create a peak amount of RF energy at the wireless-power receiver that has the predetermined roll-off of 3 dB for each predetermined distance increment relative to the peak amount of RF energy (e.g., determined by referencing one or more LUTs or by ensuring that the system uses only those operation characteristics (e.g., operational impedance, output power, etc.) designed to ensure that the e-field roll-off value is always satisfied). In some embodiments, the predetermined distance increment (1222) is about 8 cm. In some embodiments, "about 8 cm" refers to +/−0.5 cm of 8 cm, so the range would be between 7.5-8.5 cm. For example, in some embodiments, the RF energy can be focused within a transmission field that includes a location of a receiver 104. The RF energy at the location of the receiver 104 is at its peak (or maximum for the selected power level) and rolls off by a predetermined roll-off of 3 dB for each predetermined distance increment. As another example, in some embodiments, the RF energy is focused directly in front of the wireless-power transmitter device 100 with its peak RF energy at the center point of the transmission field (i.e., midpoint between the front surface (or charging surface) of the transmission device 100 and the outermost distance of the transmission field 506 (FIG. 5)). The RF energy focused at the center point of the transmission field rolls off by a predetermined roll-off of 3 dB for each predetermined distance increment.

In some embodiments, the method 1200 includes modeling the peak amount of RF energy that would be produced at the wireless-power receiver for a selected power level, and then determine whether the predetermined roll-off of 3 dB is going to be satisfied (e.g., for at least one predetermined distance increment). While the primary example given here for illustrative purposes is a predetermined 3 dB roll-off value, in some embodiments, other suitable predetermined roll-off values can be utilized. For example, as described above in FIGS. 17 and 18, in some embodiments, the predetermined roll off can be less than 3 dB (e.g., 1 dB) for distances below the predetermined distance increment. Alternatively or additionally, in some embodiments, the predetermined roll off can be greater than 3 dB (e.g., 4 to 5 dB) for distances greater than the predetermined distance increment. Similarly, other suitable predetermined distance increment values can be used. For example, in some embodiments, the predetermined distance increment is based on the wavelength ($\lambda$) of the emitted electromagnetic waves.

In some embodiments, the wireless-power transmitter device 100 includes (1224) only a single power amplifier and the one or more antennas include only a single antenna. Designing a wireless-power transmitter device 100 that is capable of complying with the one or more safety thresholds using only a single PA and only a single antenna results in a low-cost system that is still able to achieve a safe transmission of wireless power, thus producing a system that is commercially viable both for its ability to comply with regulatory requirements and for its ability to be built at a cost point that is palatable for customers. Such a wireless-power transmitter device 100 also places a lower computing requirements on the one or more ICs, because less components need to be controlled, and also because the system does not require any active beamforming control.

In some embodiments, the method 1200 includes determining (1226-a) an operational impedance at the power amplifier based on an impedance measurement from among multiple measurement points of the power amplifier, and the one or more safety thresholds include (1226-b) one or more impedance thresholds indicating that the operational impedance is at a safe level, and the determination that transmitting the RF signal will satisfy the one or more safety thresholds is made when it is predicted that using the power level to amplify the RF signal would keep the operational impedance at the power amplifier at or below the one or more impedance thresholds. The operational impedance of the power amplifier can be determined at various different measurements using a different combination of parametric parameters of the device (as described above in FIGS. 1A-2).

In some embodiments, the method 1200 includes receiving (1228-a) an impedance measurement from among the multiple measurement points of the power amplifier. The method 1200 includes utilizing (1228-b) the impedance measurement to retrieve information for stored measurement values for two or more parametric parameters, the stored measurement values for the two or more parametric parameters indicating that the operational impedance is a safe operational impedance for the power amplifier. The method 1200 further includes selecting (1228-c) the power level upon determining that the operational impedance is a safe operational impedance for the power amplifier. Determining that the impedance measurement corresponds to the stored measurement values for two or more parametric parameters in the LUT, in some embodiments, means that the impedance measurement is known or can be approximated (e.g., extrapolated value from the operating impedances) as the safe operational impedance for the power amplifier. A non-exhaustive list of the parametric parameters include Vdrain power, DC Power, Vout_contour, and/or power dissipation. Additionally or alternatively, data from one or more sensors of the at least two sensors can be used in conjunction with the impedance measurements to determine (by using the LUTs) a safe operational impedance for the power amplifier.

In some embodiments, the method 1200 includes receiving (1230-*a*) an impedance measurement from among multiple measurement points of the power amplifier. The method 1200 includes utilizing (1230-*b*) the impedance measurement to retrieve information for stored measurement values for two or more parametric parameters (e.g., Vout and power dissipation stored in memory 206), the stored measurement values for the two or more parametric parameters indicating that the operational impedance is a safe operational impedance for the power amplifier. The method 1200 further includes determining (1230-*c*) a dissipation level corresponding to the retrieved information, and decreasing (1230-*d*) the power level upon determining that the dissipation level at the impedance measurement is above a dissipation threshold. Additionally or alternatively, data from one or more sensors of the at least two sensors can be used in conjunction with the impedance measurements to determine (by using the LUTs) a dissipation level at the impedance measurement.

In some embodiments, the power level is dynamically determined (1232) using the one or more LUTs while the RF energy is focused within a transmission field that includes the wireless-power receiver without any active beamforming control. As described above, the power level can be adjusted (e.g., dynamically determined) based on changes to the detected impedances, a receiver and/or foreign object entering or leaving a transmission field, movement of a receiver and/or foreign object, and/or other situations as described above. The dynamic adjustments are based on the simulation, characterization, and/or manufacture tests of the wireless-power transmitter device 100 and/or one or more antennas of the transmitter device 100.

With reference now to FIG. 12D, a technique for using aspects of the method 1100 in conjunction with the method 1200 is described. By combining these methods, the system is able to ensure that no sensitive objects are within the keep-out zone (as described with reference to method 1100), while also ensuring that the safety thresholds described with reference to method 1200 above are also satisfied before any RF energy is radiated. In some embodiments, the method 1200 includes receiving (1234-*a*), from a first set of sensors of the at least two sensors, sensor data indicating the presence of an object is within a predetermined boundary of the transmission field of the wireless-power transmitter device. The method 1200 includes, in response to the indication of a presence of an object within the predetermined boundary, receiving (1234-*b*) from a second set of sensors of the at least two sensors, sensor data indicating the type of object within the predetermined boundary of the transmission field of the wireless-power transmitter device. The method 1200 includes, in response to the sensor data indicating the type of object within the predetermined boundary of the transmission field is a first type of object, enabling (1234-*c*) the one or more antennas to radiate the RF energy. The method 1200 further includes, in response to the sensor data indicating the type of object within the predetermined boundary of the transmission field is a second type of object, causing (1234-*d*) the one or more antennas to cease radiating the RF energy. The different operation scenarios of the at least two sensors are described above in reference to FIGS. 5A-7B.

In some embodiments, the first type of objected is (1236) a wireless-power receiver. In some embodiments, the second type of objected is (1238) a sensitive object (e.g., a living or biological organism, such as a human hand). In some embodiments, the predetermined boundary of the transmission field is approximately 20 cm from the wireless-power transmitter device 100. In some embodiments approximately 20 cm references to +/−2 cm. In some embodiments, the 20 cm is measured radially from a center point of the system, such as is depicted in FIG. 5B. In some embodiments, the first set of sensors of the at least two sensors are ranging sensors configured to accurately detect one or more objects at least as far away as the transmission field extends (e.g., 1 meter). In some embodiments, the second set of sensors of the at least two sensors are classification sensors configured detect differences between objects (e.g., reflected power differences between living tissue and plastic) while being less accurate than the first set of sensors (i.e., ranging sensors). The different types of sensors are described above in reference to FIGS. 2 and 5A-7B.

In some embodiments, receiving the indication that the wireless-power receiver is located within one meter of the wireless-power transmitter device 100 and is authorized to receive wireless charging from the wireless-power transmitter device 100, and selecting the power level at which to generate the RF signal are performed (1240-*a*) at a first integrated circuit. The first IC is, for example, the RFIC 160. In some embodiments, the indication that the wireless-power receiver is located within one meter of the wireless-power transmitter device 100 and is authorized to receive wireless charging from the wireless-power transmitter device 100 is received from one or more sensors of the at least two sensors (e.g. sensors 165) of the wireless-power transmitter device 100. In some embodiments, controlling and managing one or more operations of the power amplifier including instructing the power amplifier to amplify the RF signal are performed (1240-*b*) at a second integrated circuit. The second IC is, for example, the PAIC 161A. As described above, the first IC and the second IC are communicatively coupled to each other and are configured to work with each other in performing the operations described above. In some embodiments, the first IC and the second IC provide instructions to each other. In some embodiments, having two different integrated circuits is beneficial because it makes it easier to control the distribution of heat, distribute the processing between the ICs. In some embodiments, having two different integrated circuits enables older wireless-power transmitters to be retrofitted. Alternatively or additionally, in some embodiments, it more efficient, for cost purposes, to design and use two different ICs. In some embodiments, determining an operational impedance at the power amplifier may be performed (1242) at the second IC (e.g., to reduce the processing on the first IC).

In some embodiments, the method 1200 includes receiving (1244-*a*) charging information from the wireless-power receiver. The method 1200 includes selecting (1244-*b*) the power level from among the plurality of available power levels based, at least in part, on the charging information from the wireless-power receiver. In some embodiments, the charging information includes a request for power, the request specifying power limits, SAR limits, and/or other parameters specific to the wireless-power receiver. In some embodiments, the charging information is received via a communication radio. In some embodiments, the communication radio operates using the Bluetooth Low Energy (BLE) protocol and/or other protocols described above. In some embodiments, the charging information is received in a packet of information that is received in conjunction with the indication that the wireless-power receiver is located within one meter of the wireless-power transmitter device 100 and is authorized to receive wirelessly-delivered power from the wireless-power transmitter device 100. In other words, the wireless-power receiver can use a wireless communication protocol (such as BLE) to transmit the charging information as well as authentication information to the one or more integrated circuits).

In some embodiments, the one or more safety thresholds can be satisfied based on the charging information received from the wireless-power receiver. For example, the charging information can include a SAR value measured at the wireless-power receiver, an effective power measured at the receiver (e.g., transmitted power converted into usable power), a measured impedance, and/or any other information to make a determination on the one or more safety thresholds described herein. In some embodiments, the wireless-power receiver is configured to charge a coupled electronic device (e.g., a mobile phone, a watch, a hearing aid, and/or other smart devices).

The operations of shown in FIG. 12D are performed each time the sensors are triggered (as described above in reference to FIGS. 7A and 7B). In particular, the operations shown in FIG. 12D can keep occurring and can cause transmission of wireless power to stop if a sensitive object comes within the keep-out zone at any point in time.

Figure 13B:
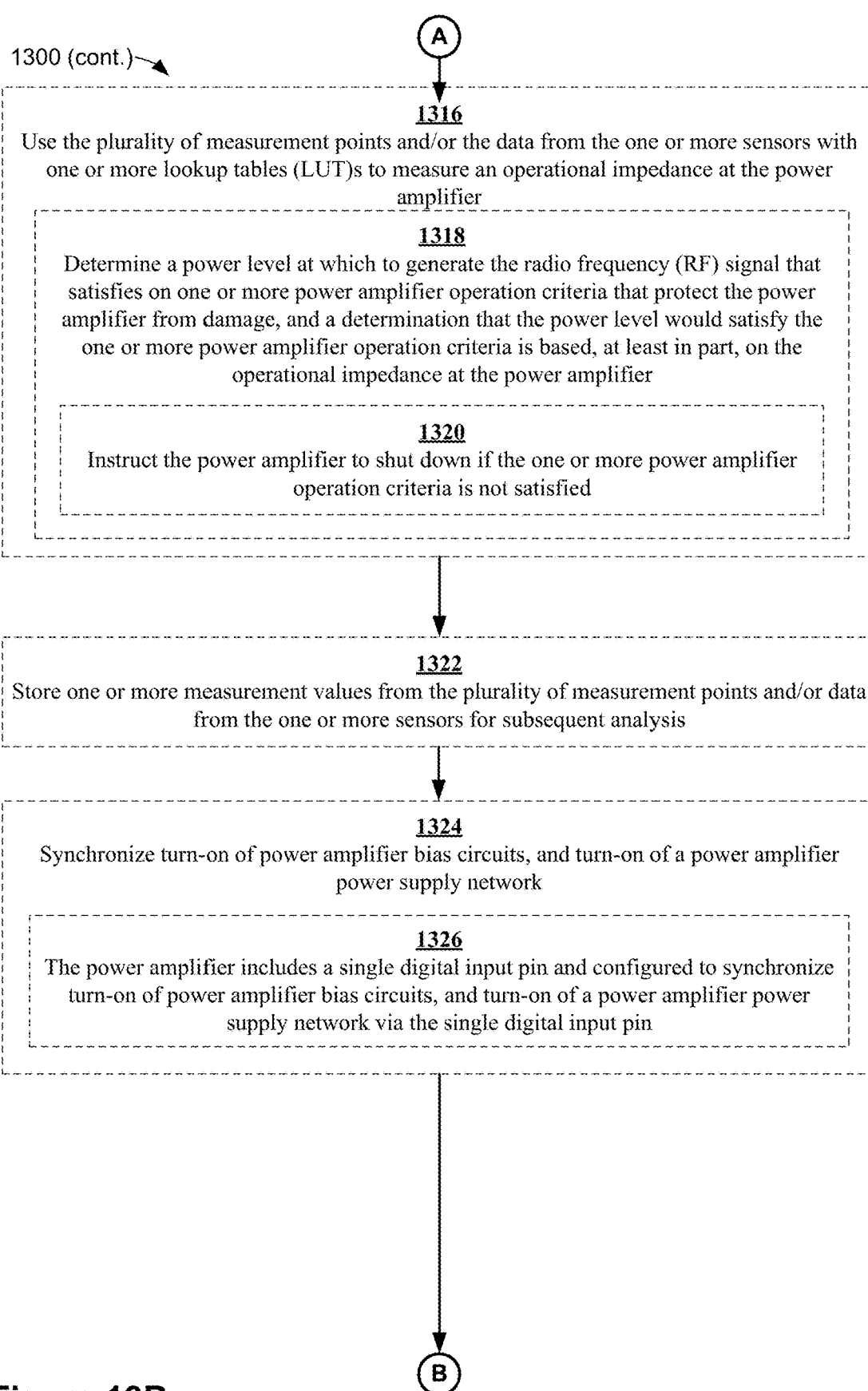

FIGS. 13A-13C are flow diagrams showing a method of controlling and/or managing operation of one or more power amplifiers in accordance with some embodiments. Operations (e.g., steps) of the method 1300 may be performed by one or more integrated circuits (e.g., RFIC 160 of transmitter device 100 as shown in in at least FIGS. 1A-1D, and/or a PAIC 161A as shown in at least FIGS. 1B-1D), the transmitter device 100 including one or more power amplifiers. At least some of the operations shown in FIGS. 13A-13C correspond to instructions stored in a computer memory or computer-readable storage medium (e.g., memory 172 and 174 of the transmitter device 100, FIG. 1B; memory 206 of the RF power transmitter device 100). The operations of FIG. 13 can be used to protect a power amplifier along with the operations of FIGS. 12A-12C, while the operations of FIGS. 11A-11B and 12 D are used to protect sensitive objects from RF radiation.

Method 1300 includes receiving (1302) impedance measurements at a plurality of measurement points of the power amplifier and data from one or more sensors (e.g. sensors 165 FIGS. 1A-2). The plurality of measurement points allow measurements of at least an impedance measurement at each respective measurement point. In some embodiments, the impedance measurements at the plurality of measurement points include (1304) one or more of: voltage at an output of the power amplifier, voltages at points inside a matching network, voltage at a drain of a transistors of the power amplifier, a DC current and voltage consumed by each stage of the power amplifier, and thermistors at different stages of the power amplifier. In some embodiments, the plurality of measurement points are (1306) measured at multiple output power levels of the power amplifier (e.g., described above in FIGS. 1A-2). The data from the one or more sensors of the wireless-power transmitter device 100 can be used in conjunction with the received impedance measurements at the plurality of measurement points of the power amplifier. In some embodiments, the power amplifier includes (1308) a thermistor that measures temperature. In some embodiments, the thermistor is on (1310) a same chip as other components of the power amplifier.

Method 1300 includes detecting (1312) presence of a foreign object within 6 inches of the wireless-power transmitter device 100 based on the received impedance measurements and the data from the one or more sensors, and adjusting radiated radio frequency (RF) energy that is focused within a transmission field that includes a wireless-power receiver while the presence of the foreign object is detected. A foreign object, as disclosed herein, includes a sensitive object or a non-receiver device 304 (e.g., keys, furniture, unauthorized receivers, and/or other objects that are not configured to receive wireless power). The method 1300 can include determining that the foreign object is a sensitive object by performing the operations of FIGS. 11A-11B and 12 D described above. Method 1300 includes detecting (1314) absence of the foreign object within the 6 inches of the wireless-power transmitter device 100 based on the received impedance measurements and the data from the one or more sensors (or lack thereof), and causing the radiation of the RF energy focused within a transmission field that includes the wireless-power receiver upon determining that the foreign object is absent. In some embodiments, the method 1300 includes detecting absence of the foreign object further than 6 inches (some predetermined distance determined by the one or more sensors). More specifically, operations 1312 and 1314 describe the intrusion of a foreign object and/or classification of the foreign object (including living or biological organisms) in the keep-out zone 508 of the transmission field 506 (FIG. 5).

In some embodiments, method 1300 includes using (1316) the plurality of measurement points and/or the data from the one or more sensors with one or more lookup tables (LUT)s to measure an operational impedance at the power amplifier. In some embodiments, method 1300 includes determining (1318) a power level at which to generate the radio frequency (RF) signal that satisfies on one or more power amplifier operation criteria that protect the power amplifier from damage, and a determination that the power level would satisfy the one or more power amplifier operation criteria is based, at least in part, on the operational impedance at the power amplifier. In some embodiments, method 1300 includes instructing (1320) the power amplifier to shut down if the one or more power amplifier operation criteria is not satisfied. In some embodiments, the one or more power amplifier operation criteria include the one or more impedance thresholds based on parametric parameters of the device described in FIGS. 1A-2.

In some embodiments, method 1300 includes storing (1322) one or more measurements values from the plurality of measurement points and/or data from the one or more sensors for subsequent analysis. In particular, the one or more measurements values from the plurality of measurement points can be stored into the one or more LUTs (e.g., updating and/or building on the LUTS) and used to improve the accuracy of future impedance determinations. In some embodiments, the stored measurement can be used to improve the overall speed of the impedance determinations (e.g., by allowing the system to avoid having to repeat calculations and/or determinations).

In some embodiments, method 1300 includes synchronizing (1324) turn-on of power amplifier bias circuits, and turn-on of a power amplifier power supply network. In some embodiments, the power amplifier includes (1326) a single digital input pin and configured to synchronize turn-on of power amplifier bias circuits, and turn-on of a power amplifier power supply network via the single digital input pin. In some embodiments, method 1300 includes synchronizing (1328) shut-down of various components of the power amplifier. In some embodiments, the power amplifier includes (1330) a single digital input pin and the one or more integrated circuits are configured to synchronize shut-down of various components of the power amplifier via the single digital input pin.

In some embodiments, method 1300 includes adjusting (1332) output power and bias conditions of the power amplifier to maintain optimum efficiency and output power. In some embodiments, adjustment to the power amplifier and/or other configurations of a wireless-power transmitter device are based on predetermined properties and/or characteristics of the wireless-power transmitter device obtained during simulation, characterization, and/or manufacture tests of the wireless-power transmitter device and/or one or more antennas of the transmitter device. In some embodiments, the power amplifier is (1334) a GaN (Gallium Nitride) power amplifier. Alternatively or additionally, in some embodiments, the power amplifier is (1336) a Class E amplifier.

Figure 14:
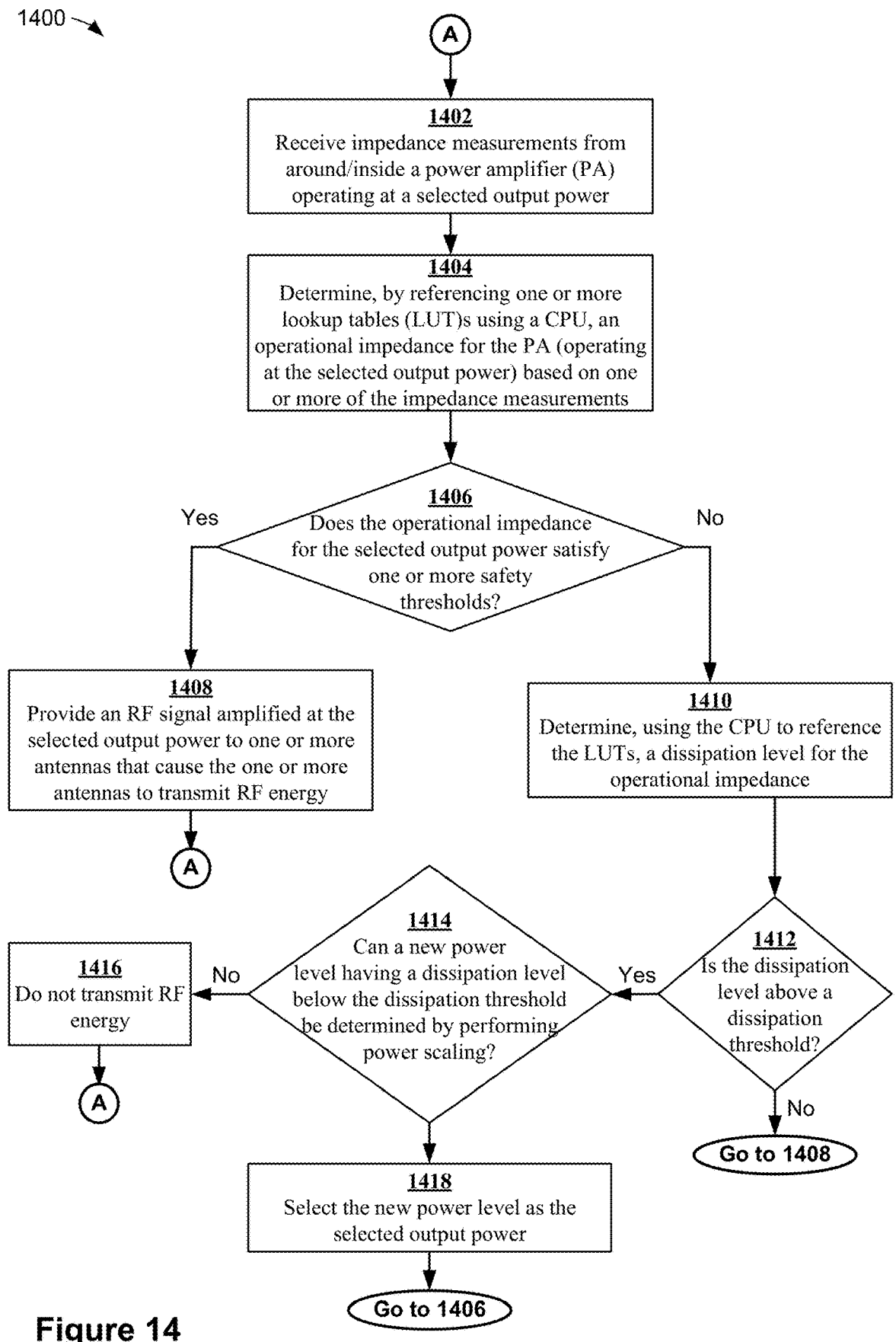
FIG. 14 is an example flow diagram for selecting an operational impedance for a power amplifier in conjunction with transmitting RF energy from a wireless-power transmitting device, in accordance with some embodiments.

FIG. 14 is an example flow diagram for transmitting RF energy from a wireless-power transmitting device 100 in accordance with some embodiments. Operations (e.g., steps) of the method 1400 may be performed by one or more integrated circuits (e.g., RFIC 160 of transmitter device 100 as shown in in at least FIGS. 1A-2, and/or a PAIC 161A as shown in at least FIGS. 1B-2), the transmitter device 100 including one or more power amplifiers. At least some of the operations shown in FIG. 14 correspond to instructions stored in a computer memory or computer-readable storage medium (e.g., memory 172 and 174 of the transmitter device 100, FIG. 1B; memory 206 of the RF power transmitter device 100). The operations of FIG. 14 can be used to optimize performance of a power amplifier along with the power amplifier and the sensitive object protection techniques discussed above in reference to FIGS. 11A-13C.

At operation 1402, the method 1400 includes receiving impedance measurements from around/inside a power amplifier (PA) operating at a selected output power. The selected power level is selected from among a plurality of available power levels at which to amplify a radio frequency (RF) signal using a power amplifier of the wireless-power transmitter device. In some embodiments, the impedance measurements can be received from one or more measurement points as shown in FIG. 4. At operation 1404, the method 1400 includes determining, by referencing a lookup table (LUT) (stored in memory 206) using a CPU, an operational impedance for the PA (operating at the selected output power) based on one or more of the impedance measurements. For example, the CPU can use the LUT to reference the impedance measurements to determine the operational impedance of the PA. Alternatively or additionally, in some embodiments, the power level is selected from among a plurality of available power levels based on the LUT. In some embodiments, data from the one or more sensors (e.g., 165 FIGS. 1A-2) is used in conjunction with the impedance measurements to determine the operational impedance for the PA (e.g., the data from the one or more sensors is used as an additional measurement value to be referenced when performing lookups in the LUT). For example, one or more impedance measurements can be used with one or more stored measurements for at least two parametric parameters to determine (or predict) an operational impedance for the PA operating at the selected output power.

In some embodiments, the parametric parameters include the DC current and voltage consumed by each stage of the amplifier, temperature measurements, DC Power, voltage at the output of the amplifier, voltage drain power and/or voltage at the drain of the transistors, power dissipation, and/or voltages at points inside the matching networks.

At operation 1406, the method 1400 determines whether the operational impedance (determined at operation 1404) for the selected output power satisfies one or more safety thresholds. In some embodiments, the one or more safety thresholds are predetermined based on simulation, characterization, and/or manufacturing tests of the wireless-power transmitter device 100 and/or one or more antennas of the transmitter device 100. For example, SAR values and predetermined SAR thresholds for different configurations, operational scenarios, power levels, etc. can be determined during simulation, characterization, and/or manufacturing tests of the wireless-power transmitter device. Similarly, in some embodiments, predetermined impedance thresholds for different configurations, operational scenarios, power levels, etc. can be determined during simulation, characterization, and/or manufacturing tests of the wireless-power transmitter device. In accordance with a determination that the operational impedance (determined at operation 1404) for the selected output power satisfies one or more safety thresholds (by referencing the LUT), the method 1400 proceeds to operation 1408 and provides an RF signal amplified at the selected output power to one or more antennas that cause the one or more antennas to transmit RF energy. In some embodiments, after providing the RF signal to the one or more antennas, the method 1400, returns to operation 1402 to continuously monitor the impedance measurements for the selected output power.

At operation 1406, in accordance with a determination that the operational impedance (determined at operation 1404) for the selected output power does not satisfy one or more safety thresholds, the method 1400 proceeds to operation 1410 and determines, using the CPU to reference the LUT, a dissipation level for the operational impedance. At operation 1412, the method 1400 determines whether the dissipation level (determined at operation 1410) is above a dissipation threshold (by referencing the LUT). In accordance with a determination that the dissipation level for the operational impedance is not above the dissipation threshold, the method 1400 proceeds to operation 1408 and provides an RF signal amplified at the selected output power to the one or more antennas to transmit RF energy.

At operation 1412, in accordance with a determination that the dissipation level for the operational impedance is above the dissipation threshold, the method 1400 proceeds to operation 1414 and determines, by performing power scaling, whether a new power level that has a dissipation level below the dissipation threshold can be determined. In accordance with a determination that a new power level that has a dissipation level below the dissipation threshold cannot be determined (by referencing the LUT), the method 1400 proceeds to operation 1416 and does not transmit RF energy. In some embodiments, after determining not to transmit the RF energy, the method 1400, returns to operation 1402 to continuously monitor the impedance measurements if another output power is selected.

At operation 1414, after determining a new power level that has a dissipation level below the dissipation threshold (determined by referencing the LUT), the method 1400 proceeds to operation 1418 and selects the new power level as the output power level. After selecting the new power level as the output power level, the method 1400 proceeds to operation 1406 to determine whether the operational impedance for the new power level satisfies the one or more safety thresholds. In this way, the new power level is determined to be safe before the wireless-power transmitter uses the power level in conjunction with transmission of RF energy.

Figure 15:
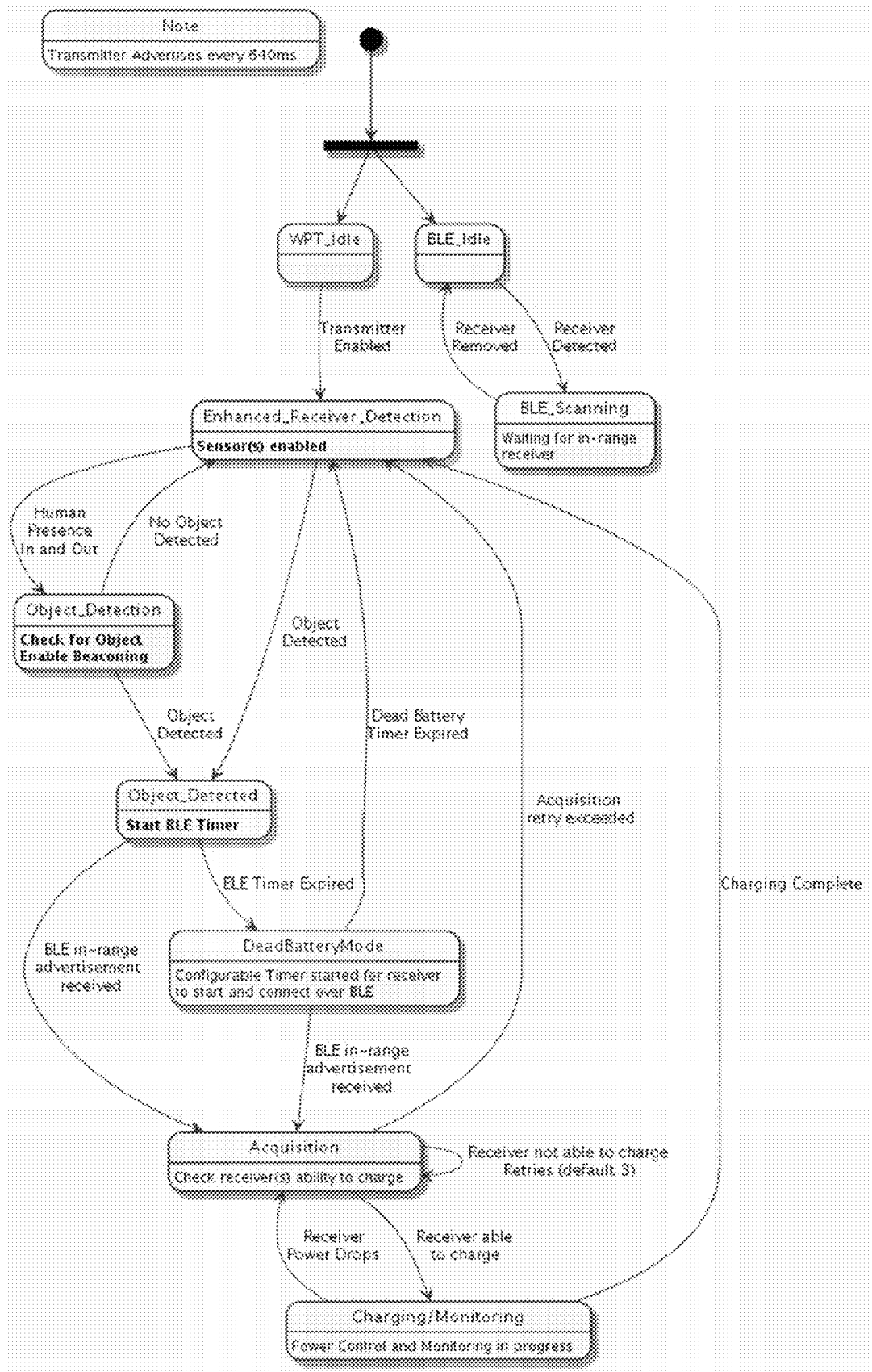
FIG. 15 is another illustration of a process for detecting one or more receiver devices and providing wireless power to charge the detected receiver devices, in accordance with some embodiments.

FIG. 15 is an alternate illustration of the process shown in FIG. 7B. In particular, FIG. 15 illustrates the process for detecting one or more receiver devices 304 (FIG. 3) and providing wireless power to charge the receiver devices 304 (including dead receiver devices 304 (i.e., receiver devices 304 without any power).

Further embodiments also include various subsets of the above embodiments including embodiments in FIGS. 1A-15 combined or otherwise re-arranged in various embodiments.

Safety Techniques

Any of the various systems and methods described herein can also be configured to utility a variety of additional safety techniques. For instance, a transmitter device can determine the present SAR value of RF energy at one or more particular locations of the transmission field using one or more sampling or measurement techniques. In some embodiments, the SAR values within the transmission field are measured and pre-determined by SAR value measurement equipment. In some embodiments, a memory associated with the transmitter device may be preloaded with values, tables, and/or algorithms that indicate for the transmitter device which distance ranges in the transmission field are likely to exceed to a pre-stored SAR threshold value. For example, a lookup table may indicate that the SAR value for a volume of space (V) located some distance (D) from the transmitter receiving a number of power waves (P) having a particular frequency (F). One skilled in the art, upon reading the present disclosure, will appreciate that there are any number of potential calculations, which may use any number of variables, to determine the SAR value of RF energy at a particular locations, each of which is within the scope of this disclosure.

Moreover, a transmitter device may apply the SAR values identified for particular locations in various ways when generating, transmitting, or adjusting the radiation profile. A SAR value at or below 1.6 W/kg, is in compliance with the FCC (Federal Communications Commission) SAR requirement in the United States. A SAR value at or below 2 W/kg is in compliance with the IEC (International Electrotechnical Commission) SAR requirement in the European Union. In some embodiments, the SAR values may be measured and used by the transmitter to maintain a constant energy level throughout the transmission field, where the energy level is both safely below a SAR threshold value but still contains enough RF energy for the receivers to effectively convert into electrical power that is sufficient to power an associated device, and/or charge a battery. In some embodiments, the transmitter device can proactively modulate the radiation profiles based upon the energy expected to result from newly formed radiation profiles based upon the predetermined SAR threshold values. For example, after determining how to generate or adjust the radiation profiles, but prior to actually transmitting the power, the transmitter device can determine whether the radiation profiles to be generated will result in RF energy accumulation at a particular location that either satisfies or fails the SAR threshold. Additionally or alternatively, in some embodiments, the transmitter device can actively monitor the transmission field to reactively adjust power waves transmitted to or through a particular location when the transmitter device determines that the power waves passing through or accumulating at the particular location fail the SAR threshold. Where the transmitter device is configured to proactively and reactively adjust the power radiation profile, with the goal of maintaining a continuous power level throughout the transmission field, the transmitter device may be configured to proactively adjust the power radiation profile to be transmitted to a particular location to be certain the power waves will satisfy the SAR threshold, but may also continuously poll the SAR values at locations throughout the transmission field (e.g., using one or more sensors configured to measure such SAR values) to determine whether the SAR values for power waves accumulating at or passing through particular locations unexpectedly fail the SAR threshold.

In some embodiments, control systems of transmitter devices adhere to electromagnetic field (EMF) exposure protection standards for human subjects. Maximum exposure limits are defined by US and European standards in terms of power density limits and electric field limits (as well as magnetic field limits). These include, for example, limits established by the Federal Communications Commission (FCC) for MPE, and limits established by European regulators for radiation exposure. Limits established by the FCC for MPE are codified at 47 CFR § 1.1310. For electromagnetic field (EMF) frequencies in the microwave range, power density can be used to express an intensity of exposure. Power density is defined as power per unit area. For example, power density can be commonly expressed in terms of watts per square meter ($W/m^2$), milliwatts per square centimeter ($mW/cm^2$), or microwatts per square centimeter ($\mu W/cm^2$).

In some embodiments, and as a non-limiting example, the wireless-power transmission systems disclosed herein comply with FCC Part § 18.107 requirement which specifies "Industrial, scientific, and medical (ISM) equipment. Equipment or appliances designed to generate and use locally RF energy for industrial, scientific, medical, domestic or similar purposes, excluding applications in the field of telecommunication. In some embodiments, the wireless-power transmission systems disclosed herein comply with ITU (International Telecommunication Union) Radio Regulations which specifies "industrial, scientific and medical (ISM) applications (of radio frequency energy): Operation of equipment or appliances designed to generate and use locally radio frequency energy for industrial, scientific, medical, domestic or similar purposes, excluding applications in the field of telecommunications. In some embodiments, the wireless-power transmission systems disclosed herein comply with other requirements such as requirements codified under EN 62311: 2008, IEC/EN 662209-2: 2010, and IEC/EN 62479: 2010.

In some embodiments, the present systems and methods for wireless-power transmission incorporate various safety techniques to ensure that human occupants in or near a transmission field are not exposed to EMF energy near or above regulatory limits or other nominal limits. One safety method is to include a margin of error (e.g., about 10% to 20%) beyond the nominal limits, so that human subjects are not exposed to power levels at or near the EMF exposure limits. A second safety method can provide staged protection measures, such as reduction or termination of wireless-power transmission if humans (and in some embodiments, other living beings or sensitive objects) move toward a radiation area with power density levels exceeding EMF exposure limits. In some embodiments, these safety methods (and others) are programmed into a memory of the transmitter device (e.g., memory 206) to allow the transmitter to execute such programs and implement these safety methods.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

Features of the present invention can be implemented in, using, or with the assistance of a computer program product, such as a storage medium (media) or computer readable storage medium (media) having instructions stored thereon/in which can be used to program a processing system to perform any of the features presented herein. The storage medium (e.g., memory 206, 356) can include, but is not limited to, high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory optionally includes one or more storage devices remotely located from the CPU(s) (e.g., processor(s)). Memory, or alternatively the non-volatile memory device(s) within the memory, comprises a non-transitory computer readable storage medium.

Stored on any one of the machine readable medium (media), features of the present invention can be incorporated in software and/or firmware for controlling the hardware of a processing system (such as the components associated with the transmitters 100 and/or receiver devices 304), and for enabling a processing system to interact with other mechanisms utilizing the results of the present invention. Such software or firmware may include, but is not limited to, application code, device drivers, operating systems, and execution environments/containers.

It will be understood that, although the terms "first," "second," etc. may be used herein to describe various elements, these elements should not be limited by these terms. These terms are only used to distinguish one element from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A wireless-power transmission system, comprising:
   at least two sensors of at least two different types;
   one or more antennas;
   a power amplifier configured to amplify a radio frequency (RF) signal that is provided to the one or more antennas, wherein the one or more antennas, upon receiving the amplified RF signal, are configured to radiate RF energy within a transmission field of a wireless-power transmission system; and
   one or more integrated circuits configured to:
      receive, from a first sensor of the at least two sensors, first sensor data indicating presence of an object within a keep-out zone of the transmission field of the wireless-power transmission system;
      in response to the receiving:
         cause a second sensor, distinct from the first sensor, to capture second sensor data, and
         classify, using the second sensor data from the second sensor, the object as a sensitive object, wherein the sensitive object is an object that is sensitive to RF energy and the sensitive object includes a human hand or other portion of a human body;
      while continuing to detect presence of the sensitive object within the keep-out zone, forgo providing an instruction to the power amplifier to amplify the RF signal;
      in accordance with a first determination that the sensitive object is no longer within the keep-out zone, determine whether an electronic device that requires charging is within the transmission field; and
      in accordance with a second determination that the electronic device that requires charging is within the transmission field, instruct the power amplifier to amplify the RF signal to cause the one or more antennas to radiate RF energy focused near the electronic device that requires charging.

2. The wireless-power transmission system of claim 1, wherein the one or more integrated circuits are further configured to:
   while radiating the RF energy focused near the electronic device, receive, from the first sensor of the at least two sensors, third sensor data indicating presence of another object within the keep-out zone of the transmission field of the wireless-power transmission system;
   in response to the receiving, classify using fourth sensor data from the second sensor the other object as a second classified object; and in accordance with a third determination that the second classified object is another sensitive object, instruct the power amplifier to cease amplifying the RF signal while the presence of the other sensitive object is detected within the keep-out zone.

3. The wireless-power transmission system of claim 2, wherein the sensitive object is a human hand and the other sensitive object is also a human hand.

4. The wireless-power transmission system of claim 2, wherein the instruction to the power amplifier to cease amplifying the RF signal is provided within a predetermined amount of time of detecting the second classified object.

5. The wireless-power transmission system of claim 4, wherein the predetermined amount of time is less than 150 milliseconds.

6. The wireless-power transmission system of claim 5, wherein the predetermined amount of time is less than 100 milliseconds.

7. The wireless-power transmission system of claim 6, wherein the predetermined amount of time is less than 50 milliseconds.

8. The wireless-power transmission system of claim 1, wherein while continuing to detect presence of the sensitive object within the keep-out zone, the electronic device that requires charging is also present within the transmission field.

9. The wireless-power transmission system of claim 1, wherein the transmission field includes an area of three-dimensional space that is greater than an area of three-dimensional space that is included in the keep-out zone.

10. The wireless-power transmission system of claim 1, wherein the first sensor is a ranging sensor configured to detect objects within the keep-out zone.

11. The wireless-power transmission system of claim 10, wherein the first sensor is an ultrasonic sensor, an optical sensor, or an infrared sensor.

12. The wireless-power transmission system of claim 10, wherein the second sensor is a classification sensor configured to detect data used to classify objects as sensitive objects, and the second sensor is not able to perform accurate ranging within the keep-out zone.

13. The wireless-power transmission system of claim 1, wherein the second sensor is a capacitive sensor or a sensor configured to detect impedance changes at the wireless-power transmission system.

14. The wireless-power transmission system of claim 1, wherein:
the first sensor data indicates presence of at least two objects within the keep-out zone of the transmission field of the wireless-power transmission system; and
the one or more integrated circuits are configured to determine a number of objects within the keep-out zone based on the first sensor data.

15. The wireless-power transmission system of claim 14, wherein the one or more integrated circuits are further configured to:
classify using the second sensor data from the second sensor distinct from the first sensor, each object within the keep-out zone; and
in accordance with a fifth determination that at least one object detected based on the second sensor data is a sensitive object, instruct the power amplifier to cease amplifying the RF signal while the presence of the at least one sensitive object is detected within the keep-out zone.

16. The wireless-power transmission system of claim 1, wherein the first sensor is configured to detect one or more objects at least 20 cm away from an exterior housing of the wireless-power transmission system.

17. The wireless-power transmission system of claim 16, wherein the transmission field of the wireless-power transmission system extends from the exterior housing of the wireless-power transmission system to a distance that is at least 1 m away from the exterior housing of the wireless-power transmission system.

18. The wireless-power transmission system of claim 1, wherein the first determination is made while the sensitive object is no longer within the keep-out zone but is still within the transmission field.

19. A method, comprising:
receiving, from a first sensor of at least two sensors, first sensor data indicating presence of an object within a keep-out zone of a transmission field of a wireless-power transmission system;
in response to the receiving:
causing a second sensor, distinct from the first sensor, to capture second sensor data, and
classifying, using the second sensor data from the second sensor, the object as a sensitive object, wherein the sensitive object is an object that is sensitive to RF energy and the sensitive object includes a human hand or other portion of a human body;
while continuing to detect presence of the sensitive object within the keep-out zone, forgoing providing an instruction to a power amplifier of the wireless-power transmission system to amplify an RF signal;
in accordance with a first determination that the sensitive object is no longer within the keep-out zone, determining whether an electronic device that requires charging is within the transmission field; and
in accordance with a second determination that the electronic device that requires charging is within the transmission field, instructing the power amplifier to amplify the RF signal to cause one or more antennas of the wireless-power transmission system to radiate RF energy focused near the electronic device that requires charging.

20. A non-transitory, computer-readable medium storing instructions which, when executed by a processor in a computer, cause the computer to perform a method, the method comprising:
receiving, from a first sensor of at least two sensors, first sensor data indicating presence of an object within a keep-out zone of a transmission field of a wireless-power transmission system;
in response to the receiving:
causing a second sensor, distinct from the first sensor, to capture second sensor data, and
classifying, using the second sensor data from the second sensor, the object as a sensitive object, wherein the sensitive object is an object that is sensitive to RF energy and the sensitive object includes a human hand or other portion of a human body;
while continuing to detect presence of the sensitive object within the keep-out zone, forgoing providing an instruction to a power amplifier of the wireless-power transmission system to amplify an RF signal;
in accordance with a first determination that the sensitive object is no longer within the keep-out zone, determining whether an electronic device that requires charging is within the transmission field; and in accordance with a second determination that the electronic device that requires charging is within the transmission field, instructing the power amplifier to amplify the RF signal to cause one or more antennas of the wireless-power transmission system to radiate RF energy focused near the electronic device that requires charging.

\* \* \* \* \*